US011930662B2

United States Patent
Li

(10) Patent No.: US 11,930,662 B2
(45) Date of Patent: Mar. 12, 2024

(54) TRANSPARENT ELECTROLUMINESCENT DEVICES WITH CONTROLLED ONE-SIDE EMISSIVE DISPLAYS

(71) Applicant: Jian Li, Tempe, AZ (US)

(72) Inventor: Jian Li, Tempe, AZ (US)

(73) Assignee: Arizona Board of Regents on behalf of Arizona State University, Scottsdale, AZ (US)

(*) Notice: Subject to any disclaimer, the term of this patent is extended or adjusted under 35 U.S.C. 154(b) by 431 days.

(21) Appl. No.: 15/577,655

(22) PCT Filed: Jun. 3, 2016

(86) PCT No.: PCT/US2016/035859
§ 371 (c)(1),
(2) Date: Nov. 28, 2017

(87) PCT Pub. No.: WO2016/197019
PCT Pub. Date: Dec. 8, 2016

(65) Prior Publication Data
US 2018/0166655 A1 Jun. 14, 2018

Related U.S. Application Data

(60) Provisional application No. 62/170,809, filed on Jun. 4, 2015.

(51) Int. Cl.
*C07F 1/10* (2006.01)
*C07F 15/00* (2006.01)
(Continued)

(52) U.S. Cl.
CPC ............. *H10K 50/868* (2023.02); *C07F 1/10* (2013.01); *C07F 15/0033* (2013.01);
(Continued)

(58) Field of Classification Search
CPC ............. H01L 51/5293; H01L 51/0085; H01L 51/5281; H01L 51/0084; H01L 51/5284;
(Continued)

(56) References Cited

U.S. PATENT DOCUMENTS 6,200,695 B1 3/2001 Arai
7,037,599 B2 5/2006 Culligan et al.
(Continued)

FOREIGN PATENT DOCUMENTS

CN 1777663 5/2006
CN 1894269 1/2007
(Continued)

OTHER PUBLICATIONS

WO-2014094960-A1—translation (Year: 2014).*
(Continued)

*Primary Examiner* — Sean M DeGuire
*Assistant Examiner* — Rachel Simbana
(74) *Attorney, Agent, or Firm* — Fish & Richardson P.C.

(57) ABSTRACT

A light emitting device includes a transparent organic light emitting device and a quarter-wave plate. The transparent organic light emitting device includes a chiral complex emitter and produces circularly polarized light, and the quarter-wave plate converts the circularly polarized light into linearly polarized light. Generating linearly polarized light includes generating circularly polarized light via a transparent organic light emitting device including a chiral complex emitter, and passing the circularly polarized light through a quarter-wave plate to yield linearly polarized light.

21 Claims, 14 Drawing Sheets

(51) Int. Cl.
*C09K 11/06* (2006.01)
*H10K 50/80* (2023.01)
*H10K 50/86* (2023.01)
*H10K 85/30* (2023.01)

(52) U.S. Cl.
CPC .............. *C09K 11/06* (2013.01); *H10K 50/86* (2023.02); *H10K 85/342* (2023.02); *H10K 85/341* (2023.02)

(58) Field of Classification Search
CPC ......... H01L 51/00; H01L 51/50; H01L 45/02; H01L 2223/00; H01L 51/005; H01L 51/0051; H01L 51/0077; H01L 51/0086; H01L 51/0087; H01L 51/0088; H01L 51/0091; H01L 51/5262; C07F 15/0033; C07F 1/10; C09K 11/06; H01S 5/320225; H01S 5/36; H01S 3/08054; H01Q 13/0241; H01Q 15/00; H01Q 15/24; H01Q 15/242; H01Q 15/244; H01Q 15/246; H01Q 9/0428; H03C 7/00; H03C 7/02; H03C 7/025; H03C 7/027; H03C 7/04; H03F 19/00; H03F 7/00; G02F 1/00; G02F 1/0045; G02F 1/0063; G02F 1/01; G02F 1/0136; G02F 1/015; G02F 1/061; G02F 1/13; G02F 1/1326; G02F 1/137; G02F 1/13762; G02F 1/139; G02F 1/1396; G02F 1/29; G02F 2202/02; G02F 2202/021; G02F 2202/026; G02F 2202/06; G02F 2202/07; G02F 2202/10; G02F 1/61; G02F 1/65; B32B 2457/206; B32B 2307/416; B32B 2307/418; G02B 5/30; G02B 5/3025; G02B 5/3083; H10K 2102/3031; H10K 50/868; H10K 50/86; H10K 85/342; H10K 85/341
See application file for complete search history.

(56) References Cited

U.S. PATENT DOCUMENTS

| | | | |
|---|---|---|---|
| 7,064,228 B1 | 6/2006 | Yu et al. | |
| 7,221,332 B2 | 5/2007 | Miller et al. | |
| 7,442,797 B2 | 10/2008 | Itoh et al. | |
| 7,501,190 B2 | 3/2009 | Ise | |
| 7,655,322 B2 | 2/2010 | Forrest et al. | |
| 7,854,513 B2 | 12/2010 | Quach | |
| 7,947,383 B2 | 5/2011 | Ise et al. | |
| 8,104,895 B2 | 1/2012 | Quach | |
| 8,389,725 B2 | 3/2013 | Li et al. | |
| 8,617,723 B2 | 12/2013 | Stoessel | |
| 8,778,509 B2 | 7/2014 | Yasukawa | |
| 8,816,080 B2 | 8/2014 | Li et al. | |
| 8,871,361 B2 | 10/2014 | Xia et al. | |
| 8,927,713 B2 | 1/2015 | Li et al. | |
| 8,946,417 B2 | 2/2015 | Li et al. | |
| 9,059,412 B2 | 6/2015 | Zeng et al. | |
| 9,221,857 B2 | 12/2015 | Li et al. | |
| 9,224,963 B2 | 12/2015 | Li et al. | |
| 9,238,668 B2 | 1/2016 | Li et al. | |
| 9,312,505 B2 | 4/2016 | Brooks et al. | |
| 9,318,725 B2 | 4/2016 | Li | |
| 9,324,957 B2 | 4/2016 | Li et al. | |
| 9,382,273 B2 | 7/2016 | Li | |
| 9,385,329 B2 | 7/2016 | Li et al. | |
| 9,425,415 B2 | 8/2016 | Li et al. | |
| 9,461,254 B2 | 10/2016 | Tsai | |
| 9,550,801 B2 | 1/2017 | Li et al. | |
| 9,598,449 B2 | 3/2017 | Li et al. | |
| 9,617,291 B2 | 4/2017 | Li et al. | |
| 9,673,409 B2 | 6/2017 | Li | |
| 9,698,359 B2 | 7/2017 | Li et al. | |
| 9,711,739 B2 | 7/2017 | Li | |
| 9,711,742 B2 | 7/2017 | Li et al. | |
| 9,755,163 B2 | 9/2017 | Li et al. | |
| 9,818,959 B2 | 11/2017 | Li et al. | |
| 9,865,825 B2 | 1/2018 | Li | |
| 9,879,039 B2 | 1/2018 | Li | |
| 9,882,150 B2 | 1/2018 | Li | |
| 9,899,614 B2 | 2/2018 | Li | |
| 9,920,242 B2 | 3/2018 | Li | |
| 9,923,155 B2 | 3/2018 | Li et al. | |
| 9,941,479 B2 | 4/2018 | Li et al. | |
| 9,947,881 B2 | 4/2018 | Li | |
| 10,020,455 B2 | 7/2018 | Li | |
| 10,033,003 B2 | 7/2018 | Li | |
| 10,056,564 B2 | 8/2018 | Li | |
| 10,056,567 B2 | 8/2018 | Li | |
| 2003/0062519 A1 | 4/2003 | Yamazaki et al. | |
| 2003/0186077 A1 | 10/2003 | Chen | |
| 2005/0260446 A1 | 11/2005 | Mackenzie et al. | |
| 2005/0260448 A1 | 11/2005 | Lin et al. | |
| 2006/0068222 A1* | 3/2006 | Kitamura | C09K 11/06 428/690 |
| 2006/0073359 A1 | 4/2006 | Ise et al. | |
| 2006/0182992 A1 | 8/2006 | Nii et al. | |
| 2006/0202197 A1 | 9/2006 | Nakayama et al. | |
| 2006/0210831 A1 | 9/2006 | Sano et al. | |
| 2006/0255721 A1 | 11/2006 | Igarashi et al. | |
| 2006/0263635 A1 | 11/2006 | Ise | |
| 2006/0286406 A1 | 12/2006 | Igarashi et al. | |
| 2007/0057630 A1 | 3/2007 | Nishita et al. | |
| 2007/0059551 A1 | 3/2007 | Yamazaki | |
| 2007/0082284 A1 | 4/2007 | Stoessel et al. | |
| 2007/0103060 A1 | 5/2007 | Itoh et al. | |
| 2008/0001530 A1 | 1/2008 | Ise et al. | |
| 2008/0036373 A1 | 2/2008 | Itoh et al. | |
| 2008/0054799 A1 | 3/2008 | Satou | |
| 2008/0079358 A1 | 4/2008 | Satou | |
| 2008/0111476 A1 | 5/2008 | Choi et al. | |
| 2008/0143253 A1* | 6/2008 | Adachi | H01L 27/3211 313/504 |
| 2008/0241518 A1 | 10/2008 | Satou et al. | |
| 2008/0241589 A1 | 10/2008 | Fukunaga et al. | |
| 2009/0026936 A1 | 1/2009 | Satou et al. | |
| 2009/0026939 A1 | 1/2009 | Kinoshita et al. | |
| 2009/0039768 A1 | 2/2009 | Igarashi et al. | |
| 2009/0079340 A1 | 3/2009 | Kinoshita et al. | |
| 2009/0128008 A1 | 5/2009 | Ise et al. | |
| 2009/0136779 A1 | 5/2009 | Cheng et al. | |
| 2009/0153045 A1 | 6/2009 | Kinoshita et al. | |
| 2009/0161044 A1* | 6/2009 | Ge | G02F 1/133555 349/98 |
| 2009/0218561 A1 | 9/2009 | Kitamura et al. | |
| 2009/0261721 A1 | 10/2009 | Murakami et al. | |
| 2009/0267500 A1 | 10/2009 | Kinoshita et al. | |
| 2010/0171111 A1 | 7/2010 | Takada et al. | |
| 2010/0171418 A1 | 7/2010 | Kinoshita et al. | |
| 2010/0204467 A1 | 8/2010 | Lamarque et al. | |
| 2011/0049496 A1 | 3/2011 | Fukuzaki | |
| 2011/0227058 A1 | 9/2011 | Masui et al. | |
| 2012/0095232 A1 | 4/2012 | Li et al. | |
| 2012/0181528 A1 | 7/2012 | Takada et al. | |
| 2012/0202997 A1 | 8/2012 | Parham et al. | |
| 2012/0215001 A1 | 8/2012 | Li et al. | |
| 2012/0223634 A1 | 9/2012 | Xia et al. | |
| 2012/0264938 A1 | 10/2012 | Li | |
| 2012/0273736 A1 | 11/2012 | James et al. | |
| 2012/0302753 A1 | 11/2012 | Li | |
| 2012/0315714 A1* | 12/2012 | Shanks | C09K 19/2028 438/29 |
| 2013/0048963 A1 | 2/2013 | Beers et al. | |
| 2013/0082245 A1 | 4/2013 | Kottas et al. | |
| 2013/0168656 A1 | 7/2013 | Tsai et al. | |
| 2013/0172561 A1 | 7/2013 | Tsai et al. | |
| 2013/0200340 A1 | 8/2013 | Otsu et al. | |
| 2013/0203996 A1 | 8/2013 | Li et al. | |
| 2013/0237706 A1 | 9/2013 | Li | |
| 2013/0341600 A1 | 12/2013 | Lin et al. | |
| 2014/0014922 A1 | 1/2014 | Lin et al. | |
| 2014/0027733 A1 | 1/2014 | Zeng et al. | |

(56) References Cited

U.S. PATENT DOCUMENTS

| | | | |
|---|---|---|---|
| 2014/0084261 A1 | 3/2014 | Brooks et al. | |
| 2014/0114072 A1 | 4/2014 | Li et al. | |
| 2014/0191206 A1 | 7/2014 | Cho | |
| 2014/0203248 A1 | 7/2014 | Zhou et al. | |
| 2014/0330019 A1 | 11/2014 | Li et al. | |
| 2014/0364605 A1 | 12/2014 | Li et al. | |
| 2015/0008419 A1 | 1/2015 | Li | |
| 2015/0028323 A1 | 1/2015 | Xia et al. | |
| 2015/0069334 A1 | 3/2015 | Xia et al. | |
| 2015/0105556 A1 | 4/2015 | Li et al. | |
| 2015/0162552 A1 | 6/2015 | Li et al. | |
| 2015/0194616 A1 | 7/2015 | Li et al. | |
| 2015/0207086 A1 | 7/2015 | Li et al. | |
| 2015/0228914 A1 | 8/2015 | Li et al. | |
| 2015/0270500 A1* | 9/2015 | Stoessel | H01L 51/0094 |
| | | | 252/301.35 |
| 2015/0274762 A1 | 10/2015 | Li et al. | |
| 2015/0287938 A1 | 10/2015 | Li et al. | |
| 2015/0293415 A1* | 10/2015 | Wang | G02F 1/13718 |
| | | | 349/98 |
| 2015/0318500 A1 | 11/2015 | Li | |
| 2015/0349279 A1 | 12/2015 | Li et al. | |
| 2015/0380666 A1 | 12/2015 | Szigethy | |
| 2016/0028028 A1 | 1/2016 | Li et al. | |
| 2016/0043331 A1 | 2/2016 | Li et al. | |
| 2016/0072082 A1 | 3/2016 | Brooks et al. | |
| 2016/0133861 A1 | 5/2016 | Li et al. | |
| 2016/0133862 A1 | 5/2016 | Li et al. | |
| 2016/0194344 A1 | 7/2016 | Li et al. | |
| 2016/0197291 A1 | 7/2016 | Li et al. | |
| 2016/0285015 A1 | 9/2016 | Li et al. | |
| 2016/0359120 A1 | 12/2016 | Li | |
| 2016/0359125 A1 | 12/2016 | Li et al. | |
| 2016/0365520 A1* | 12/2016 | Stoessel | C07F 15/0033 |
| 2017/0005278 A1 | 1/2017 | Li et al. | |
| 2017/0012224 A1 | 1/2017 | Li et al. | |
| 2017/0040555 A1 | 2/2017 | Li et al. | |
| 2017/0047533 A1 | 2/2017 | Li et al. | |
| 2017/0066792 A1 | 3/2017 | Li et al. | |
| 2017/0069855 A1 | 3/2017 | Li et al. | |
| 2017/0267923 A1 | 9/2017 | Li | |
| 2017/0271611 A1 | 9/2017 | Li et al. | |
| 2017/0301871 A1 | 10/2017 | Li | |
| 2017/0305881 A1 | 10/2017 | Li et al. | |
| 2017/0331056 A1 | 11/2017 | Li et al. | |
| 2017/0342098 A1 | 11/2017 | Li | |
| 2017/0373260 A1 | 12/2017 | Li | |
| 2018/0006246 A1 | 1/2018 | Li | |
| 2018/0053904 A1 | 2/2018 | Li | |
| 2018/0130960 A1 | 5/2018 | Li | |
| 2018/0148464 A1 | 5/2018 | Li | |
| 2018/0159051 A1 | 6/2018 | Li et al. | |
| 2018/0175329 A1 | 6/2018 | Li | |
| 2018/0194790 A1 | 7/2018 | Li et al. | |
| 2018/0219161 A1 | 8/2018 | Li | |
| 2018/0226592 A1 | 8/2018 | Li | |
| 2018/0226593 A1 | 8/2018 | Li | |
| 2018/0337349 A1 | 11/2018 | Li et al. | |
| 2018/0337350 A1 | 11/2018 | Li et al. | |

FOREIGN PATENT DOCUMENTS

| | | |
|---|---|---|
| CN | 101142223 | 3/2008 |
| CN | 101667626 | 3/2010 |
| CN | 102449108 A | 5/2012 |
| CN | 102892860 | 1/2013 |
| CN | 102971396 | 3/2013 |
| CN | 103102372 | 5/2013 |
| CN | 104232076 | 12/2014 |
| CN | 104377231 | 2/2015 |
| CN | 104693243 | 6/2015 |
| CN | 105367605 | 3/2016 |
| CN | 105418591 | 3/2016 |
| EP | 1808052 | 7/2007 |
| EP | 1874893 | 1/2008 |
| EP | 1874894 | 1/2008 |
| EP | 1919928 | 5/2008 |
| EP | 2036907 | 3/2009 |
| EP | 2096690 | 9/2009 |
| EP | 2417217 | 2/2012 |
| EP | 2112213 | 7/2012 |
| EP | 2711999 | 3/2014 |
| JP | 2003342284 | 12/2003 |
| JP | 2005267557 | 9/2005 |
| JP | 2005310733 | 11/2005 |
| JP | 2006232784 | 9/2006 |
| JP | 2006242080 | 9/2006 |
| JP | 2006256999 | 9/2006 |
| JP | 2006257238 | 9/2006 |
| JP | 2006261623 | 9/2006 |
| JP | 2006290988 | 10/2006 |
| JP | 2006313796 | 11/2006 |
| JP | 2006332622 | 12/2006 |
| JP | 2006351638 | 12/2006 |
| JP | 2007019462 | 1/2007 |
| JP | 2007042875 | 2/2007 |
| JP | 2007051243 | 3/2007 |
| JP | 2007053132 | 3/2007 |
| JP | 2007066581 | 3/2007 |
| JP | 2007073620 | 3/2007 |
| JP | 2007073845 | 3/2007 |
| JP | 2007073900 | 3/2007 |
| JP | 2007080593 | 3/2007 |
| JP | 2007080677 | 3/2007 |
| JP | 2007088105 | 4/2007 |
| JP | 2007088164 | 4/2007 |
| JP | 2007096259 | 4/2007 |
| JP | 2007110067 | 4/2007 |
| JP | 2007110102 | 4/2007 |
| JP | 2007519614 | 7/2007 |
| JP | 2007258550 | 10/2007 |
| JP | 2007324309 | 12/2007 |
| JP | 2008091860 | 4/2008 |
| JP | 2008103535 | 5/2008 |
| JP | 2008108617 | 5/2008 |
| JP | 2008109085 | 5/2008 |
| JP | 2008160087 | 7/2008 |
| JP | 2008198801 | 8/2008 |
| JP | 2008270729 | 11/2008 |
| JP | 2008270736 | 11/2008 |
| JP | 2009016184 | 1/2009 |
| JP | 2009016579 | 1/2009 |
| JP | 2009032977 | 2/2009 |
| JP | 2009032988 | 2/2009 |
| JP | 2009059997 A | 3/2009 |
| JP | 2009076509 A | 4/2009 |
| JP | 2009161524 | 7/2009 |
| JP | 2009266943 | 11/2009 |
| JP | 2009267171 | 11/2009 |
| JP | 2009267244 | 11/2009 |
| JP | 2009272339 | 11/2009 |
| JP | 2009283891 | 12/2009 |
| JP | 2010135689 | 6/2010 |
| JP | 2010171205 | 8/2010 |
| JP | 2011071452 | 4/2011 |
| JP | 2012079895 | 4/2012 |
| JP | 2012079898 | 4/2012 |
| JP | 2012522843 | 9/2012 |
| JP | 2012207231 | 10/2012 |
| JP | 2012222255 | 11/2012 |
| JP | 2012231135 | 11/2012 |
| JP | 2013023500 | 2/2013 |
| JP | 2013048256 | 3/2013 |
| JP | 2013053149 | 3/2013 |
| JP | 2013525436 | 6/2013 |
| JP | 2014019701 | 2/2014 |
| JP | 2014058504 | 4/2014 |
| JP | 5604505 | 10/2014 |
| JP | 2014221807 | 11/2014 |
| JP | 2014239225 | 12/2014 |
| JP | 2015081257 | 4/2015 |
| KR | 1020060115371 | 11/2006 |
| KR | 2007061830 | 6/2007 |

(56) References Cited

FOREIGN PATENT DOCUMENTS

| | | |
|---|---|---|
| KR | 2007112465 | 11/2007 |
| KR | 1020130043460 | 4/2013 |
| KR | 101338250 | 12/2013 |
| KR | 20140052501 A | 5/2014 |
| TW | 200701835 | 1/2007 |
| TW | 201249851 | 12/2012 |
| TW | 201307365 | 2/2013 |
| TW | 201710277 | 3/2017 |
| WO | WO2004003108 | 1/2004 |
| WO | WO2004108857 | 12/2004 |
| WO | WO2005042444 | 5/2005 |
| WO | WO2005042550 | 5/2005 |
| WO | WO2005113704 | 12/2005 |
| WO | WO2006033440 | 3/2006 |
| WO | WO2006098505 | 9/2006 |
| WO | WO2006115299 | 11/2006 |
| WO | WO2006115301 | 11/2006 |
| WO | WO2008066192 | 6/2008 |
| WO | WO2008066195 | 6/2008 |
| WO | WO2008066196 | 6/2008 |
| WO | WO2008117889 | 10/2008 |
| WO | WO2008123540 | 10/2008 |
| WO | WO2009017211 | 2/2009 |
| WO | WO2010093176 | 8/2010 |
| WO | WO2010118026 | 10/2010 |
| WO | WO2011137429 | 11/2011 |
| WO | WO2011137431 | 11/2011 |
| WO | WO2012112853 | 8/2012 |
| WO | WO2012116231 | 8/2012 |
| WO | WO2012142387 | 10/2012 |
| WO | WO2012162488 | 11/2012 |
| WO | WO2012163471 | 12/2012 |
| WO | WO2013130483 | 9/2013 |
| WO | WO2014016611 | 1/2014 |
| WO | WO2014031977 | 2/2014 |
| WO | WO2014047616 | 3/2014 |
| WO | WO-2014094960 A1 * 6/2014 ......... H01L 51/0085 |
| WO | WO2014109814 | 7/2014 |
| WO | WO2014208271 | 12/2014 |
| WO | WO2015027060 | 2/2015 |
| WO | WO2015131158 | 9/2015 |
| WO | WO2016025921 | 2/2016 |
| WO | WO2016029137 | 2/2016 |
| WO | WO2016029186 | 2/2016 |
| WO | WO2016197019 | 12/2016 |
| WO | WO2018071697 | 4/2018 |
| WO | WO2018140765 | 8/2018 |
| WO | WO2007034985 | 3/2023 |

OTHER PUBLICATIONS

Wang, L.; Hodgson, C.; Erdogan, T., 2010, A new class of polarization filters for laser applications, Proc. SPIE 7698, Optical Components and Materials VII, 75980T (Feb. 26, 2010) (Year: 2010).*

Podlipensky, A.; Abdolvand, A.; Seifer, G.; Graener, H.; Deparis, O.; Kazansky, 2004, Dissolution of Silver Nanoparticles in Glass through an Intense dc Electric Field, J. Phy. Chem. B. 108, 17699-17702 (Year: 2004).*

Supporting Information: Xiao-Chun Hang et al., "Highly Efficient Blue-Emitting Cyclometalated Platinum(II) Complexes by Judicious Molecular Design," Wiley-VCH 2013, 7 pages.

Russell J. Holmes et al., "Blue and Near-UV Phosphorescence from Iridium Complexes with Cyclometalated Pyrazolyl or N-Heterocyclic Carbene Ligands," Inorganic Chemistry, 2005, vol. 44, No. 22, pp. 7995-8003.

Pui Keong Chow et al., "Strongly Phosphorescent Palladium(II) Complexes of Tetradentate Ligands with Mixed Oxygen, Carbon, and Nitrogen Donor Atoms: Photophysics, Photochemistry, and Applications," Angew. Chem. Int. Ed. 2013, 52, 11775-11779.

Pui-Keong Chow et al., "Highly luminescent palladium(II) complexes with sub-millisecond blue to green phosphorescent excited states. Photocatalysis and highly efficient PSF-OLEDs," Chem. Sci., 2016, 7, 6083-6098.

V. Thamilarasan et al., "Green-emitting phosphorescent iridium(III) complex: Structural, photophysical and electrochemical properties," Inorganica Chimica Acta, vol. 408, 2013, pp. 240-245.

Rui Zhu et al., "Color tuning based on a six-membered chelated iridium (III) complex with aza-aromatic ligand," Chemistry Letters, vol. 34, No. 12, 2005, pp. 1668-1669.

Authorized Officer Dong Wook Lee, International Search Report and Written Opinion for PCT/US2016/035859 dated Sep. 19, 2016, 12 pages.

Li, X. et al., "Density functional theory study of photophysical properties of iridium (III) complexes with phenylisoquinoline and phenylpyridine ligands", The Journal of Physical Chemistry C, 2011, vol. 115, No. 42, pp. 20722-20731.

Authorized Officer Dong Wook Lee, International Preliminary Report on Patentability for PCT/US2016/035859 dated Dec. 14, 2017, 8 pages.

Chi-Ming Che et al. "Photophysical Properties and OLEO Applications of Phosphorescent Platinum(ll) Schiff Base Complexes," Chem. Eur. J., vol. 16, 2010, pp. 233-247.

JP2009267244, English Translation from EPO, Nov. 2009, 80 pages.

JP2010135689, English translation from EPO, Jun. 2010, 95 pages.

Chi et al.; Transition-metal phosphors with cyclometalating ligands: fundamentals and applications, Chemical Society Reviews, vol. 39, No. 2, Feb. 2010, pp. 638-655.

Barry O'Brien et al.: White organic light emitting diodes using Pt-based red, green and blue phosphorescent dopants. Proc. SPIE, vol. 8829, pp. 1-6, Aug. 25, 2013.

Xiao-Chu Hang et al., "Highly Efficient Blue-Emitting Cyclometalated Platinum(II) Complexes by Judicious Molecular Design," Angewandte Chemie, International Edition, vol. 52, Issue 26, Jun. 24, 2013, pp. 6753-6756.

Dileep A. K. Vezzu et al., "Highly Luminescent Tetradentate Bis-Cyclometalated Platinum Complexes: Design, Synthesis, Structure, Photophysics, and Electroluminescence Application," Inorg. Chem., vol. 49, 2010, pp. 5107-5119.

Jan Kalinowski et al., "Light-emitting devices based on organometallic platinum complexes as emitters," Coordination Chemistry Reviews, vol. 255, 2011, pp. 2401-2425.

Ke Feng et al., "Norbornene-Based Copolymers Containing Platinum Complexes and Bis(carbazolyl)benzene Groups in Their Side-Chains," Macromolecules, vol. 42, 2009, pp. 6855-6864.

Hirohiko Fukagawa et al., "Highly Efficient and Stable Red Phosphorescent Organic Light-Emitting Diodes Using Platinum Complexes," Adv. Mater., 2012, vol. 24, pp. 5099-5103.

Eric Turner et al., "Cyclometalated Platinum Complexes with Luminescent Quantum Yields Approaching 100%," Inorg. Chem., 2013, vol. 52, pp. 7344-7351.

Steven C. F. Kui et al., "Robust Phosphorescent Platinum(II) Complexes Containing Tetradentate ONCN Ligands: Excimeric Excited State and Application in Organic White-Light-Emitting Diodes," Chem. Eur. J., 2013, vol. 19, pp. 69-73.

Steven C. F. Kui et al., "Robust phosphorescent platinum(II) complexes with tetradentate ONCN ligands: high efficiency OLEDs with excellent efficiency stability," Chem. Commun., 2013, vol. 49, pp. 1497-1499.

Guijie Li et al., "Efficient and stable red organic light emitting devices from a tetradentate cyclometalated platinum complex," Organic Electronics, 2014, vol. 15 pp. 1862-1867.

Guijie Li et al., Efficient and Stable White Organic Light-Emitting Diodes Employing a Single Emitter, Adv. Mater., 2014, vol. 26, pp. 2931-2936.

Barry O'Brien et al., "High efficiency white organic light emitting diodes employing blue and red platinum emitters," Journal of Photonics for Energy, vol. 4, 2014, pp. 043597-1-043597-8.

Kai Li et al., "Light-emitting platinum(II) complexes supported by tetradentate dianionic bis(N-heterocyclic carbene) ligands: towards robust blue electrophosphors," Chem. Sci., 2013, vol. 4, pp. 2630-2644.

(56) References Cited

OTHER PUBLICATIONS

Tyler Fleetham et al., "Efficient "pure" blue OLEDs employing tetradentate Pt complexes with a narrow spectral bandwidth," Advanced Materials (Weinheim, Germany), Vo. 26, No. 41, 2014, pp. 7116-7121.

Murakami; JP 2007258550, English machine translation from EPO, Oct. 4, 2007. 80 pages.

Murakami; JP 2007324309, English machine translation from EPO, Dec. 13, 2007, 89 pages.

Marc Lepeltier et al., "Efficient blue green organic light-emitting devices based on a monofluorinated heteroleptic iridium(III) complex," Synthetic Metals, vol. 199, 2015, pp. 139-146.

Stefan Bernhard, "The First Six Years: A Report," Department of Chemistry, Princeton University, May 2008, 11 pages.

Zhi-Qiang Zhu et.al., "Harvesting All Electrogenerated Excitons through Metal Assisted Delayed Fluorescent Materials," Adv. Mater. 27 (2015) 2533-2537.

Zhi-Qiang Zhu et. al . . . "Efficient Cyclometalated Platinum(II) Complex with Superior Operational Stability," Adv. Mater. 29 (2017) 1605002.

Maestri et al., "Absorption Spectra and Luminescence Properties of Isomeric Platinum (II) and Palladium (II) Complexes Containing 1,1'-Biphenyldiyl, 2-Phenylpyridine, and 2,2'-Bipyridine as Ligands," Helvetica Chimica Acta, vol. 71, Issue 5, Aug. 10, 1988, pp. 1053-1059.

Guijie Li et al., "Modifying Emission Spectral Bandwidth of Phosphorescent Platinum(II) Complexes Through Synthetic Control," Inorg. Chem. 2017, 56, 8244-8256.

Tyler Fleetham et al., "Efficient Red-Emitting Platinum Complex with Long Operational Stability," ACS Appl. Mater. Interfaces 2015, 7, 16240-16246.

Chen, "Full-Color and White-Light Polarized Light-Emitting Diodes Using Monodisperse Conjugated Oligomers," University of Rochester, PhD Thesis, 2006, 256 pages.

Lin et al., "Linearly polarized light emission from organic light emitting diode with metallic nanograting structure," 12th IEEE International Conference on Nanotechnology (IEEE-NANO) (Birmingham, UK, Aug. 20-23, 2012), 2012 [Date Added to IEEE Xplore: Oct. 2012], 4 pages, <DOI:10.1109/NANO.2012.6321948>.

Park et al., "Linearly-polarized White-light-emitting OLEDs Using Photon Recycling," Journal of the Korean Physical Society, Aug. 2011, 59(2):341-345 <DOI:10.3938/jkps.59.341>.

Park et al., "Polarized electroluminescence from organic light-emitting devices using photon recycling," Optics Express, Sep. 2010, 18(19):19824-19830 <DOI:10.1364/OE.18.019824>.

\* cited by examiner

TRANSPARENT ELECTROLUMINESCENT DEVICES WITH CONTROLLED ONE-SIDE EMISSIVE DISPLAYS

CROSS-REFERENCE TO RELATED APPLICATION

This application is a U.S. National Phase Application of International Patent Application No. PCT/US2016/035859 filed on Jun. 3, 2016, which claims the benefit of U.S. Provisional Patent Application No. 62/170,809 entitled "TRANSPARENT ELECTROLUMINESCENT DEVICES WITH CONTROLLED ONE-SIDE EMISSIVE DISPLAYS" filed on Jun. 4, 2015, both of which are incorporated herein by reference in their entirety.

TECHNICAL FIELD

This invention relates to transparent electroluminescent devices with controlled one-side emissive displays and generating linearly polarized light.

BACKGROUND

As depicted in FIG. 1, a typical organic light emitting diode (OLED) 100 includes a layer of indium tin oxide (ITO) as an anode 102, a single layer of hole-transporting materials (HTL) 104, a single layer of emissive materials (EML) 106 including emitter and host, a single layer of electron-transporting materials (ETL) 108, and a layer of metal cathode 110, all on substrate 112. The emission color of OLED is determined by the emission energy (optical energy gap) of the emitter. Emitters include phosphorescent emitters, thermal activated delayed fluorescent emitters, and metal-assisted delayed fluorescent emitters.

In various aspects, any of the one or more layers depicted in FIG. 1 may include indium tin oxide (ITO), poly(3,4-ethylenedioxythiophene) (PEDOT), polystyrene sulfonate (PSS), N,N'-di-1-naphthyl-N,N-diphenyl-1,1'-biphenyl-4,4'diamine (NPD), 1,1-bis((di-4-tolylamino)phenyl)cyclohexane (TAPC), 2,6-Bis(N-carbazolyl)pyridine (mCpy), 2,8-bis(diphenylphosphoryl)dibenzothiophene (PO15), LiF, Al, or a combination thereof.

The emission color of an OLED is determined by the emission energy (optical energy gap) of the emissive materials 106, which can be tuned by tuning the electronic structure of the emitting compounds, the host material, or both. Both the hole-transporting material in the HTL layer 104 and the electron-transporting material(s) in the ETL layer 108 may include any suitable hole-transporter known in the art.

OLEDs with polarized electroluminescent spectra are desirable for mobile displays or other full color display applications. To enable a high quality of full color displays, a polarizer may be coupled to a transparent electrode of an OLED to filter unwanted reflected light from the background, thereby yielding linearly or circularly polarized light. FIG. 2A depicts a linearly polarized light wave 200. FIG. 2B depicts a circularly polarized light wave 202. This polarizer/OLED arrangement, however, decreases the device efficiency of the OLED by filtering some of the emitted photons.

SUMMARY

Described herein are transparent OLEDs with controlled one-side emissive displays suitable for use in displays such as mobile displays and full color displays. By positioning polarizers to filter the circularly polarized electroluminescent light from OLEDS that generate exclusively selected circularly polarized electroluminescent emission in the device settings, the emissive light from one side can be eliminated without eliminating the natural background light from the back. Transparent OLEDs generating exclusively selected circularly polarized electroluminescent emission can be realized with the incorporation of optically pure chiral luminescent metal complexes.

In a first general aspect, a light emitting device includes a transparent organic light emitting device and a quarter-wave plate. The transparent organic light emitting device includes a chiral complex emitter and produces circularly polarized light, and the quarter-wave plate converts the circularly polarized light into linearly polarized light.

Implementations of the first general aspect may include one or more of the following features.

In some implementations, the light emitting device includes a linear polarizer positioned adjacent to the quarter-wave plate, and the linear polarizer filters the linearly polarized light.

In a second general aspect, generating linearly polarized light includes generating circularly polarized light via a transparent organic light emitting device including a chiral complex emitter and passing the circularly polarized light through a quarter-wave plate.

Implementations of the second general aspect may include passing the linearly polarized light through a linear polarizer.

Implementations of the first and second general aspects may include one or more of the following features.

In some implementations, the chiral complex emitter has a structure represented by General Formula IA:

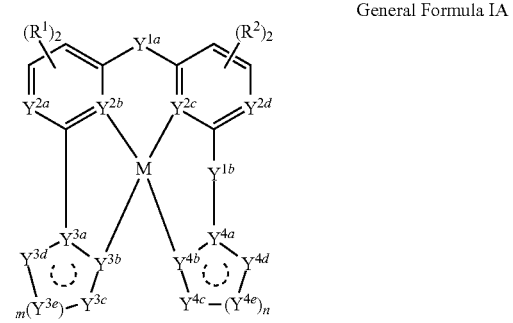

General Formula IA wherein:
M represents $Pt^{2+}$, $Pd^{2+}$, $Ir^+$, $Rh^+$, or $Au^{3+}$;
each $R^1$ and $R^2$ in $(R^1)_2$ and $(R^2)_2$ independently represents hydrogen, halogen, hydroxyl, nitro, thiol, or substituted or unsubstituted: $C_1$-$C_4$ alkyl or amino;
$Y^{1a}$ represents O; S; $NR^{3a}$, wherein $R^{3a}$ represents substituted or unsubstituted $C_1$-$C_4$ alkyl; $Si(R^{3b})_2$, wherein each $R^{3b}$ in $(R^{3b})_2$ independently represents substituted or unsubstituted $C_1$-$C_4$ alkyl; or $C(R^{3c})_2$, wherein each $R^{3c}$ in $(R^{3c})_2$ independently represents hydrogen or substituted or unsubstituted $C_1$-$C_4$ alkyl;
$Y^{1b}$ is present or absent, and if present, represents a covalent bond or O; S; $NR^{4a}$, wherein $R^{4a}$ represents substituted or unsubstituted $C_1$-$C_4$ alkyl; $Si(R^{4b})_2$, wherein each $R^{4b}$ in $(R^{4b})_2$ independently represents substituted or unsubstituted $C_1$-$C_4$ alkyl; or $C(R^{4c})_2$, wherein each $R^{4c}$ in $(R^{4c})_2$ independently represents hydrogen or substituted or unsubstituted $C_1$-$C_4$ alkyl;

each of $Y^{2a}$, $Y^{2b}$, $Y^{2c}$, and $Y^{2d}$ independently represents N, $NR^{5a}$, or $CR^{5b}$, wherein each of $R^{5a}$ and $R^{5b}$ independently represents hydrogen, halogen, hydroxyl, nitro, thiol, or substituted or unsubstituted: $C_1$-$C_4$ alkyl or amino;

each of $Y^{3a}$, $Y^{3b}$, $Y^{3c}$, $Y^{3d}$, $Y^{3e}$, $Y^{4a}$, $Y^{4b}$, $Y^{4c}$, $Y^{4d}$, and $Y^{4e}$ independently represents N; O; S; $NR^{6a}$ or $CR^{6b}$, wherein each of $R^{6a}$ and $R^{6b}$ independently represents hydrogen or substituted or unsubstituted $C_1$-$C_4$ alkyl; or $Z(R^{6c})_2$, wherein Z is C or Si, and each $R^{6c}$ in $(R^{6c})_2$ independently represents hydrogen or substituted or unsubstituted $C_1$-$C_4$ alkyl;

m is 1 or 2;
n is 1 or 2;

the open dotted circle indicates partial or full unsaturation of the ring with which it is associated; and at least one of M, $R^1$, $R^2$, $Y^{1a}$, $Y^{1b}$, $Y^{1c}$, $Y^{2a}$, $Y^{2b}$, $Y^{2c}$, $Y^{2d}$, $Y^{3a}$, $Y^{3b}$, $Y^{3c}$, $Y^{3d}$, $Y^{3e}$, $Y^{4a}$, $Y^{4b}$, $Y^{4c}$, $Y^{4d}$, and $Y^{4e}$ is a chiral center.

In some implementations, the chiral complex emitter has a structure represented by General Formula IB:

General Formula IB

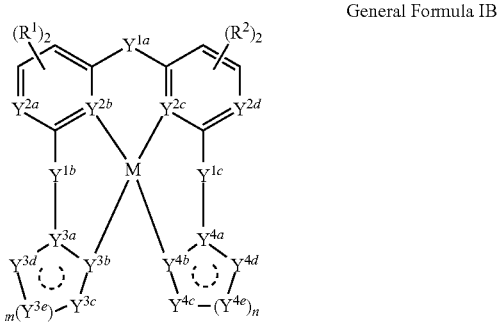

wherein:

M represents $Pt^{2+}$, $Pd^{2+}$, $Ir^+$, $Rh^+$, or $Au^{3+}$;

each $R^1$ and $R^2$ in $(R^1)_2$ and $(R^2)_2$ independently represents hydrogen, halogen, hydroxyl, nitro, thiol, or substituted or unsubstituted: $C_1$-$C_4$ alkyl or amino;

$Y^{1a}$ represents O; S; $NR^{3a}$, wherein $R^{3a}$ represents substituted or unsubstituted $C_1$-$C_4$ alkyl; $Si(R^{3b})_2$, wherein each $R^{3b}$ in $(R^{3b})_2$ independently represents substituted or unsubstituted $C_1$-$C_4$ alkyl; or $C(R^{3c})_2$, wherein each $R^{3c}$ in $(R^{3c})_2$ independently represents hydrogen or substituted or unsubstituted $C_1$-$C_4$ alkyl;

$Y^{1b}$ is present or absent, and if present, represents a covalent bond or O; S; $NR^{4a}$, wherein $R^{4a}$ represents substituted or unsubstituted $C_1$-$C_4$ alkyl; $Si(R^{4b})_2$, wherein each $R^{4b}$ in $(R^{4b})_2$ independently represents substituted or unsubstituted $C_1$-$C_4$ alkyl; or $C(R^{4c})_2$, wherein each $R^{4c}$ in $(R^{4c})_2$ independently represents hydrogen or substituted or unsubstituted $C_1$-$C_4$ alkyl;

$Y^{1c}$ represents O; S; $NR^{5a}$, wherein $R^{5a}$ represents substituted or unsubstituted $C_1$-$C_4$ alkyl; $Si(R^{5b})_2$, wherein each $R^{5b}$ in $(R^{5b})_2$ independently represents substituted or unsubstituted $C_1$-$C_4$ alkyl; or $C(R^{5c})_2$, wherein each $R^{5c}$ in $(R^{5c})_2$ independently represents hydrogen or substituted or unsubstituted $C_1$-$C_4$ alkyl;

each of $Y^{2a}$, $Y^{2b}$, $Y^{2c}$, and $Y^{2d}$, valency permitting, independently represents N, $NR^{6a}$, or $CR^{6b}$, wherein each of $R^{6a}$ and $R^{6b}$ independently represents hydrogen, halogen, hydroxyl, nitro, thiol, or substituted or unsubstituted: $C_1$-$C_4$ alkyl or amino;

each of $Y^{3a}$, $Y^{3b}$, $Y^{3c}$, $Y^{3d}$, $Y^{3e}$, $Y^{4a}$, $Y^{4b}$, $Y^{4c}$, $Y^{4d}$, and $Y^{4e}$, valency permitting, independently represents N; O; S; $NR^{7a}$ or $CR^{7b}$, wherein each of $R^{7a}$ and $R^{7b}$ independently represents hydrogen or substituted or unsubstituted $C_1$-$C_4$ alkyl; or $Z(R^{7c})_2$, wherein Z is C or Si, and each $R^{7c}$ in $(R^{7c})_2$ independently represents hydrogen or substituted or unsubstituted $C_1$-$C_4$ alkyl;

m is 1 or 2;
n is 1 or 2;

the open dotted circle indicates partial or full unsaturation of the ring with which it is associated; and at least one of M, $R^1$, $R^2$, $Y^{1a}$, $Y^{1b}$, $Y^{1c}$, $Y^{2a}$, $Y^{2b}$, $Y^{2c}$, $Y^{2d}$, $Y^{3a}$, $Y^{3b}$, $Y^{3c}$, $Y^{3d}$, $Y^{3e}$, $Y^{4a}$, $Y^{4b}$, $Y^{4c}$, $Y^{4d}$, and $Y^{4e}$ is a chiral center.

In some implementations, the chiral complex emitter has a structure represented by General Formula IIA:

General Formula IIA

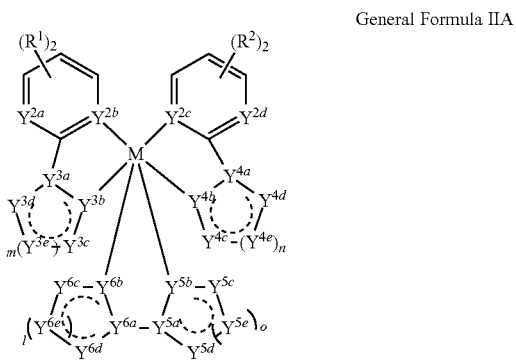

wherein:

M represents $Ir^{3+}$ or $Rh^{3+}$;

each $R^1$ and $R^2$ in $(R^1)_2$ and $(R^2)_2$ independently represents hydrogen, halogen, hydroxyl, nitro, thiol, or substituted or unsubstituted: $C_1$-$C_4$ alkyl or amino;

each of $Y^{2a}$, $Y^{2b}$, $Y^{2c}$, and $Y^{2d}$, valency permitting, independently represents N, $NR^{3a}$, or $CR^{3b}$, wherein each of $R^{3a}$ and $R^{3b}$ independently represents hydrogen, halogen, hydroxyl, nitro, thiol, or substituted or unsubstituted: $C_1$-$C_4$ alkyl or amino;

each of $Y^{3a}$, $Y^{3b}$, $Y^{3c}$, $Y^{3d}$, $Y^{3e}$, $Y^{4a}$, $Y^{4b}$, $Y^{4c}$, $Y^{4d}$, and $Y^{4e}$, valency permitting, independently represents N; O; S; $NR^{4a}$ or $CR^{4b}$, wherein each of $R^{4a}$ and $R^{4b}$ independently represents hydrogen or substituted or unsubstituted $C_1$-$C_4$ alkyl; or $Z(R^{4c})_2$, wherein Z is C or Si, and each $R^{4c}$ in $(R^{4c})_2$ independently represents hydrogen or substituted or unsubstituted $C_1$-$C_4$ alkyl;

each of $Y^{5a}$, $Y^{5b}$, $Y^{5c}$, $Y^{5d}$, $Y^{5e}$, $Y^{6a}$, $Y^{6b}$, $Y^{6c}$, $Y^{6d}$, and $Y^{6e}$, valency permitting, independently represents N, O, S, $NR^{6a}$ or $CR^{6b}$, wherein each of $R^{6a}$ and $R^{6b}$ independently represents hydrogen or substituted or unsubstituted $C_1$-$C_4$ alkyl;

l is 1 or 2;
m is 1 or 2;
n is 1 or 2;
is 1 or 2;

the open dotted circle indicates partial or full unsaturation of the ring with which it is associated; and at least one of M, $R^1$, $R^2$, $Y^{2a}$, $Y^{2b}$, $Y^{2c}$, $Y^{2d}$, $Y^{3a}$, $Y^{3b}$, $Y^{3c}$, $Y^{3d}$, $Y^{3e}$, $Y^{4a}$, $Y^{4b}$, $Y^{4c}$, $Y^{4c}$, $Y^{4d}$, $Y^{4e}$, $Y^{5a}$, $Y^{5b}$, $Y^{5c}$, $Y^{5d}$, $Y^{5e}$, $Y^{6a}$, $Y^{6b}$, $Y^{6c}$, $Y^{6d}$, and $Y^{6e}$ is a chiral center.

Implementations of General Formula IIA may include one or more of the following bonding arrangements in which two of $R^1$, $R^2$, $Y^{3a}$, $Y^{3b}$, $Y^{2a}$, $Y^{2d}$, $Y^{3c}$, $Y^{3d}$, $Y^{3e}$, $Y^{4c}$, $Y^{4d}$, $Y^{4e}$, $Y^{5c}$, $Y^{5d}$, $Y^{5e}$ and $Y^{6d}$ form a substituted or unsubstituted: carbocyclyl, aryl, heterocyclyl, or heteroaryl. In some examples, two adjacent $R^1$; two adjacent $R^2$; $R^1$ or $R^2$ together with an adjacent $R^{3a}$ or $R^{3b}$; two adjacent $Y^{3c}$, $Y^{3d}$, and $Y^{3e}$; two adjacent $Y^{4c}$, $Y^{4d}$, and $Y^{4e}$; two adjacent $Y^{5c}$, $Y^{5d}$ and $Y^{5e}$; $Y^{2a}$ and $Y^{3d}$; $Y^{2d}$ and $Y^{4d}$; or $Y^{6d}$ and $Y^{5d}$ form a substituted or unsubstituted: carbocyclyl, aryl, heterocyclyl, or heteroaryl.

In some implementations, the chiral complex emitter of General Formula IIA has a structure depicted in FIGS. 7-16.

In some implementations, the chiral complex emitter has a structure represented by General Formula IIB:

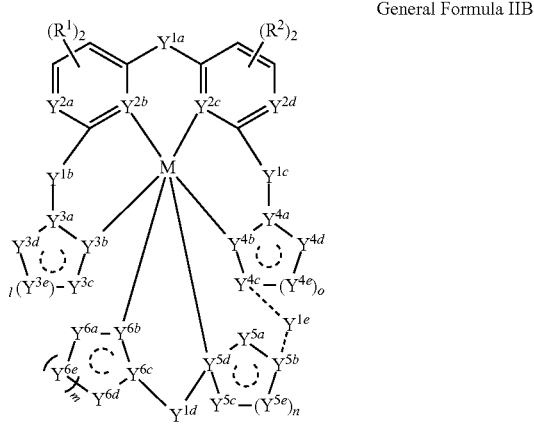

General Formula IIB wherein:
M represents $Ir^{3+}$ or $Rh^{3+}$;
each $R^1$ and $R^2$ in $(R^1)_2$ and $(R^2)_2$ independently represents hydrogen, halogen, hydroxyl, nitro, thiol, or substituted or unsubstituted: $C_1$-$C_4$ alkyl or amino;
each of $Y^{1a}$, $Y^{1c}$, and $Y^{1d}$ independently represents O; S; $NR^{4a}$, wherein each of $R^{4b}$ in $(R^{4b})_2$ independently represents substituted or unsubstituted $C_1$-$C_4$ alkyl; or $C(R^{4c})_2$, wherein each $R^{4c}$ in $(R^{4c})_2$ independently represents hydrogen or substituted or unsubstituted $C_1$-$C_4$ alkyl;
$Y^{1b}$ is present or absent, and if present, represents a covalent bond or O; S; $NR^{4a}$, wherein $R^{5a}$ represents substituted or unsubstituted $C_1$-$C_4$ alkyl; $Si(R^{5b})_2$, wherein each $R^{5b}$ in $(R^{5b})_2$ independently represents substituted or unsubstituted $C_1$-$C_4$ alkyl; or $C(R^{5c})_2$, wherein each $R^{5c}$ in $(R^{5c})_2$ independently represents hydrogen or substituted or unsubstituted $C_1$-$C_4$ alkyl;
$Y^{1e}$ is present or absent, and if present, represents a covalent bond or O; S; $NR^{4a}$, wherein $R^{4a}$ represents substituted or unsubstituted $C_1$-$C_4$ alkyl; $Si(R^{4b})_2$, wherein each $R^{4c}$ in $(R^{4c})_2$ independently represents substituted or unsubstituted $C_1$-$C_4$ alkyl;
each of $Y^{2a}$, $Y^{2b}$, $Y^{2c}$, and $Y^{2d}$, valency permitting, independently represents N, $NR^{6a}$, or $CR^{6b}$, wherein each of $R^{6a}$ and $R^{6b}$ independently represents hydrogen, halogen, hydroxyl, nitro, thiol, or substituted or unsubstituted: $C_1$-$C_4$ alkyl or amino;
each of $Y^{3a}$, $Y^{3b}$, $Y^{3c}$, $Y^{3d}$, $Y^{3e}$, $Y^{4a}$, $Y^{4b}$, $Y^{4c}$, $Y^{4d}$, and $Y^{4e}$, valency permitting, independently represents N; O; S; $NR^{6a}$ or $CR^{6b}$, wherein each of $R^{6a}$ and $R^{6b}$ independently represents hydrogen or substituted or unsubstituted $C_1$-$C_4$ alkyl; or $Z(R^{6c})_2$, wherein Z is C or Si, and each $R^{6c}$ in $(R^{6c})_2$ independently represents hydrogen or substituted or unsubstituted $C_1$-$C_4$ alkyl;
l is 1 or 2;
m is 1 or 2;
n is 1 or 2;
is 1 or 2;

the open dotted circle (⸺) indicates partial or full unsaturation of the ring with which it is associated; and
at least one of M, $R^1$, $R^2$, $Y^{1a}$, $Y^{1b}$, $Y^{1c}$, $Y^{1d}$, $Y^{2a}$, $Y^{2b}$, $Y^{2c}$, $Y^{2d}$, $Y^{3a}$, $Y^{3b}$, $Y^{3c}$, $Y^{3c}$, $Y^{3d}$, $Y^{3e}$, $Y^{4a}$, $Y^{4b}$, $Y^{4c}$, $Y^{4d}$, $Y^{4e}$, $Y^{5a}$, $Y^{5b}$, $Y^{5c}$, $Y^{5d}$, $Y^{5e}$, $Y^{5a}$, $Y^{5b}$, $Y^{6d}$, $Y^{6e}$ is a chiral center.

Implementations of General Formula IIB may include one or more of the following bonding arrangements in which two of $R^1$, $R^2$, $Y^{2a}$, $Y^{1a}$, $Y^{1b}$, $Y^{1c}$, $Y^{1d}$, $Y^{1e}$, $Y^{2a}$, $Y^{2b}$, $Y^{2c}$, $Y^{2d}$, $Y^{3a}$, $Y^{3b}$, $Y^{3c}$, $Y^{3d}$, $Y^{3e}$, $Y^{4a}$, $Y^{4b}$, $Y^{4c}$, $Y^{4d}$, $Y^{4e}$, $Y^{5a}$, $Y^{5b}$, $Y^{5c}$, $Y^{5d}$, $Y^{5e}$, $Y^{6a}$, $Y^{6b}$, $Y^{6c}$, $Y^{6d}$, and $Y^{6e}$ with the proper valency form a substituted or unsubstituted: carbocyclyl, aryl, heterocyclyl, or heteroaryl. In some examples, two adjacent $R^1$; two adjacent $R^2$; $R^1$ or $R^2$ together with an adjacent $R^{4a}$ or $R^{4b}$; two adjacent $Y^{3c}$, $Y^{3d}$, and $Y^{3e}$; two adjacent $Y^{6a}$, $Y^{6d}$, and $Y^{6e}$; two adjacent $Y^{5b}$, $Y^{5c}$, and $Y^{5e}$; $Y^{4d}$ and $Y^{4e}$; $Y^{2a}$ and $Y^{4d}$; $Y^{4e}$ and $Y^{5e}$; or $Y^{5c}$ and $Y^{6d}$ form a substituted or unsubstituted: carbocyclyl, aryl, heterocyclyl, or heteroaryl.

Thus, particular embodiments have been described. Variations, modifications, and enhancements of the described embodiments and other embodiments can be made based on what is described and illustrated. In addition, one or more features of one or more embodiments may be combined. The details of one or more implementations and various features and aspects are set forth in the accompanying drawings, the description, and the claims below.

DETAILED DESCRIPTION

Figure 1:
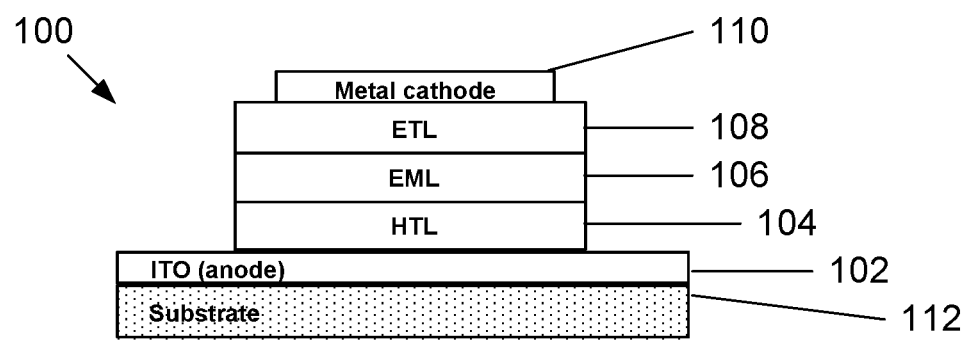
FIG. 1 depicts an organic light emitting device (OLED).
Figure 2A:
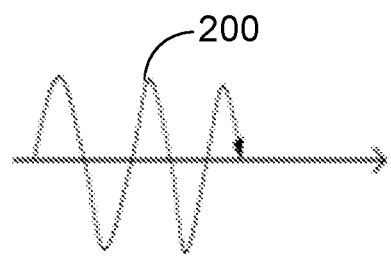
FIGS. 2A and 2B depict linearly polarized and circularly polarized light waves, respectively.
Figure 2B:
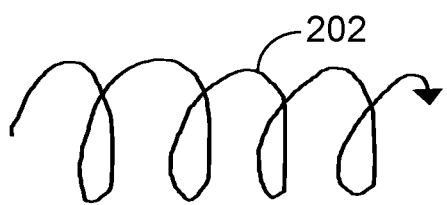

The present disclosure can be understood more readily by reference to the following detailed description and Examples.

Before the present compounds, devices, and/or methods are disclosed and described, it is to be understood that they are not limited to specific synthetic methods unless otherwise specified, or to particular reagents unless otherwise specified, as such can, of course, vary. It is also to be understood that the terminology used herein is for the purpose of describing particular aspects only and is not intended to be limiting. Although any methods and materials similar or equivalent to those described herein can be used in the practice or testing, example methods and materials are now described.

As used in the specification and the appended claims, the singular forms "a", "an", and "the" include plural referents unless the context clearly dictates otherwise. Thus, for example, reference to "a component" includes mixtures of two or more components.

As used herein, the terms "optional" or "optionally" means that the subsequently described event or circumstance can or cannot occur, and that the description includes instances where said event or circumstance occurs and instances where it does not.

Disclosed are the components to be used to prepare the compositions described herein as well as the compositions themselves to be used within the methods disclosed herein. These and other materials are disclosed herein, and it is understood that when combinations, subsets, interactions, groups, etc. of these materials are disclosed that while specific reference of each various individual and collective combinations and permutation of these compounds cannot be explicitly disclosed, each is specifically contemplated and described herein. For example, if a particular compound is disclosed and discussed and a number of modifications that can be made to a number of molecules including the compounds are discussed, specifically contemplated is each and every combination and permutation of the compound and the modifications that are possible unless specifically indicated to the contrary. Thus, if a class of molecules A, B, and C are disclosed as well as a class of molecules D, E, and F and an example of a combination molecule, A-D is disclosed, then even if each is not individually recited each is individually and collectively contemplated meaning combinations, A-E, A-F, B-D, B-E, B-F, C-D, C-E, and C-F are considered disclosed. Likewise, any subset or combination of these is also disclosed. Thus, for example, the sub-group of A-E, B-F, and C-E would be considered disclosed. This concept applies to all aspects of this application including, but not limited to, steps in methods of making and using the compositions. Thus, if there are a variety of additional steps that can be performed it is understood that each of these additional steps can be performed with any specific embodiment or combination of embodiments of the methods.

As referred to herein, a linking atom or group can connect two atoms such as, for example, an N atom and a C atom. A linking atom or group is in one aspect disclosed as $Y^{1a}$, $Y^{1b}$, $Y^{1c}$ and/or $Y^{1d}$ herein. The linking atom can optionally, if valency permits, have other chemical moieties attached. For example, in one aspect, an oxygen would not have any other chemical groups attached as the valency is satisfied once it is bonded to two groups (e.g., N and/or C groups). In another aspect, when carbon is the linking atom, two additional chemical moieties can be attached to the carbon. Suitable chemical moieties include amine, amide, thiol, aryl, heteroaryl, cycloalkyl, and heterocyclyl moieties.

As used herein, the term "substituted" is contemplated to include all permissible substituents of organic compounds. In a broad aspect, the permissible substituents include acyclic and cyclic, branched and unbranched, carbocyclic and heterocyclic, and aromatic and nonaromatic substituents of organic compounds. Illustrative substituents include, for example, those described below. The permissible substituents can be one or more and the same or different for appropriate organic compounds. For purposes of this disclosure, the heteroatoms, such as nitrogen, can have hydrogen substituents and/or any permissible substituents of organic compounds described herein which satisfy the valences of the heteroatoms. This disclosure is not intended to be limited in any manner by the permissible substituents of organic compounds. Also, the terms "substitution" or "substituted with" include the implicit proviso that such substitution is in accordance with permitted valence of the substituted atom and the substituent, and that the substitution results in a stable compound, e.g., a compound that does not spontaneously undergo transformation such as by rearrangement, cyclization, elimination, etc. It is also contemplated that, in certain aspects, unless expressly indicated to the contrary, individual substituents can be further (i.e., further substituted or unsubstituted).

The term "alkyl" as used herein is a branched or unbranched saturated hydrocarbon group of 1 to 24 carbon atoms, such as methyl, ethyl, n-propyl, isopropyl, n-butyl, isobutyl, s-butyl, t-butyl, n-pentyl, isopentyl, s-pentyl, neopentyl, hexyl, heptyl, octyl, nonyl, decyl, dodecyl, tetradecyl, hexadecyl, eicosyl, tetracosyl, and the like. The alkyl group can be cyclic or acyclic. The alkyl group can be branched or unbranched. The alkyl group can also be substituted or unsubstituted. For example, the alkyl group can be substituted with one or more groups including, but not limited to, alkyl, cycloalkyl, alkoxy, amino, ether, halide, hydroxy, nitro, silyl, sulfo-oxo, or thiol, as described herein. A "lower alkyl" group is an alkyl group containing from one to six (e.g., from one to four) carbon atoms.

Throughout the specification "alkyl" is generally used to refer to both unsubstituted alkyl groups and substituted alkyl groups; however, substituted alkyl groups are also specifically referred to herein by identifying the specific substituent(s) on the alkyl group. For example, the term "halogenated alkyl" or "haloalkyl" specifically refers to an alkyl group that is substituted with one or more halide, e.g., fluorine, chlorine, bromine, or iodine. The term "alkoxyalkyl" specifically refers to an alkyl group that is substituted with one or more alkoxy groups, as described below. The term "alkylamino" specifically refers to an alkyl group that is substituted with one or more amino groups, as described below, and the like. When "alkyl" is used in one instance and a specific term such as "alkylalcohol" is used in another, it is not meant to imply that the term "alkyl" does not also refer to specific terms such as "alkylalcohol" and the like.

This practice is also used for other groups described herein. That is, while a term such as "cycloalkyl" refers to both unsubstituted and substituted cycloalkyl moieties, the substituted moieties can, in addition, be specifically identified herein; for example, a particular substituted cycloalkyl can be referred to as, e.g., an "alkylcycloalkyl." Similarly, a substituted alkoxy can be specifically referred to as, e.g., a "halogenated alkoxy," a particular substituted alkenyl can be, e.g., an "alkenylalcohol," and the like. Again, the practice of using a general term, such as "cycloalkyl," and a specific term, such as "alkylcycloalkyl," is not meant to imply that the general term does not also include the specific term.

The term "cycloalkyl" as used herein is a non-aromatic carbon-based ring composed of at least three carbon atoms. Examples of cycloalkyl groups include, but are not limited to, cyclopropyl, cyclobutyl, cyclopentyl, cyclohexyl, norbornyl, and the like. The term "heterocycloalkyl" is a type of cycloalkyl group as defined above, and is included within the meaning of the term "cycloalkyl," where at least one of the carbon atoms of the ring is replaced with a heteroatom such as, but not limited to, nitrogen, oxygen, sulfur, or phosphorus. The cycloalkyl group and heterocycloalkyl group can be substituted or unsubstituted. The cycloalkyl group and heterocycloalkyl group can be substituted with one or more groups including, but not limited to, alkyl, cycloalkyl, alkoxy, amino, ether, halide, hydroxy, nitro, silyl, sulfo-oxo, or thiol as described herein.

The terms "alkoxy" and "alkoxyl" as used herein to refer to an alkyl or cycloalkyl group bonded through an ether linkage; that is, an "alkoxy" group can be defined as $—OA^1$ where $A^1$ is alkyl or cycloalkyl as defined above. "Alkoxy" also includes polymers of alkoxy groups as just described; that is, an alkoxy can be a polyether such as $—OA^1—OA^2$ or $—OA^1—(OA^2)_a—OA^3$, where "a" is an integer of from 1 to 200 and $A^1$, $A^2$, and $A^3$ are alkyl and/or cycloalkyl groups.

The term "alkenyl" as used herein is a hydrocarbon group of from 2 to 24 carbon atoms with a structural formula containing at least one carbon-carbon double bond. Asymmetric structures such as $(A^1A^2)C=C(A^3A^4)$ are intended to include both the E and Z isomers. This can be presumed in structural formulae herein wherein an asymmetric alkene is present, or it can be explicitly indicated by the bond symbol C=C. The alkenyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol, as described herein.

The term "cycloalkenyl" as used herein is a non-aromatic carbon-based ring composed of at least three carbon atoms and containing at least one carbon-carbon double bound, i.e., C=C. Examples of cycloalkenyl groups include, but are not limited to, cyclopropenyl, cyclobutenyl, cyclopentenyl, cyclopentadienyl, cyclohexenyl, cyclohexadienyl, norbornenyl, and the like. The term "heterocycloalkenyl" is a type of cycloalkenyl group as defined above, and is included within the meaning of the term "cycloalkenyl," where at least one of the carbon atoms of the ring is replaced with a heteroatom such as, but not limited to, nitrogen, oxygen, sulfur, or phosphorus. The cycloalkenyl group and heterocycloalkenyl group can be substituted or unsubstituted. The cycloalkenyl group and heterocycloalkenyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein.

The term "alkynyl" as used herein is a hydrocarbon group of 2 to 24 carbon atoms with a structural formula containing at least one carbon-carbon triple bond. The alkynyl group can be unsubstituted or substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol, as described herein.

The term "cycloalkynyl" as used herein is a non-aromatic carbon-based ring composed of at least seven carbon atoms and containing at least one carbon-carbon triple bound. Examples of cycloalkynyl groups include, but are not limited to, cycloheptynyl, cyclooctynyl, cyclononynyl, and the like. The term "heterocycloalkynyl" is a type of cycloalkenyl group as defined above, and is included within the meaning of the term "cycloalkynyl," where at least one of the carbon atoms of the ring is replaced with a heteroatom such as, but not limited to, nitrogen, oxygen, sulfur, or phosphorus. The cycloalkynyl group and heterocycloalkynyl group can be substituted or unsubstituted. The cycloalkynyl group and heterocycloalkynyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein.

The term "aryl" as used herein is a group that contains any carbon-based aromatic group including, but not limited to, benzene, naphthalene, phenyl, biphenyl, phenoxybenzene, and the like. The term "aryl" also includes "heteroaryl," which is defined as a group that contains an aromatic group that has at least one heteroatom incorporated within the ring of the aromatic group. Examples of heteroatoms include, but are not limited to, nitrogen, oxygen, sulfur, and phosphorus. Likewise, the term "non-heteroaryl," which is also included in the term "aryl," defines a group that contains an aromatic group that does not contain a heteroatom. The aryl group can be substituted or unsubstituted. The aryl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein. The term "biaryl" is a specific type of aryl group and is included in the definition of "aryl." Biaryl refers to two aryl groups that are bound together via a fused ring structure, as in naphthalene, or are attached via one or more carbon-carbon bonds, as in biphenyl.

The term "aldehyde" as used herein is represented by the formula —C(O)H. Throughout this specification "C(O)" is a short hand notation for a carbonyl group, i.e., C=O.

The terms "amine" or "amino" as used herein are represented by the formula $—NA^1A^2$, where $A^1$ and $A^2$ can be, independently, hydrogen or alkyl, cycloalkyl, alkenyl, cycloalkenyl, alkynyl, cycloalkynyl, aryl, or heteroaryl group as described herein.

The term "alkylamino" as used herein is represented by the formula —NH(-alkyl) where alkyl is described herein. Representative examples include, but are not limited to, methylamino group, ethylamino group, propylamino group, isopropylamino group, butylamino group, isobutylamino group, (sec-butyl)amino group, (tert-butyl)amino group, pentylamino group, isopentylamino group, (tert-pentyl) amino group, hexylamino group, and the like.

The term "dialkylamino" as used herein is represented by the formula $—N(-alkyl)_2$ where alkyl is a described herein. Representative examples include, but are not limited to, dimethylamino group, diethylamino group, dipropylamino group, diisopropylamino group, dibutylamino group, diisobutylamino group, di(sec-butyl)amino group, di(tert-butyl)amino group, dipentylamino group, diisopentylamino group, di(tert-pentyl)amino group, dihexylamino group, N-ethyl-N-methylamino group, N-methyl-N-propylamino group, N-ethyl-N-propylamino group and the like.

The term "carboxylic acid" as used herein is represented by the formula —C(O)OH.

The term "ester" as used herein is represented by the formula $—OC(O)A^1$ or $—C(O)OA^1$, where $A^1$ can be alkyl, cycloalkyl, alkenyl, cycloalkenyl, alkynyl, cycloalkynyl, aryl, or heteroaryl group as described herein. The term "polyester" as used herein is represented by the formula $-(A^1O(O)C-A^2-C(O)O)_a—$ or $-(A^1O(O)C-A^2-OC(O))_a—$, where $A^1$ and $A^2$ can be, independently, an alkyl, cycloalkyl, alkenyl, cycloalkenyl, alkynyl, cycloalkynyl, aryl, or heteroaryl group described herein and "a" is an integer from 1 to 500. "Polyester" is as the term used to describe a group that is produced by the reaction between a compound having at least two carboxylic acid groups with a compound having at least two hydroxyl groups.

The term "ether" as used herein is represented by the formula $A^1OA^2$, where $A^1$ and $A^2$ can be, independently, an alkyl, cycloalkyl, alkenyl, cycloalkenyl, alkynyl, cycloalkynyl, aryl, or heteroaryl group described herein. The term "polyether" as used herein is represented by the formula $-(A^1O-A^2O)_a-$, where $A^1$ and $A^2$ can be, independently, an alkyl, cycloalkyl, alkenyl, cycloalkenyl, alkynyl, cycloalkynyl, aryl, or heteroaryl group described herein and "a" is an integer of from 1 to 500. Examples of polyether groups include polyethylene oxide, polypropylene oxide, and polybutylene oxide.

The term "halide" as used herein refers to the halogens fluorine, chlorine, bromine, and iodine.

The term "heterocyclyl," as used herein refers to single and multi-cyclic non-aromatic ring systems and "heteroaryl as used herein refers to single and multi-cyclic aromatic ring systems: in which at least one of the ring members is other than carbon. The terms includes azetidine, dioxane, furan, imidazole, isothiazole, isoxazole, morpholine, oxazole, oxazole, including, 1,2,3-oxadiazole, 1,2,5-oxadiazole and 1,3,4-oxadiazole, piperazine, piperidine, pyrazine, pyrazole, pyridazine, pyridine, pyrimidine, pyrrole, pyrrolidine, tetrahydrofuran, tetrahydropyran, tetrazine, including 1,2,4,5-tetrazine, tetrazole, including 1,2,3,4-tetrazole and 1,2,4,5-tetrazole, thiadiazole, including, 1,2,3-thiadiazole, 1,2,5-thiadiazole, and 1,3,4-thiadiazole, thiazole, thiophene, triazine, including 1,3,5-triazine and 1,2,4-triazine, triazole, including, 1,2,3-triazole, 1,3,4-triazole, and the like.

The term "hydroxyl" as used herein is represented by the formula —OH.

The term "ketone" as used herein is represented by the formula $A^1C(O)A^2$, where $A^1$ and $A^2$ can be, independently, an alkyl, cycloalkyl, alkenyl, cycloalkenyl, alkynyl, cycloalkynyl, aryl, or heteroaryl group as described herein.

The term "azide" as used herein is represented by the formula $-N_3$.

The term "nitro" as used herein is represented by the formula $-NO_2$.

The term "nitrile" as used herein is represented by the formula —CN.

The term "silyl" as used herein is represented by the formula $-SiA^1A^2A^3$, where $A^1$, $A^2$, and $A^3$ can be, independently, hydrogen or an alkyl, cycloalkyl, alkoxy, alkenyl, cycloalkenyl, alkynyl, cycloalkynyl, aryl, or heteroaryl group as described herein.

The term "sulfo-oxo" as used herein is represented by the formulas $-S(O)A^1$, $-S(O)_2A^1$, $-OS(O)_2A^1$, or $-OS(O)_2OA^1$, where $A^1$ can be hydrogen or an alkyl, cycloalkyl, alkenyl, cycloalkenyl, alkynyl, cycloalkynyl, aryl, or heteroaryl group as described herein. Throughout this specification "S(O)" is a short hand notation for S=O. The term "sulfonyl" is used herein to refer to the sulfo-oxo group represented by the formula $-S(O)_2A^1$, where $A^1$ can be hydrogen or an alkyl, cycloalkyl, alkenyl, cycloalkenyl, alkynyl, cycloalkynyl, aryl, or heteroaryl group as described herein. The term "sulfone" as used herein is represented by the formula $A^1S(O)_2A^2$, where $A^1$ and $A^2$ can be, independently, an alkyl, cycloalkyl, alkenyl, cycloalkenyl, alkynyl, cycloalkynyl, aryl, or heteroaryl group as described herein. The term "sulfoxide" as used herein is represented by the formula $A^1S(O)A^2$, where $A^1$ and $A^2$ can be, independently, an alkyl, cycloalkyl, alkenyl, cycloalkenyl, alkynyl, cycloalkynyl, aryl, or heteroaryl group as described herein.

The term "thiol" as used herein is represented by the formula —SH.

As used herein, the term "absent" that defines a variable, e.g., $Y^{1b}$, means that the variable is not present such that the two groups connected through the variable are not bonded to each other. For example, in $A^1-Y^{1b}-A^2$, when $Y^{1b}$ is absent, $A^1$ and $A^2$ are not connected to each other.

"$R^1$," "$R^2$," "$R^3$," "$R^n$," where n is an integer, as used herein can, independently, possess one or more of the groups listed above. For example, if $R^1$ is a straight chain alkyl group, one of the hydrogen atoms of the alkyl group can optionally be substituted with a hydroxyl group, an alkoxy group, an alkyl group, a halide, and the like. Depending upon the groups that are selected, a first group can be incorporated within second group or, alternatively, the first group can be pendant (i.e., attached) to the second group. For example, with the phrase "an alkyl group comprising an amino group," the amino group can be incorporated within the backbone of the alkyl group. Alternatively, the amino group can be attached to the backbone of the alkyl group. The nature of the group(s) that is (are) selected will determine if the first group is embedded or attached to the second group.

Compounds described herein may contain "optionally substituted" moieties. In general, the term "substituted," whether preceded by the term "optionally" or not, means that one or more hydrogens of the designated moiety are replaced with a suitable substituent. Unless otherwise indicated, an "optionally substituted" group may have a suitable substituent at each substitutable position of the group, and when more than one position in any given structure may be substituted with more than one substituent selected from a specified group, the substituent may be either the same or different at every position. Combinations of substituents envisioned by this invention are preferably those that result in the formation of stable or chemically feasible compounds. In is also contemplated that, in certain aspects, unless expressly indicated to the contrary, individual substituents can be further optionally substituted (i.e., further substituted or unsubstituted).

The use of chiral metal complex emitters will eliminate the potential photon loss due to the polarizers by generating the corresponding polarized electroluminescent spectra. In addition, the specific alignment of chiral metal complex emitters may also reduce the plasimon quenching from the metal electrode and enhance the outcoupling efficiency of the device (i.e., more photons will exit from the device to produce higher illumination intensity).

Figure 3A:
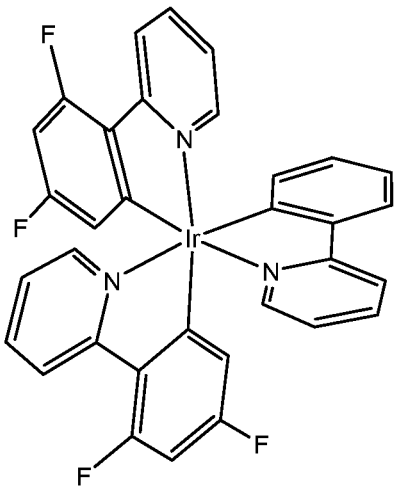
FIGS. 3A and 3B depict chiral isomers of an octahedral metal complex.
Figure 3B:
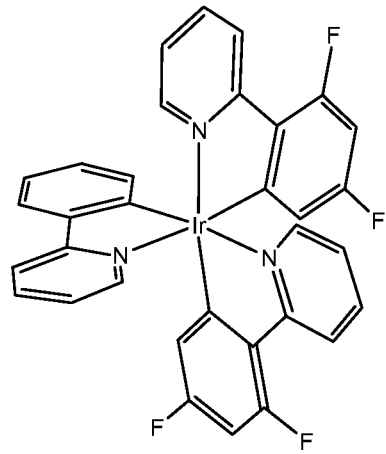

A chiral structure, such as a molecule or organometallic complex, is not superimposable on its mirror image. FIGS. 3A and 3B depict chiral isomers of an octahedral metal complex. A chiral center is an atom in a structure, such as an organic molecule, that has four or more unique atoms or groups attached to it.

Figure 4A:
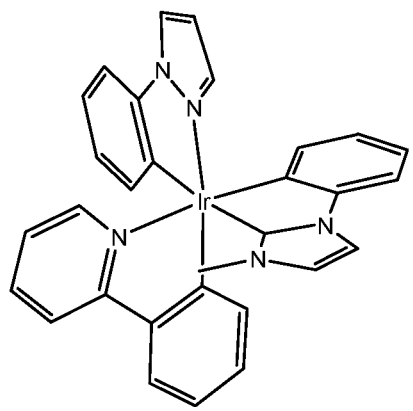
FIGS. 4A-4D depict structures with chiral centers.
Figure 4B:
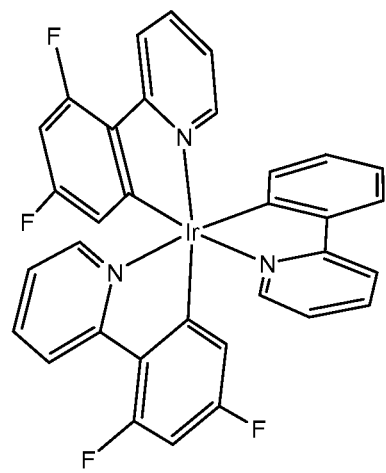
Figure 4C:
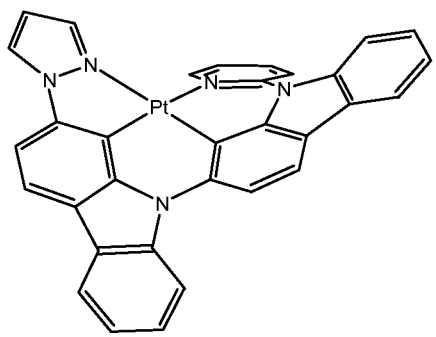
Figure 4D:
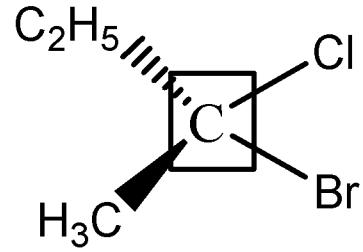
Figure 5A:
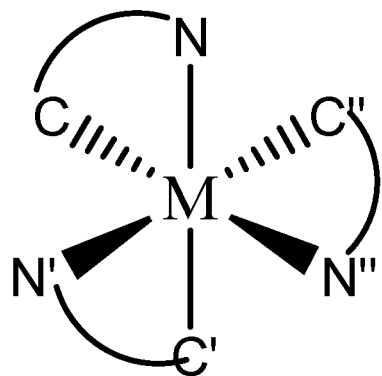
FIGS. 5A-5D depict general schemes for chiral metal complex based emitters.
Figure 5B:
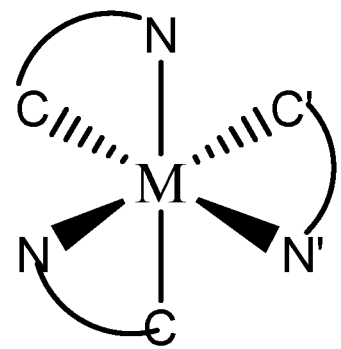
Figure 5C:
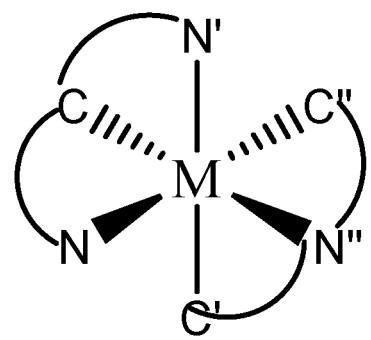
Figure 5D:
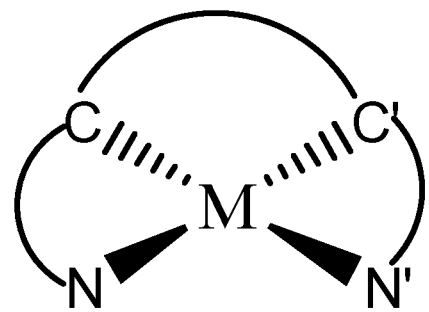

General schemes of chiral metal complex emitters are depicted in presented in FIGS. 4A-D. In FIGS. 4A and 4B, the iridium is a chiral center. In FIG. 4C, the platinum is a chiral center. In FIG. 4D, the carbon is a chiral center. FIGS. 4A-4C depict three classes of chiral metal complexes. FIG. 4A depicts an octahedral metal complex with three different cyclometalating ligands (e.g., Ir(CN)(C'N')(C"N")). FIG. 4B depicts an octahedral metal complex with two different cyclometalating ligands (i.e., Ir(CN)$_2$(C'N')). FIG. 4C depicts a non-planar asymmetric tetrahedral metal complex.

FIGS. 5A-5D depict general schemes for chiral metal complex based emitters, where at least one of M or other functional group such as C, C', C", N, N', and N" includes one or more chiral centers.

Figure 6A:
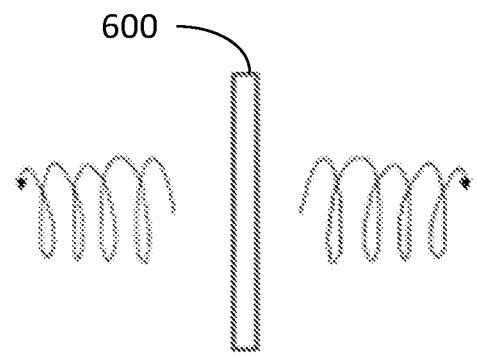
FIG. 6A depicts a transparent OLED with selected circularly polarized emission.
Figure 6B:
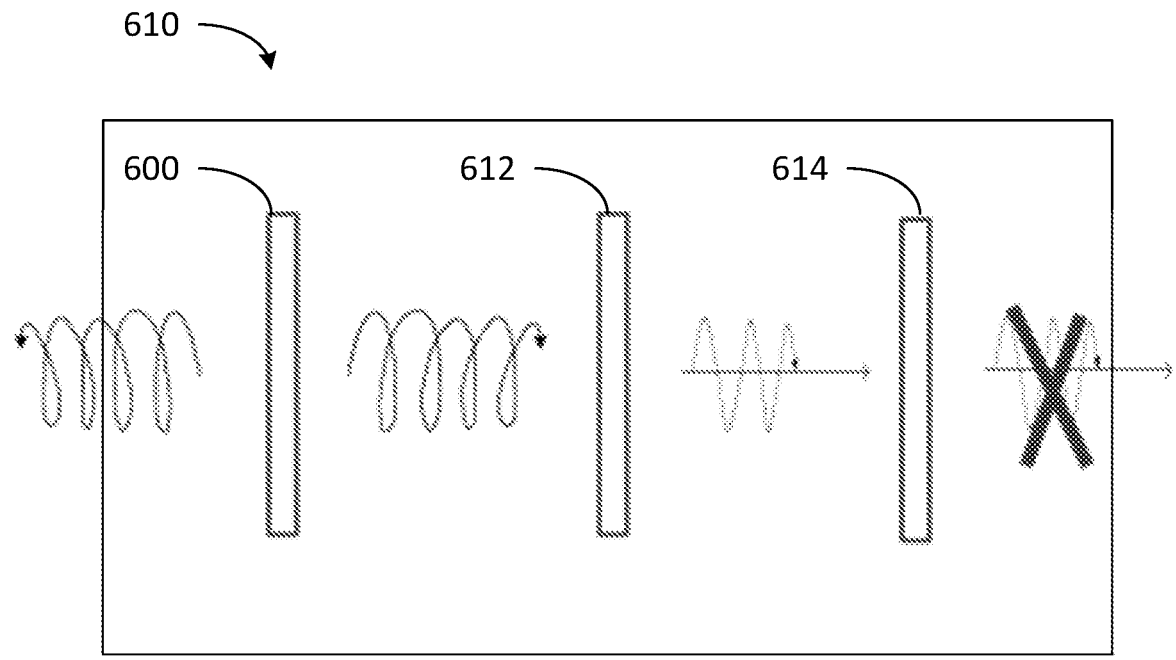
FIG. 6B depicts a transparent OLED with selected circularly polarized emission with polarizers on one side.
Figure 7:
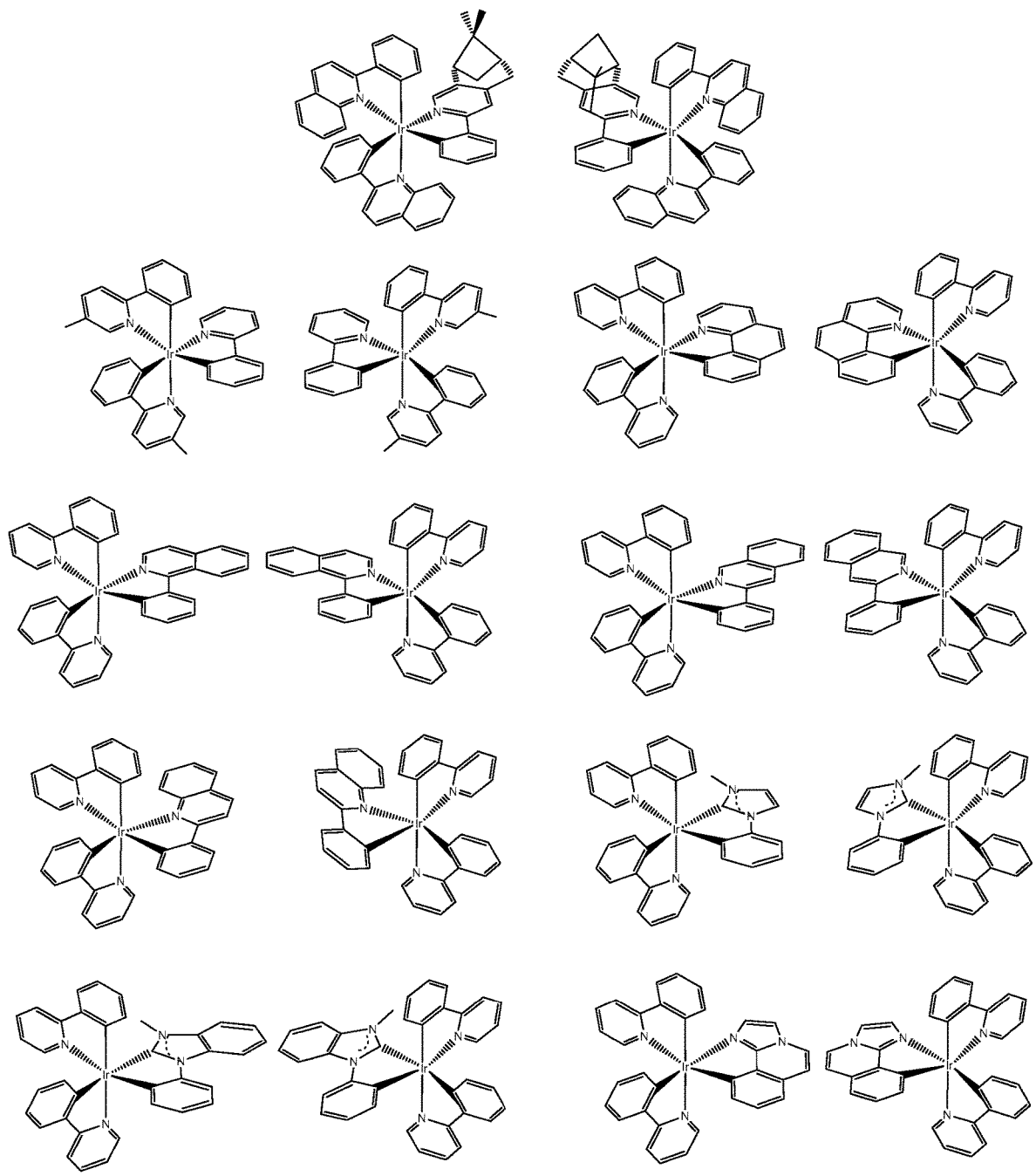
FIGS. 7-16 show chemical structures of selected iridium chiral octahedral complexes.
Figure 8:
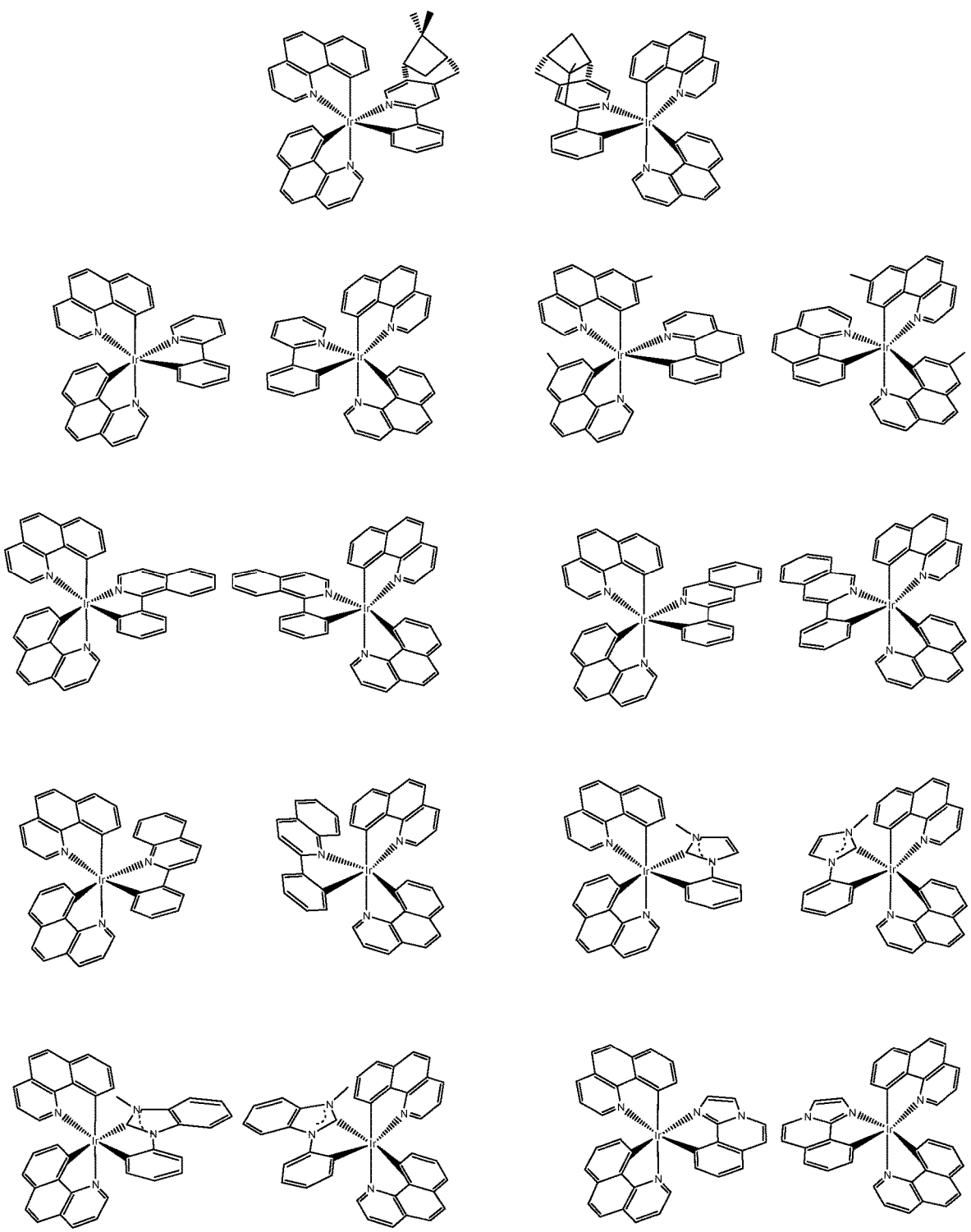
Figure 9:
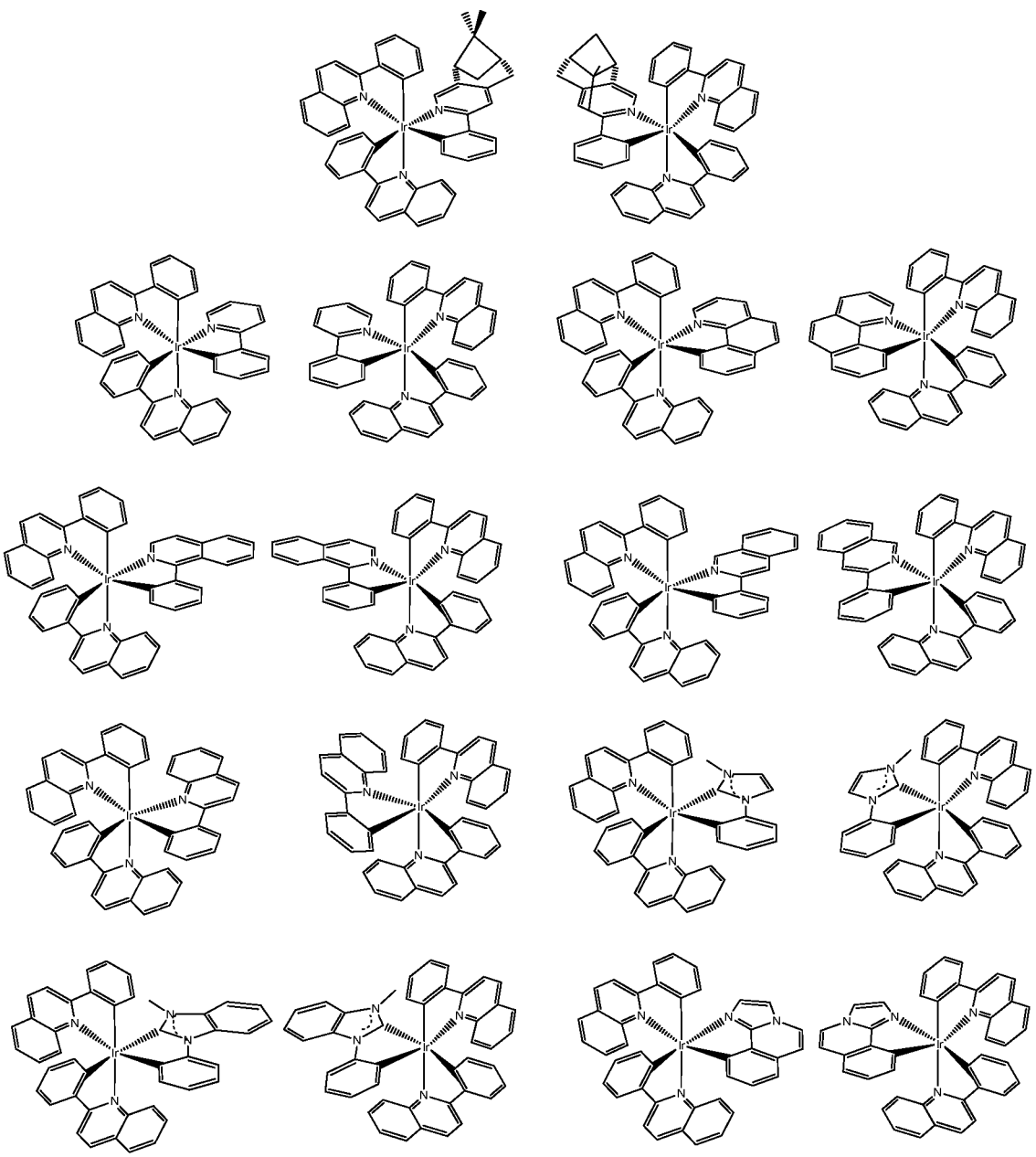
Figure 10:
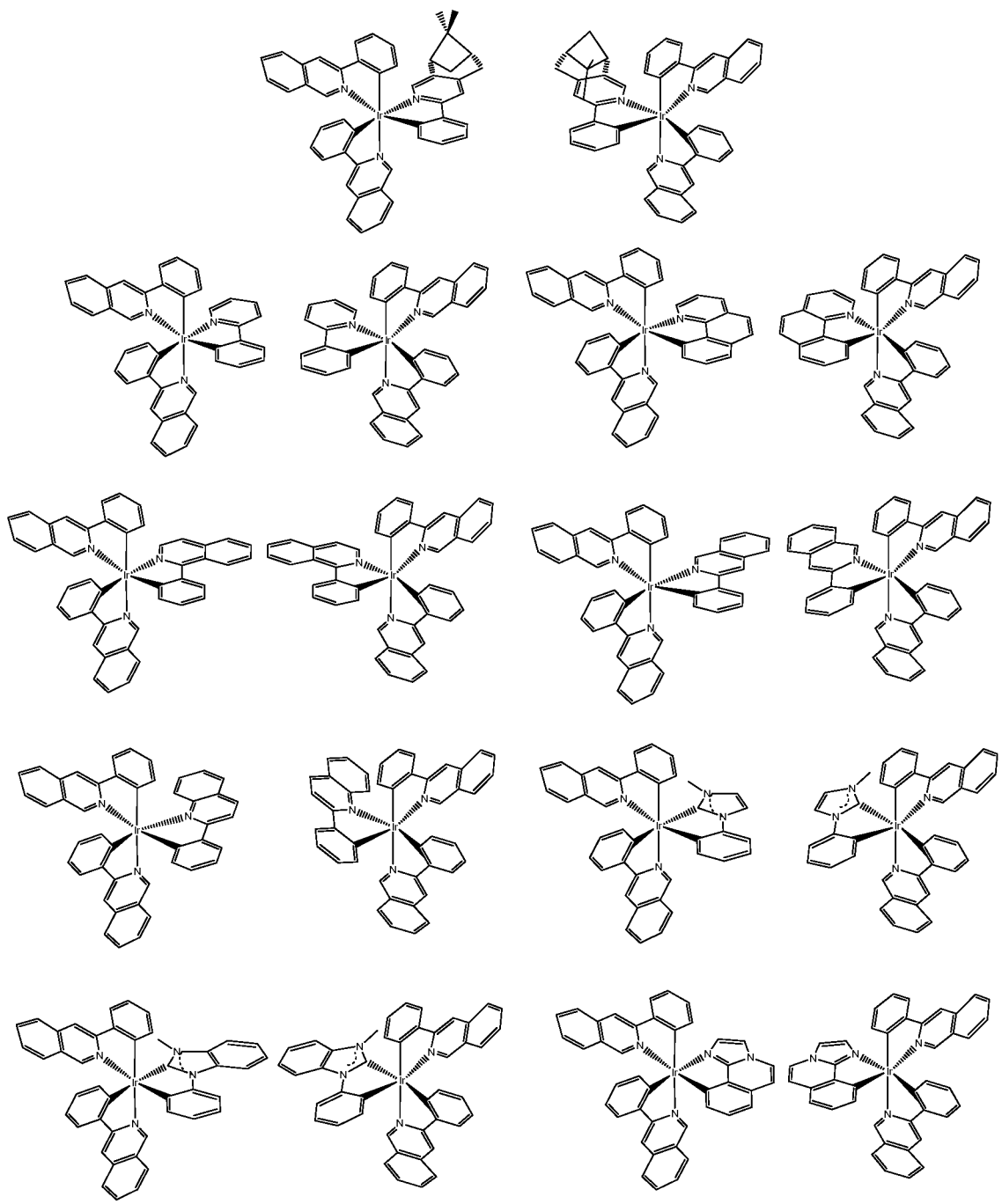
Figure 11:
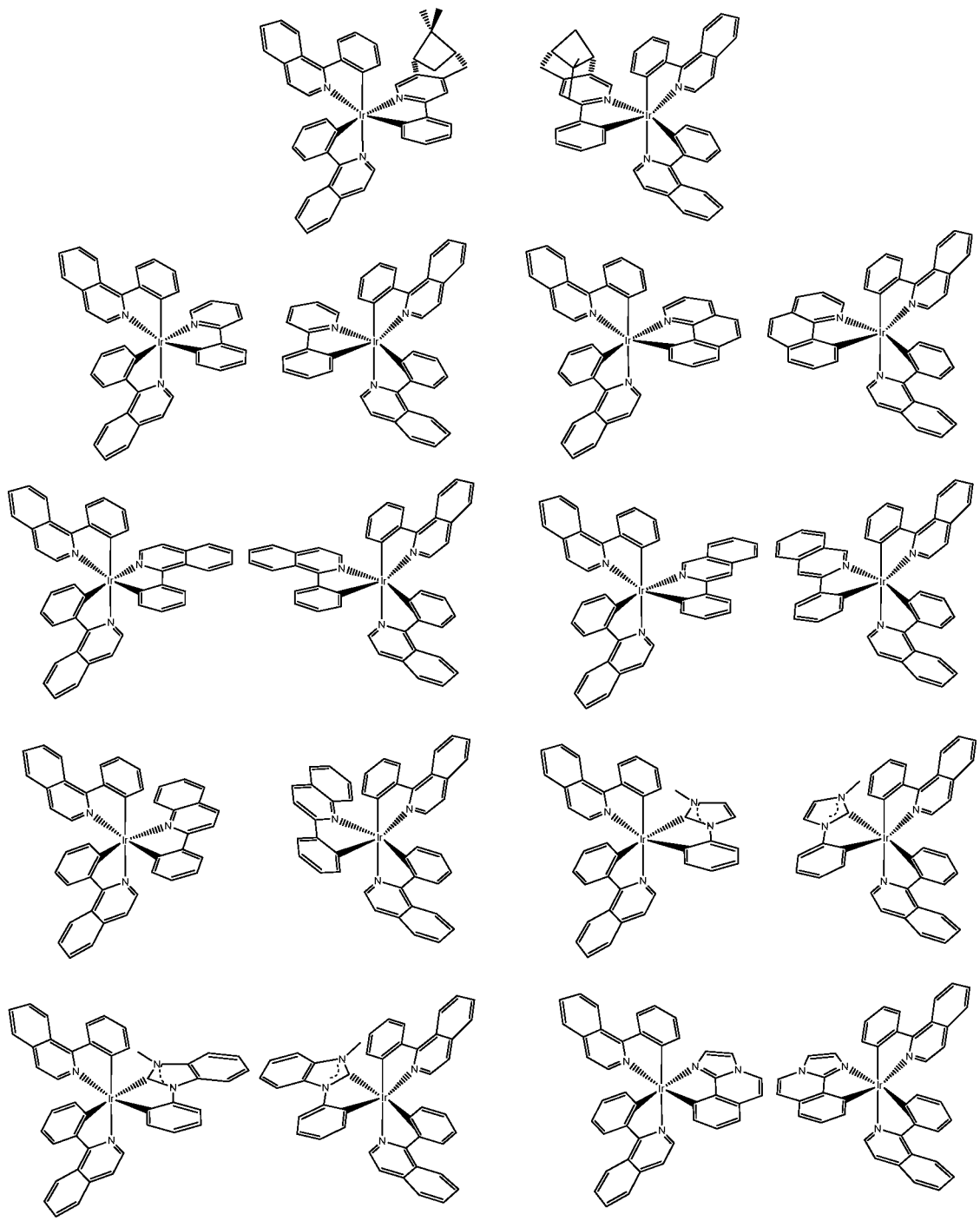
Figure 12:
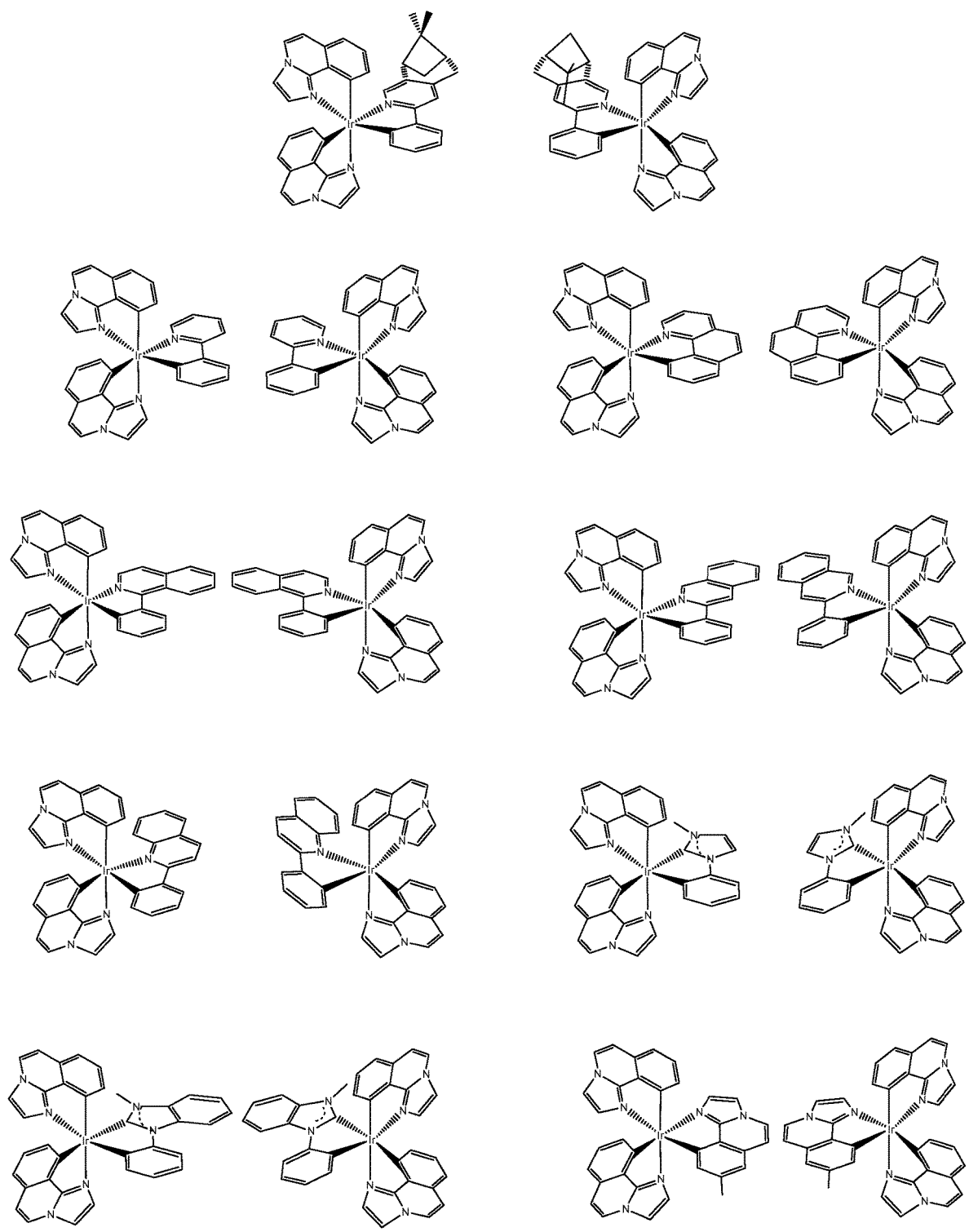
Figure 13:
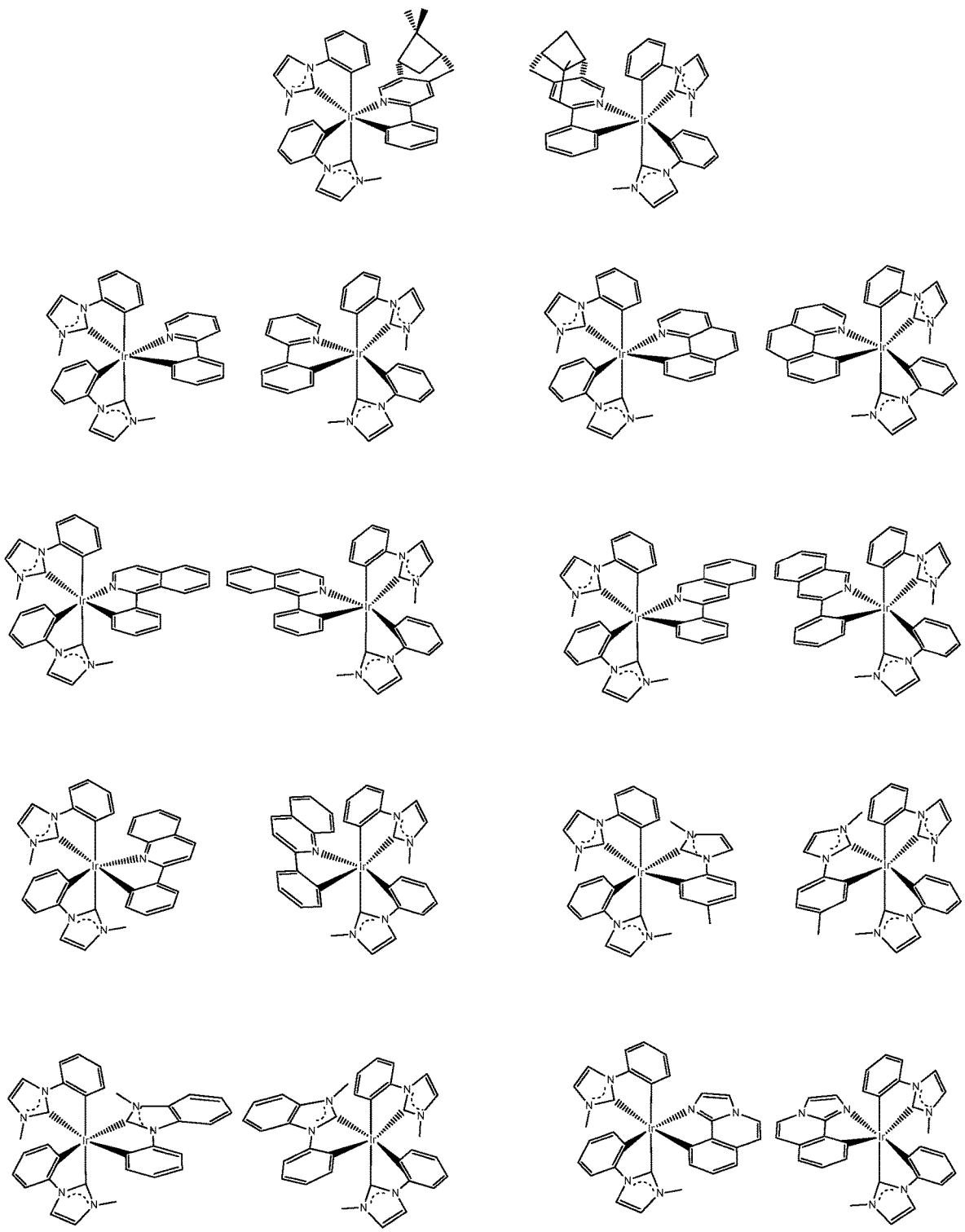
Figure 14:
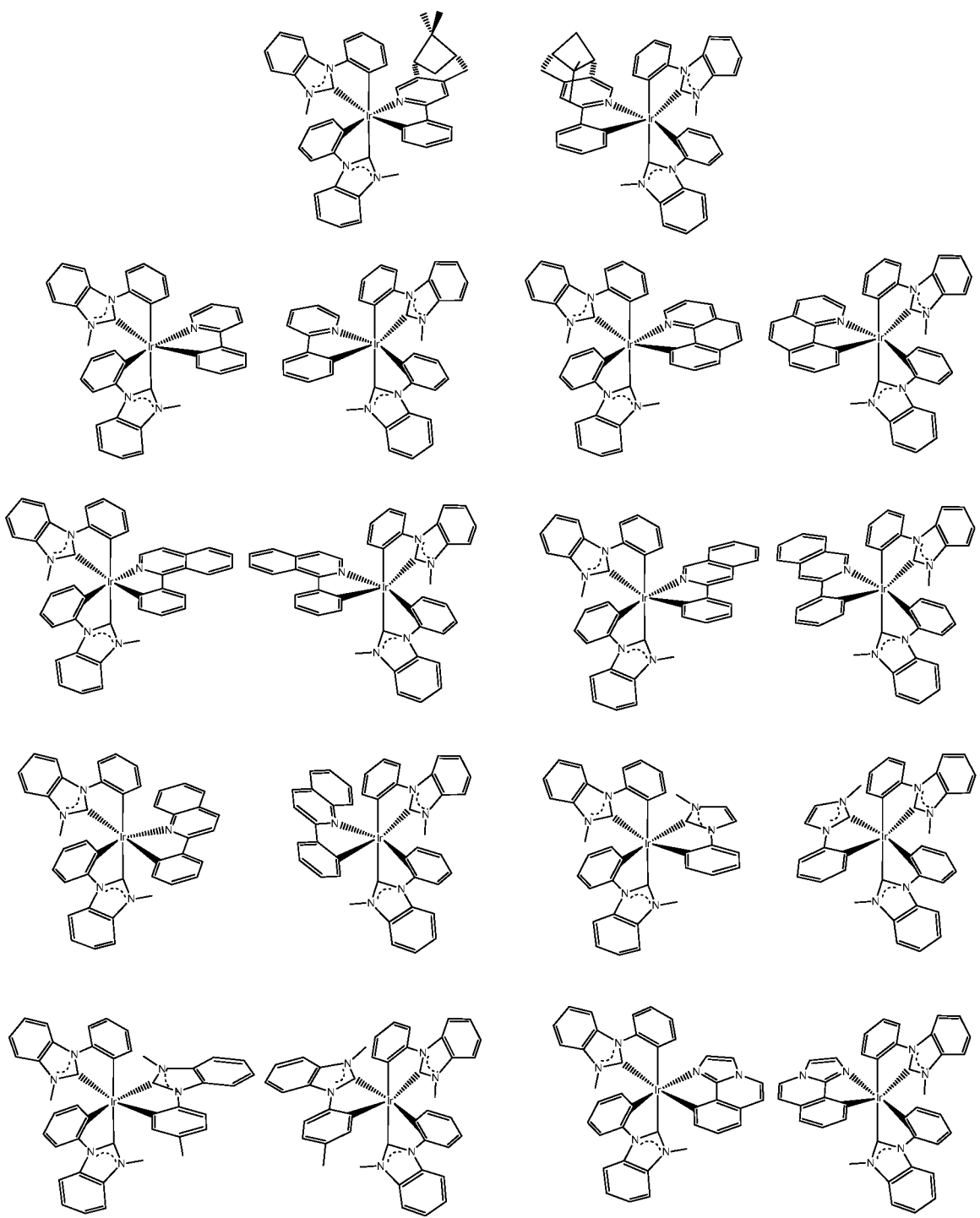
Figure 15:
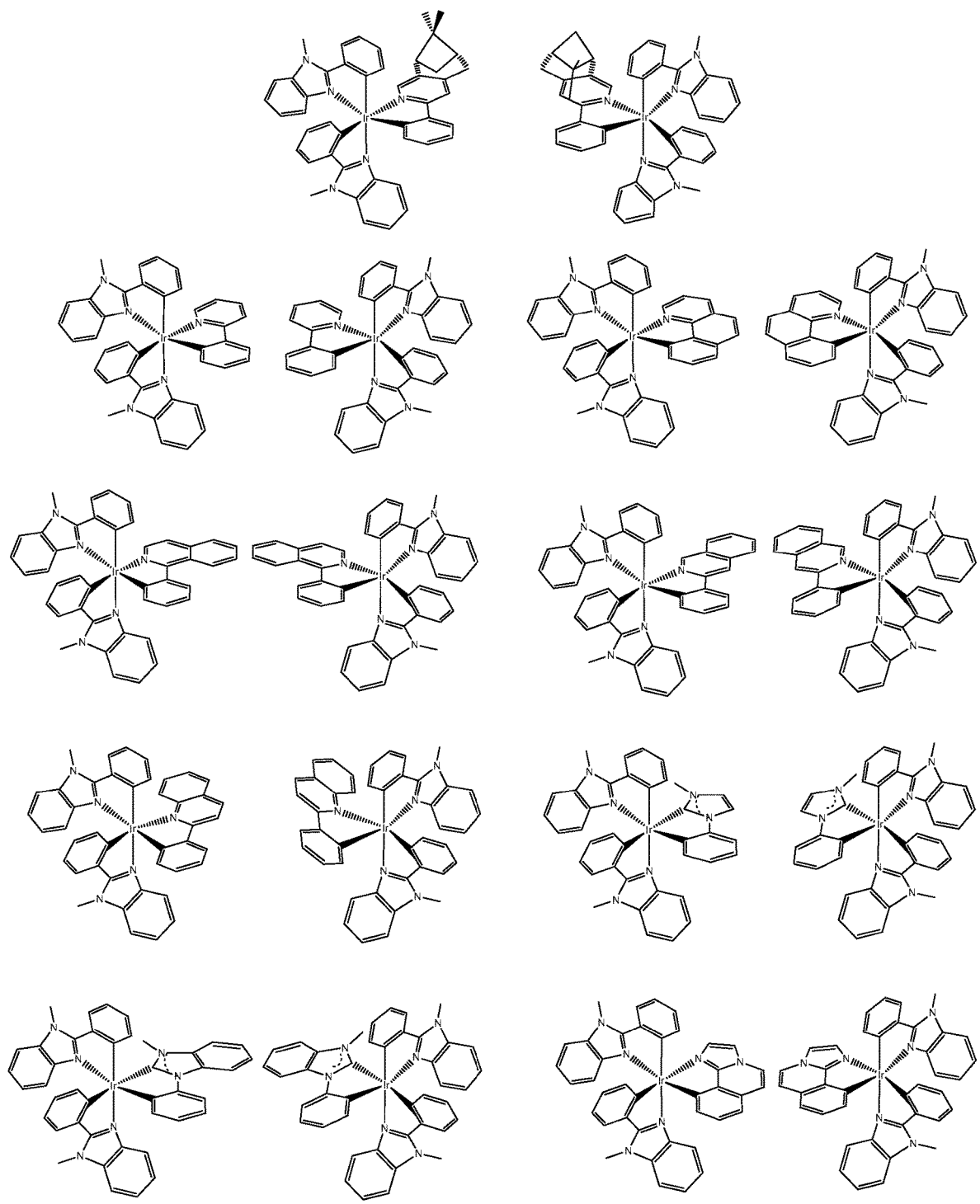
Figure 16:
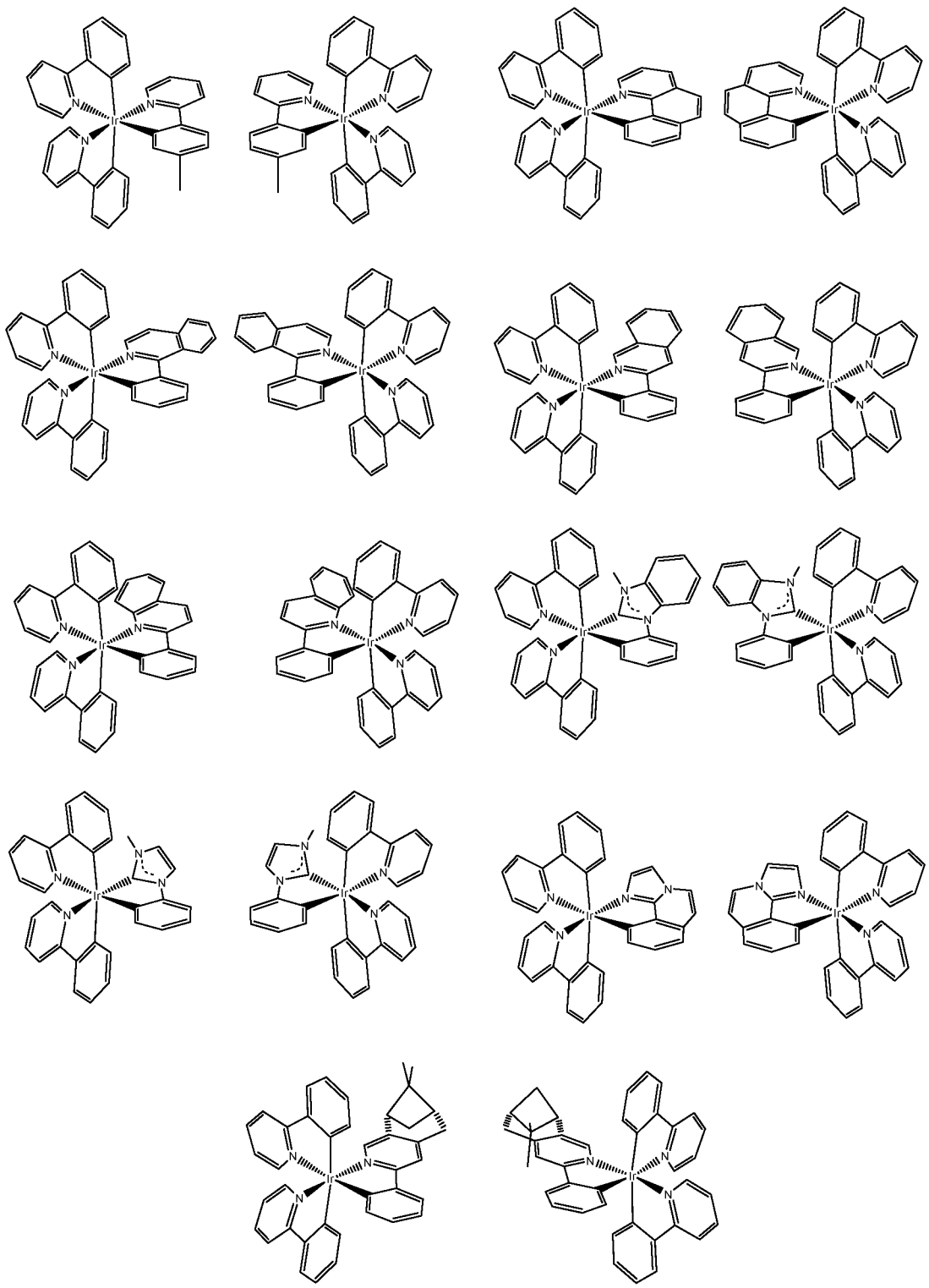

FIGS. 6A and 6B provide an illustration of a transparent OLED with selected circularly polarized emission without (FIG. 6A) and with (FIG. 6B) with a polarizer on one side.

As depicted in FIG. 6A, transparent OLED 600 produces the selected circularly polarized emission observable from both sides of the OLED. FIG. 6B depicts light emitting device 610. Light emitting device 610 includes transparent OLED 600 and quarter-wave plate 612. In some cases, light emitting device 610 includes linear polarizer 614. As depicted in FIG. 6B, the exclusively circularly polarized light from OLED 600 is converted to the exclusively linearly polarized light after passing through quarter-wave plate 612. The resulting linearly polarized light may be filtered by linear polarizer 614.

Quarter-wave plate 612 may include a quarter-wave film including a thin anisotropic film, whose refractive index in one direction is higher than that of the other, perpendicular axis. Generally, the difference of refractive index is in the range of 0.1-0.2, but may vary based on material. For a film whose refractive index difference between the x and y axes is 0.2 and has a thickness of 0.7 m, applied to quarter-wave film, the retardation is 140 nm (0.2×700 nm), which is suitable for a quarter-wave film for 560 nm wavelength light. Typically, a commercialized OLED panel uses a quarter-wave film having a retardation around 140 nm, which will also include 100 m of protective layer, such as cellulose triacetate film (TAC), applied to the both sides of the quarter-wave film.

Linear polarizer 614 may belong to one of two general categories: absorptive polarizers, where the unwanted polarization states are absorbed by the device, and beam-splitting polarizers, where the unpolarized beam is split into two beams with opposite polarization state. One type of absorptive polarizer is made of elongated silver nanoparticles embedded in thin (≤0.5 mm) glass plates. These polarizers are durable, and typically polarize light better than plastic Polaroid film, achieving polarization ratios as high as 100,000:1 and absorption of correctly polarized light as low as 1.5%. Beam-splitting polarizers split the incident beam into two beams of differing linear polarization. For an ideal polarizing beamsplitter, these would be fully polarized, with orthogonal polarizations. For many common beam-splitting polarizers, however, only one of the two output beams is fully polarized. The other contains a mixture of polarization states. For one-sided transparent display application, absorptive polarizers are typically a more cost-effective choice.

The chiral metal complexes described herein may be used in transparent electroluminescent devices to achieve controlled one-side emissive displays.

A first class of chiral complex emitters has a structure represented by General Formula IA:

wherein:
M represents $Pt^{2+}$, $Pd^{2+}$, $Ir^+$, $Rh^+$, or $Au^{3+}$;
each $R^1$ and $R^2$ in $(R^1)_2$ and $(R^2)_2$ independently represents hydrogen, halogen, hydroxyl, nitro, thiol, or substituted or unsubstituted: $C_1$-$C_4$ alkyl or amino;
$Y^{1a}$ represents O; S; $NR^{3a}$, wherein $R^{3a}$ represents substituted or unsubstituted $C_1$-$C_4$ alkyl; $Si(R^{3b})_2$, wherein each $R^{3b}$ in $(R^{3b})_2$ independently represents substituted or unsubstituted $C_1$-$C_4$ alkyl; or $C(R^{3c})_2$, wherein each $R^{3c}$ in $(R^{3c})_2$ independently represents hydrogen or substituted or unsubstituted $C_1$-$C_4$ alkyl;
$Y^{1b}$ is present or absent, and if present, represents a covalent bond or O; S; $NR^{4a}$, wherein $R^{4a}$ represents substituted or unsubstituted $C_1$-$C_4$ alkyl; $Si(R^{4b})_2$, wherein each $R^{4b}$ in $(R^{4b})_2$ independently represents substituted or unsubstituted $C_1$-$C_4$ alkyl; or $C(R^{4c})_2$, wherein each $R^{4c}$ in $(R^{4c})_2$ independently represents hydrogen or substituted or unsubstituted $C_1$-$C_4$ alkyl;
each of $Y^{2a}$, $Y^{2b}$, $Y^{2c}$, and $Y^{2d}$, valency permitting, independently represents N, $NR^{6a}$, or $CR^{6b}$, wherein each of $R^{6a}$ and $R^{6b}$ independently represents hydrogen, halogen, hydroxyl, nitro, thiol, or substituted or unsubstituted: $C_1$-$C_4$ alkyl or amino;
each of $Y^{3a}$, $Y^{3b}$, $Y^{3c}$, $Y^{3d}$, $Y^{3e}$, $Y^{4a}$, $Y^{4b}$, $Y^{4c}$, $Y^{4d}$, and $Y^{4e}$, valency permitting, independently represents N; O; S; $NR^{7a}$ or $CR^{7b}$, wherein each of $R^{7a}$ and $R^{7b}$ independently represents hydrogen or substituted or unsubstituted $C_1$-$C_4$ alkyl; or $Z(R^{7c})_2$, wherein Z is C or Si, and each $R^{7c}$ in $(R^{7c})_2$ independently represents hydrogen or substituted or unsubstituted $C_1$-$C_4$ alkyl;
l is 1 or 2;
m is 1 or 2;
n is 1 or 2;
the open dotted circle indicates partial or full unsaturation of the ring with which it is associated; and
at least one of M, $R^1$, $R^2$, $Y^{1a}$, $Y^{1b}$, $Y^{2a}$, $Y^{2b}$, $Y^{2c}$, $Y^{2d}$, $Y^{3a}$, $Y^{3b}$, $Y^{3c}$, $Y^{3c}$, $Y^{3d}$, $Y^{3e}$, $Y^{4a}$, $Y^{4b}$, $Y^{4c}$, $Y^{4d}$, $Y^{4e}$ is a chiral center.

Implementations of General Formula IA may include one or more of the following bonding arrangements in which two of $R^1$, $R^2$, $Y^{1a}$, $Y^{1b}$, $Y^{2a}$, $Y^{2b}$, $Y^{2c}$, $Y^{2d}$, $Y^{3a}$, $Y^{3b}$, $Y^{3c}$, $Y^{3d}$, $Y^{3e}$, $Y^{4a}$, $Y^{4b}$, $Y^{4c}$, $Y^{4d}$, $Y^{4e}$ and $Y^{4e}$ with the proper valency form a substituted or unsubstituted: carbocyclyl, aryl, heterocyclyl, or heteroaryl. In some examples, two adjacent $R^1$; two adjacent $R^2$; $R^1$ or $R^2$ together with an adjacent $R^{3a}$ or $R^{3b}$; $R^1$ or $R^2$ together with an adjacent $R^{6a}$ or $R^{6b}$; two adjacent $Y^{3c}$, $Y^{3d}$, and $Y^{3e}$; two adjacent $Y^{4c}$, $Y^{4d}$, and $Y^{4e}$; $Y^{2a}$ and $Y^{3d}$; or $Y^{2d}$ and $Y^{4d}$ form a substituted or unsubstituted: carbocyclyl, aryl, heterocyclyl, or heteroaryl.

A second class of chiral complex emitters has a structure represented by General Formula IB:

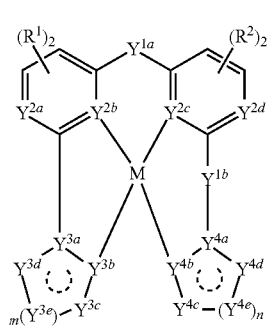

General Formula IA

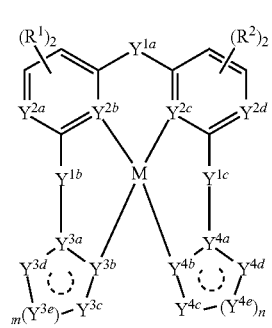

General Formula IB wherein:

M represents $Pt^{2+}$, $Pd^{2+}$, $Ir^+$, $Rh^+$, or $Au^{3+}$;

each $R^1$ and $R^2$ in $(R^1)_2$ and $(R^2)_2$ independently represents hydrogen, halogen, hydroxyl, nitro, thiol, or substituted or unsubstituted: $C_1$-$C_4$ alkyl or amino;

$Y^{1a}$ represents O; S; $NR^{3a}$, wherein $R^{3a}$ represents substituted or unsubstituted $C_1$-$C_4$ alkyl; $Si(R^{3b})_2$, wherein each $R^{3b}$ in $(R^{3b})_2$ independently represents substituted or unsubstituted $C_1$-$C_4$ alkyl; or $C(R^{3c})_2$, wherein each $R^{3c}$ in $(R^{3c})_2$ independently represents hydrogen or substituted or unsubstituted $C_1$-$C_4$ alkyl;

$Y^{1b}$ is present or absent, and if present, represents a covalent bond or O; S; $NR^{4a}$, wherein $R^{4a}$ represents substituted or unsubstituted $C_1$-$C_4$ alkyl; $Si(R^{4b})_2$, wherein each $R^{4b}$ in $(R^{4b})_2$ independently represents substituted or unsubstituted $C_1$-$C_4$ alkyl; or $C(R^{4c})_2$, wherein each $R^{4c}$ in $(R^{4c})_2$ independently represents hydrogen or substituted or unsubstituted $C_1$-$C_4$ alkyl;

$Y^{1c}$ represents O; S; $NR^{5a}$, wherein $R^{5a}$ represents substituted or unsubstituted $C_1$-$C_4$ alkyl; $Si(R^{5b})_2$, wherein each $R^{5b}$ in $(R^{5b})_2$ independently represents substituted or unsubstituted $C_1$-$C_4$ alkyl; or $C(R^{5c})_2$, wherein each $R^{5c}$ in $(R^{5c})_2$ independently represents hydrogen or substituted or unsubstituted $C_1$-$C_4$ alkyl;

each of $Y^{2a}$, $Y^{2b}$, $Y^{2c}$, and $Y^{2d}$, valency permitting, independently represents N, $NR^{6a}$, or $CR^{6b}$, wherein each of $R^{6a}$ and $R^{6b}$ independently represents hydrogen, halogen, hydroxyl, nitro, thiol, or substituted or unsubstituted: $C_1$-$C_4$ alkyl or amino;

each of $Y^{3a}$, $Y^{3b}$, $Y^{3c}$, $Y^{3d}$, $Y^{3e}$, $Y^{4a}$, $Y^{4b}$, $Y^{4c}$, $Y^{4d}$, and $Y^{4e}$, valency permitting, independently represents N; O; S; $NR^{7a}$ or $CR^{7b}$, wherein each of $R^{7a}$ and $R^{7b}$ independently represents hydrogen or substituted or unsubstituted $C_1$-$C_4$ alkyl; or $Z(R^{7c})_2$, wherein Z is C or Si, and each $R^{7c}$ in $(R^{7c})_2$ independently represents hydrogen or substituted or unsubstituted $C_1$-$C_4$ alkyl;

m is 1 or 2;

n is 1 or 2;

the open dotted circle ⟨⋯⟩ indicates partial or full unsaturation of the ring with which it is associated; and at least one of M, $R^1$, $R^2$, $Y^{1a}$, $Y^{1b}$, $Y^{1c}$, $Y^{2a}$, $Y^{2b}$, $Y^{2c}$, $Y^{2d}$, $Y^{3a}$, $Y^{3b}$, $Y^{3c}$, $Y^{3d}$, $Y^{3e}$, $Y^{4a}$, $Y^{4b}$, $Y^{4c}$, $Y^{4d}$, and $Y^{4e}$ is a chiral center.

Implementations of General Formula IB may include one or more of the following bonding arrangements in which two of $R^1$, $R^2$, $Y^{1a}$, $Y^{1b}$, $Y^{2a}$, $Y^{2b}$, $Y^{2c}$, $Y^{2d}$, $Y^{3a}$, $Y^{3b}$, $Y^{3c}$, $Y^{3d}$, $Y^{3e}$, $Y^{4a}$, $Y^{4b}$, $Y^{4c}$, $Y^{4d}$, and $Y^{4e}$ with the proper valency form a substituted or unsubstituted: carbocyclyl, aryl, heterocyclyl, or heteroaryl. In some examples, two adjacent $R^1$; two adjacent $R^2$; $R^1$ or $R^2$ together with an adjacent $R^{3a}$ or $R^{3b}$; $R^1$ or $R^2$ together with an adjacent $R^{6a}$ or $R^{6b}$; two adjacent $Y^{3c}$, $Y^{3d}$, and $Y^{3e}$; two adjacent $Y^{4c}$, $Y^{4d}$, and $Y^{4e}$; $Y^{2a}$ and $Y^{3d}$; or $Y^{2d}$ and $Y^{4d}$ form a substituted or unsubstituted: carbocyclyl, aryl, heterocyclyl, or heteroaryl.

A third class of chiral metal complex emitters is represented by General Formula IIA:

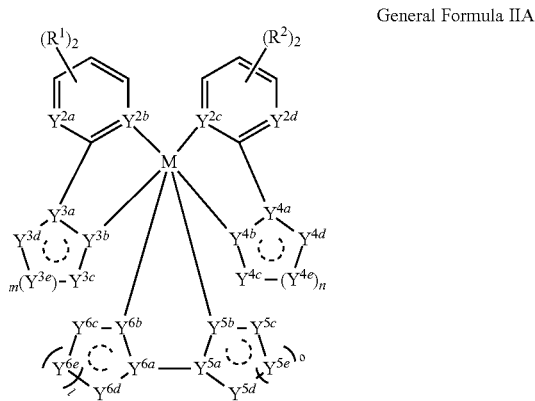

General Formula IIA wherein:

M represents $Ir^{3+}$ or $Rh^{3+}$;

each $R^1$ and $R^2$ in $(R^1)_2$ and $(R^2)_2$ independently represents hydrogen, halogen, hydroxyl, nitro, thiol, or substituted or unsubstituted: $C_1$-$C_4$ alkyl or amino;

each of $Y^{2a}$, $Y^{2b}$, $Y^{2c}$, and $Y^{2d}$, valency permitting, independently represents N, $NR^{3a}$, or $CR^{3b}$, wherein each of $R^{3a}$ and $R^{3b}$ independently represents hydrogen, halogen, hydroxyl, nitro, thiol, or substituted or unsubstituted: $C_1$-$C_4$ alkyl or amino;

each of $Y^{3a}$, $Y^{3b}$, $Y^{3c}$, $Y^{3d}$, $Y^{3e}$, $Y^{4a}$, $Y^{4b}$, $Y^{4c}$, $Y^{4d}$, and $Y^{4e}$, valency permitting, independently represents N; O; S; $NR^{4a}$ or $CR^{4b}$, wherein each of $R^{4a}$ and $R^{4b}$ independently represents hydrogen or substituted or unsubstituted $C_1$-$C_4$ alkyl; or $Z(R^{4c})_2$, wherein Z is C or Si, and each $R^{4c}$ in $(R^{4c})_2$ independently represents hydrogen or substituted or unsubstituted $C_1$-$C_4$ alkyl;

each of $Y^{5a}$, $Y^{5b}$, $Y^{5c}$, $Y^{5d}$, $Y^{5e}$, $Y^{6a}$, $Y^{6b}$, $Y^{6c}$, $Y^{6d}$, and $Y^{6e}$, valency permitting, independently represents N, O, S, $NR^{6a}$ or $CR^{6b}$, wherein each of $R^{6a}$ and $R^{6b}$ independently represents hydrogen or substituted or unsubstituted $C_1$-$C_4$ alkyl;

l is 1 or 2;

m is 1 or 2;

n is 1 or 2;

is 1 or 2;

the open dotted circle ⟨⋯⟩ indicates partial or full unsaturation of the ring with which it is associated; and at least one of M, $R^1$, $R^2$, $Y^{2a}$, $Y^{2b}$, $Y^{2c}$, $Y^{2d}$, $Y^{3a}$, $Y^{3b}$, $Y^{3c}$, $Y^{3d}$, $Y^{3e}$, $Y^{4a}$, $Y^{4b}$, $Y^{4c}$, $Y^{4c}$, $Y^{4d}$, $Y^{4e}$, $Y^{5a}$, $Y^{5b}$, $Y^{5c}$, $Y^{5d}$, $Y^{5e}$, $Y^{6a}$, $Y^{6b}$, $Y^{6c}$, $Y^{6d}$, and $Y^{6e}$ is a chiral center.

In some examples, $Y^{2b}$ and $Y^{2c}$ represent N. In other examples, each of $Y^{2a}$ and $Y^{2d}$ independently represents $NR^{3a}$ or $CR^{3b}$. In some cases, one of $Y^{2a}$ and $Y^{2b}$ is $NR^{3a}$ and the other is $CR^{3b}$.

In some examples, each of $Y^{3a}$, $Y^{3b}$, $Y^{3c}$, $Y^{3d}$, $Y^{3e}$, $Y^{4a}$, $Y^{4b}$, $Y^{4c}$, $Y^{4d}$, and $Y^{4e}$ independently represents N, O, S, $NR^{4a}$, or $CR^{4b}$. In certain examples, each of $Y^{3a}$, $Y^{3b}$, $Y^{3c}$ $Y^{3d}$, $Y^{3e}$, $Y^{4a}$, $Y^{4b}$, $Y^{4c}$, $Y^{4d}$, and $Y^{4e}$ independently represents N, $NR^{4a}$, or $CR^{4b}$.

In some embodiments, each of $Y^{5a}$, $Y^{5b}$, $Y^{5c}$, $Y^{5d}$, $Y^{5e}$, $Y^{6a}$, $Y^{6b}$, $Y^{6c}$, $Y^{6d}$, and $Y^{6e}$ independently represents N, O, $NR^{6a}$, or $CR^{6b}$. In some embodiments, each of $Y^{5a}$, $Y^{5b}$, $Y^{5c}$ $Y^{5d}$, $Y^{5e}$, $Y^{6a}$, $Y^{6b}$, $Y^{6c}$, $Y^{6d}$, and $Y^{6e}$ independently represents N, $NR^{6a}$, or $CR^{6}$b.

Implementations of General Formula IIA may include one or more of the following bonding arrangements in which two of $R^1$, $R^2$, $Y^{3a}$, $Y^{3b}$, $Y^{2a}$, $Y^{2d}$, $Y^{3c}$, $Y^{3d}$, $Y^{3e}$, $Y^{4c}$, $Y^{4d}$, $Y^{4e}$, $Y^{5c}$, $Y^{5d}$, $Y^{5e}$ and $Y^{6d}$ form a substituted or unsubstituted: carbocyclyl, aryl, heterocyclyl, or heteroaryl. In some examples, two adjacent $R^1$; two adjacent $R^2$; $R^1$ or $R^2$ together with an adjacent $R^{3a}$ or $R^{3b}$; two adjacent $Y^{3c}$, $Y^{3d}$, and $Y^{3e}$; two adjacent $Y^{4c}$, $Y^{4d}$, and $Y^{4e}$; two adjacent $Y^{5c}$, $Y^{5d}$, $Y^{5e}$; $Y^{2a}$ and $Y^{3d}$; $Y^{2d}$ and $Y^{4d}$; or $Y^{6d}$ and $Y^{5d}$ form a substituted or unsubstituted: carbocyclyl, aryl, heterocyclyl, or heteroaryl.

In some examples, $Y^{2b}$ and $Y^{2c}$ represent N. In other examples, each of $Y^{2a}$ and $Y^{2d}$ independently represents $NR^{3a}$ or $CR^{3b}$. In some cases, one of $Y^{2a}$ and $Y^{2b}$ is $NR^{3a}$ and the other is $CR^{3b}$.

In some examples, each of $Y^{3a}$, $Y^{3b}$, $Y^{3c}$, $Y^{3d}$, $Y^{3e}$, $Y^{4a}$, $Y^{4b}$, $Y^{4c}$, $Y^{4d}$, and $Y^{4e}$ independently represents N, O, S, $NR^{4a}$, or $CR^{4b}$. In some examples, each of $Y^{3a}$, $Y^{3b}$, $Y^{3c}$, $Y^{3d}$, $Y^{3e}$, $Y^{4a}$, $Y^{4b}$, $Y^{4c}$, $Y^{4d}$, and $Y^{4e}$ independently represents N, $NR^{4a}$, or $CR^{4b}$.

In some embodiments, each of $Y^{5a}$, $Y^{5b}$, $Y^{5c}$, $Y^{5d}$, $Y^{5e}$, $Y^{6a}$, $Y^{6b}$, $Y^{6c}$, $Y^{6d}$, and $Y^{6e}$ independently represents N, O, $NR^{6a}$, or $CR^{6b}$. In some embodiments, each of $Y^{5a}$, $Y^{5b}$, $Y^{5c}$, $Y^{5d}$, $Y^{5e}$, $Y^{6a}$, $Y^{6b}$, $Y^{6c}$, $Y^{6d}$, and $Y^{6e}$ independently represents N, $NR^{6a}$, or $CR^{6b}$.

FIGS. 7-16 show chemical structures of selected chiral octahedral Ir based complexes based on the third class of chiral emissive materials.

A fourth class of chiral complex emitter has a structure represented by General Formula IIB:

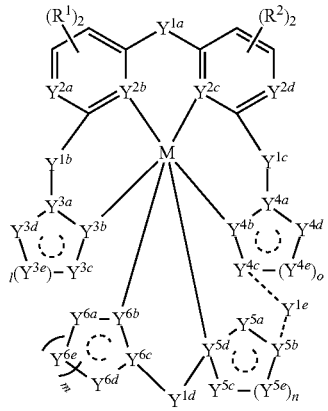

wherein:

M represents $Ir^{3+}$ or $Rh^{3+}$;

each $R^1$ and $R^2$ in $(R^1)_2$ and $(R^2)_2$ independently represents hydrogen, halogen, hydroxyl, nitro, thiol, or substituted or unsubstituted: $C_1$-$C_4$ alkyl or amino;

each of $Y^{1a}$, $Y^{1c}$, and $Y^{1d}$ independently represents O; S; $NR^{4a}$, wherein each of $R^{4b}$ in $(R^{4b})_2$ independently represents substituted or unsubstituted $C_1$-$C_4$ alkyl; or $C(R^{4c})_2$, wherein each $R^{4c}$ in $(R^{4c})_2$ independently represents hydrogen or substituted or unsubstituted $C_1$-$C_4$ alkyl;

$Y^{1b}$ is present or absent, and if present, represents a covalent bond or O; S; $NR^{4a}$, wherein $R^{5a}$ represents substituted or unsubstituted $C_1$-$C_4$ alkyl; $Si(R^{5b})_2$, wherein each $R^{5b}$ in $(R^{5b})_2$ independently represents substituted or unsubstituted $C_1$-$C_4$ alkyl; or $C(R^{5c})_2$, wherein each $R^{5c}$ in $(R^{5c})_2$ independently represents hydrogen or substituted or unsubstituted $C_1$-$C_4$ alkyl;

$Y^{1e}$ is present or absent, and if present, represents a covalent bond or O; S; $NR^{4a}$, wherein $R^{4a}$ represents substituted or unsubstituted $C_1$-$C_4$ alkyl; $Si(R^{4b})_2$, wherein each $R^{4b}$ in $(R^{4b})_2$ independently represents substituted or unsubstituted $C_1$-$C_4$ alkyl;

each of $Y^{2a}$, $Y^{2b}$, $Y^{2c}$, and $Y^{2d}$, valency permitting, independently represents N, $NR^{6a}$, or $CR^{6b}$, wherein each of $R^{6a}$ and $R^{6b}$ independently represents hydrogen, halogen, hydroxyl, nitro, thiol, or substituted or unsubstituted: $C_1$-$C_4$ alkyl or amino;

each of $Y^{3a}$, $Y^{3b}$, $Y^{3c}$, $Y^{3d}$, $Y^{3e}$, $Y^{4a}$, $Y^{4b}$, $Y^{4c}$, $Y^{4d}$, and $Y^{4e}$, valency permitting, independently represents N; O; S; $NR^{6a}$ or $CR^{6b}$, wherein each of $R^{6a}$ and $R^{6b}$ independently represents hydrogen or substituted or unsubstituted $C_1$-$C_4$ alkyl; or $Z(R^{6c})_2$, wherein Z is C or Si, and each $R^{6c}$ in $(R^{6c})_2$ independently represents hydrogen or substituted or unsubstituted $C_1$-$C_4$ alkyl;

l is 1 or 2;
m is 1 or 2;
n is 1 or 2;
is 1 or 2;

the open dotted circle indicates partial or full unsaturation of the ring with which it is associated; and at least one of M, $R^1$, $R^2$, $Y^{1a}$, $Y^{1b}$, $Y^{1c}$, $Y^{1d}$, $Y^{1e}$, $Y^{2a}$, $Y^{2b}$, $Y^{2c}$, $Y^{2d}$, $Y^{3a}$, $Y^{3b}$, $Y^{3c}$, $Y^{3d}$, $Y^{3e}$, $Y^{4a}$, $Y^{4b}$, $Y^{4c}$, $Y^{4d}$, $Y^{4e}$, $Y^{5a}$, $Y^{5b}$, $Y^{5c}$, $Y^{5d}$, $Y^{5e}$, $Y^{6a}$, $Y^{6b}$, $Y^{6c}$, $Y^{6d}$, $Y^{6e}$ is a chiral center.

Implementations of General Formula IIB may include one or more of the following bonding arrangements in which two of $R^1$, $R^2$, $Y^{1a}$, $Y^{1b}$, $Y^{1c}$, $Y^{1d}$, $Y^{1e}$, $Y^{2a}$, $Y^{2b}$, $Y^{2c}$, $Y^{2d}$, $Y^{3a}$, $Y^{3b}$, $Y^{3c}$, $Y^{3d}$, $Y^{3e}$, $Y^{4a}$, $Y^{4b}$, $Y^{4c}$, $Y^{4d}$, $Y^{4e}$, $Y^{5a}$, $Y^{5b}$, $Y^{5c}$, $Y^{5d}$, $Y^{5e}$, $Y^{6a}$, $Y^{6b}$, $Y^{6c}$, $Y^{6d}$, and $Y^{6e}$ with the proper valency form a substituted or unsubstituted: carbocyclyl, aryl, heterocyclyl, or heteroaryl. In some examples, two adjacent $R^1$; two adjacent $R^2$; $R^1$ or $R^2$ together with an adjacent $R^{4a}$ or $R^{4b}$; two adjacent $Y^{3c}$, $Y^{3d}$, and $Y^{3e}$; two adjacent $Y^{6a}$, $Y^{6d}$, and $Y^{6e}$; two adjacent $Y^{5b}$, $Y^{5c}$, and $Y^{5e}$; $Y^{4d}$, and $Y^{4e}$; $Y^{2a}$ and $Y^{3d}$; $Y^{2d}$ and $Y^{4d}$; $Y^{4e}$ and $Y^{5e}$; or $Y^{5c}$ and $Y^{6d}$ form a substituted or unsubstituted: carbocyclyl, aryl, heterocyclyl, or heteroaryl.

A number of embodiments of the invention have been described. Nevertheless, it will be understood that various modifications may be made without departing from the spirit and scope of the invention. Accordingly, other embodiments are within the scope of the following claims.

What is claimed is:

1. A light emitting device comprising:
   a transparent organic light emitting device; and
   a single optically active light-blocking element comprising:
   a linear polarizer; and
   a quarter-wave plate,
   wherein the transparent organic light emitting device comprises a chiral complex emitter that produces circularly polarized light, the quarter-wave plate converts the circularly polarized light into linearly polarized light, and the linear polarizer filters the linearly polarized light, and
   wherein the chiral complex emitter, the quarter-wave plate, and the linear polarizer are configured to allow transmission of light, generated by the transparent organic light emitting device and within the transparent organic light emitting device, through a single side of the light emitting device.

2. The light emitting device of claim 1, wherein the chiral complex emitter has a structure represented by General Formula IA:

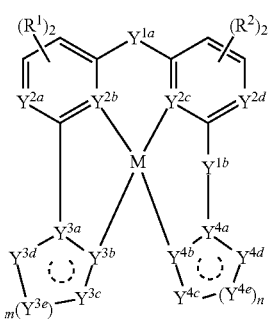

General Formula IA

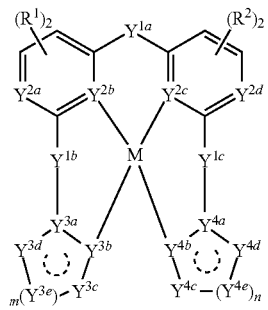

General Formula IB wherein:

M represents $Pt^{2+}$, $Pd^{2+}$, $Ir^+$, $Rh^+$, or $Au^{3+}$;

each $R^1$ and $R^2$ in $(R^1)_2$ and $(R^2)_2$ independently represents hydrogen, halogen, hydroxyl, nitro, thiol, or substituted or unsubstituted: $C_1$-$C_4$ alkyl or amino;

$Y^{1a}$ represents O; S; $NR^{3a}$, wherein $R^{3a}$ represents substituted or unsubstituted $C_1$-$C_4$ alkyl; $Si(R^{3b})_2$, wherein each $R^{3b}$ in $(R^{3b})_2$ independently represents substituted or unsubstituted $C_1$-$C_4$ alkyl; or $C(R^{3c})_2$, wherein each $R^{3c}$ in $(R^{3c})_2$ independently represents hydrogen or substituted or unsubstituted $C_1$-$C_4$ alkyl;

$Y^{1b}$ is present or absent, and if present, represents a covalent bond or O; S; $NR^{4a}$, wherein $R^{4a}$ represents substituted or unsubstituted $C_1$-$C_4$ alkyl; $Si(R^{4b})_2$, wherein each $R^{4b}$ in $(R^{4b})_2$ independently represents substituted or unsubstituted $C_1$-$C_4$ alkyl; or $C(R^{4c})_2$, wherein each $R^{4c}$ in $(R^{4c})_2$ independently represents hydrogen or substituted or unsubstituted $C_1$-$C_4$ alkyl;

each of $Y^{2a}$, $Y^{2b}$, $Y^{2c}$, and $Y^{2d}$, valency permitting, independently represents C or N or $NR^{5a}$, or $CR^{5b}$, wherein each of $R^{5a}$ and $R^{5b}$ independently represents hydrogen, halogen, hydroxyl, nitro, thiol, or substituted or unsubstituted: $C_1$-$C_4$ alkyl or amino;

each of $Y^{3a}$, $Y^{3b}$, $Y^{3c}$, $Y^{3d}$, $Y^{3e}$, $Y^{4a}$, $Y^{4b}$, $Y^{4c}$, $Y^{4d}$, and $Y^{4e}$, valency permitting, independently represents C; N; O; S; $NR^{6a}$ or $CR^{6b}$, as permitted by valency, wherein each of $R^{6a}$ and $R^{6b}$ independently represents hydrogen or substituted or unsubstituted $C_1$-$C_4$ alkyl; or $Z(R^{6c})_2$, wherein Z is C or Si, and each $R^{6c}$ in $(R^{6c})_2$ independently represents hydrogen or substituted or unsubstituted $C_1$-$C_4$ alkyl;

m is 1 or 2;

n is 1 or 2;

the open dotted circle ⟨⁻⁻⟩ indicates partial or full unsaturation of the ring with which it is associated; and at least one of M, $R^1$, $R^2$, $Y^{1a}$, $Y^{1b}$, $Y^{2a}$, $Y^{2b}$, $Y^{2c}$, $Y^{2d}$, $Y^{3a}$, $Y^{3b}$, $Y^{3c}$, $Y^{3d}$, $Y^{3e}$, $Y^{4a}$, $Y^{4b}$, $Y^{4c}$, $Y^{4d}$, $Y^{4e}$ is a chiral center.

3. The light emitting device of claim 1, wherein the chiral complex emitter has a structure represented by General Formula IB:

wherein:

M represents $Pt^{2+}$, $Pd^{2+}$, $Ir^+$, $Rh^+$, or $Au^{3+}$;

each $R^1$ and $R^2$ in $(R^1)_2$ and $(R^2)_2$ independently represents hydrogen, halogen, hydroxyl, nitro, thiol, or substituted or unsubstituted: $C_1$-$C_4$ alkyl or amino;

$Y^{1a}$ represents O; S; $NR^{3a}$, wherein $R^{3a}$ represents substituted or unsubstituted $C_1$-$C_4$ alkyl; $Si(R^{3b})_2$, wherein each $R^{3b}$ in $(R^{3b})_2$ independently represents substituted or unsubstituted $C_1$-$C_4$ alkyl; or $C(R^{3c})_2$, wherein each $R^{3c}$ in $(R^{3c})_2$ independently represents hydrogen or substituted or unsubstituted $C_1$-$C_4$ alkyl;

$Y^{1b}$ is present or absent, and if present, represents a covalent bond or O; S; $NR^{4a}$, wherein $R^{4a}$ represents substituted or unsubstituted $C_1$-$C_4$ alkyl; $Si(R^{4b})_2$, wherein each $R^{4b}$ in $(R^{4b})_2$ independently represents substituted or unsubstituted $C_1$-$C_4$ alkyl; or $C(R^{4c})_2$, wherein each $R^{4c}$ in $(R^{4c})_2$ independently represents hydrogen or substituted or unsubstituted $C_1$-$C_4$ alkyl;

$Y^{1c}$ represents O; S; $NR^{5a}$, wherein $R^{5a}$ represents substituted or unsubstituted $C_1$-$C_4$ alkyl; $Si(R^{5b})_2$, wherein each $R^{5b}$ in $(R^{5b})_2$ independently represents substituted or unsubstituted $C_1$-$C_4$ alkyl; or $C(R^{5c})_2$, wherein each $R^{5c}$ in $(R^{5c})_2$ independently represents hydrogen or substituted or unsubstituted $C_1$-$C_4$ alkyl;

each of $Y^{2a}$, $Y^{2b}$, $Y^{2c}$, and $Y^{2d}$, valency permitting, independently represents C or N or $NR^{6a}$ or $CR^{6b}$, as permitted by valency, wherein each of $R^{6a}$ and $R^{6b}$ independently represents hydrogen, halogen, hydroxyl, nitro, thiol, or substituted or unsubstituted: $C_1$-$C_4$ alkyl or amino12;

each of $Y^{3a}$, $Y^{3b}$, $Y^{3c}$, $Y^{3d}$, $Y^{3e}$, $Y^{4a}$, $Y^{4b}$, $Y^{4c}$, $Y^{4d}$, and $Y^{4e}$, valency permitting, independently represents N; O; S; $NR^{7a}$ or $CR^{7b}$, as permitted by valency, wherein each of $R^{7a}$ and $R^{7b}$ independently represents hydrogen or substituted or unsubstituted $C_1$-$C_4$ alkyl; or $Z(R^{7c})_2$, wherein Z is C or Si, and each $R^{7c}$ in $(R^{7c})_2$ independently represents hydrogen or substituted or unsubstituted $C_1$-$C_4$ alkyl;

m is 1 or 2;

n is 1 or 2;

the open dotted circle ⟨⁻⁻⟩ indicates partial or full unsaturation of the ring with which it is associated; and at least one of M, $R^1$, $R^2$, $Y^{1a}$, $Y^{1b}$, $Y^{1c}$, $Y^{2a}$, $Y^{2b}$, $Y^{2c}$, $Y^{2d}$, $Y^{3a}$, $Y^{3b}$, $Y^{3c}$, $Y^{3d}$, $Y^{3e}$, $Y^{4a}$, $Y^{4b}$, $Y^{4c}$, $Y^{4d}$, and $Y^{4e}$ is a chiral center.

4. The light emitting device of claim 1, wherein the chiral complex emitter has a structure represented by General Formula IIA:

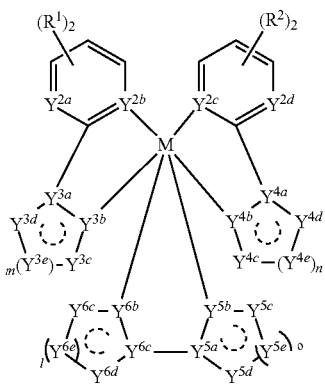

General Formula IIA wherein:
M represents $Ir^{3+}$ or $Rh^{3+}$;
each $R^1$ and $R^2$ in $(R^1)_2$ and $(R^2)_2$ independently represents hydrogen, halogen, hydroxyl, nitro, thiol, or substituted or unsubstituted: $C_1$-$C_4$ alkyl or amino;
each of $Y^{2a}$, $Y^{2b}$, $Y^{2c}$, and $Y^{2d}$, valency permitting, independently represents C or N or $NR^{3a}$, or $CR^{3b}$, as permitted by valency, wherein each of $R^{3a}$ and $R^{3b}$ independently represents hydrogen, halogen, hydroxyl, nitro, thiol, or substituted or unsubstituted: $C_1$-$C_4$ alkyl or amino;
each of $Y^{3a}$, $Y^{3b}$, $Y^{3c}$, $Y^{3d}$, $Y^{3e}$, $Y^{4a}$, $Y^{4b}$, $Y^{4c}$, $Y^{4d}$, and $Y^{4e}$, valency permitting, independently represents C; N; O; S; $NR^{4a}$ or $CR^{4b}$, as permitted by valency, wherein each of $R^{4a}$ and $R^{4b}$ independently represents hydrogen or substituted or unsubstituted $C_1$-$C_4$ alkyl; or $Z(R^{4c})_2$, wherein Z is C or Si, and each $R^{4c}$ in $(R^{4c})_2$ independently represents hydrogen or substituted or unsubstituted $C_1$-$C_4$ alkyl;
each of $Y^{5a}$, $Y^{5b}$, $Y^{5c}$, $Y^{5d}$, $Y^{5e}$, $Y^{6a}$, $Y^{6b}$, $Y^{6c}$, $Y^{6d}$, and $Y^{6e}$, valency permitting, independently represents C; N, O, S, $NR^{6a}$ or $CR^{6b}$, as permitted by valency, wherein each of $R^{6a}$ and $R^{6b}$ independently represents hydrogen or substituted or unsubstituted $C_1$-$C_4$ alkyl;
l is 1 or 2;
m is 1 or 2;
n is 1 or 2;
o is 1 or 2;
the open dotted circle indicates partial or full unsaturation of the ring with which it is associated;
at least one of M, $R^1$, $R^2$, $Y^{2a}$, $Y^{2b}$, $Y^{2c}$, $Y^{2d}$, $Y^{3a}$, $Y^{3b}$, $Y^{3c}$, $Y^{3d}$, $Y^{3e}$, $Y^{4a}$, $Y^{4b}$, $Y^{4c}$, $Y^{4c}$, $Y^{4d}$, $Y^{4e}$, $Y^{5a}$, $Y^{5b}$, $Y^{5c}$, $Y^{5d}$, $Y^{5e}$, $Y^{6a}$, $Y^{6b}$, $Y^{6c}$, $Y^{6d}$, and $Y^{6e}$ is a chiral center.

5. The light emitting device of claim 4, wherein:
two adjacent $R^1$ form a substituted or unsubstituted: carbocyclyl, aryl, heterocyclyl, or heteroaryl;
two adjacent $R^2$ form a substituted or unsubstituted: carbocyclyl, aryl, heterocyclyl, or heteroaryl;
$R^1$ or $R^2$ together with an adjacent $R^{3a}$ or $R^{3b}$ form a substituted or unsubstituted: carbocyclyl, aryl, heterocyclyl, or heteroaryl;
two adjacent $Y^{3c}$, $Y^{3d}$, $Y^{3e}$ form a substituted or unsubstituted: carbocyclyl, aryl, heterocyclyl, or heteroaryl;
two adjacent $Y^{4c}$, $Y^{4d}$, and $Y^{4e}$ form a substituted or unsubstituted: carbocyclyl, aryl, heterocyclyl, or heteroaryl;
two adjacent $Y^{5c}$, $Y^{5d}$, and $Y^{5e}$ form a substituted or unsubstituted: carbocyclyl, aryl, heterocyclyl, or heteroaryl;
$Y^{2a}$ and $Y^{3d}$ form a substituted or unsubstituted: carbocyclyl, aryl, heterocyclyl, or heteroaryl;
$Y^{2d}$ and $Y^{4d}$ form a substituted or unsubstituted: carbocyclyl, aryl, heterocyclyl, or heteroaryl; or
$Y^{6d}$ and $Y^{5d}$ form a substituted or unsubstituted: carbocyclyl, aryl, heterocyclyl, or heteroaryl.

6. The light emitting device of claim 4, wherein the chiral complex emitter has a structure selected from one of the following structures:

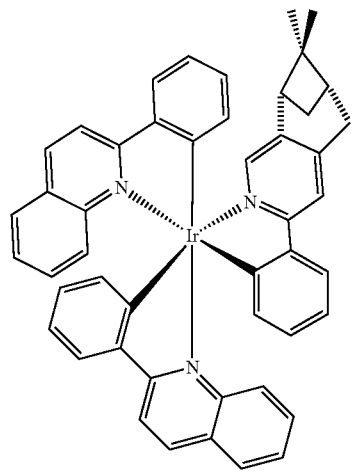

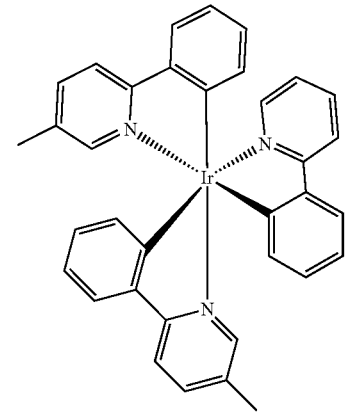

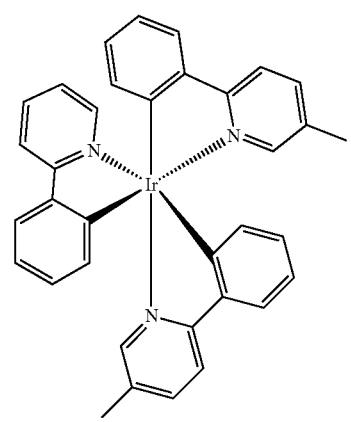

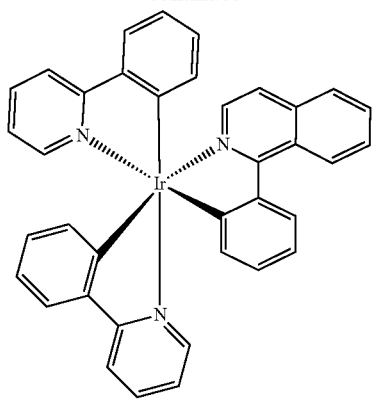
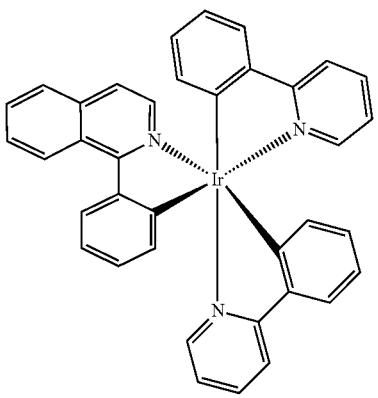
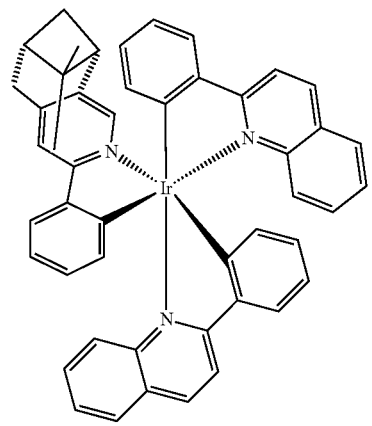
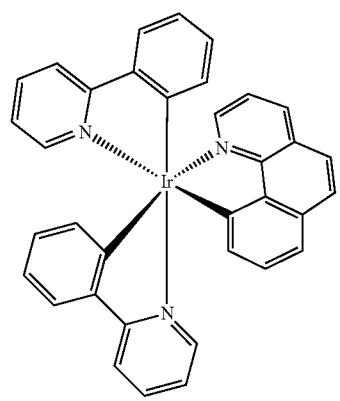
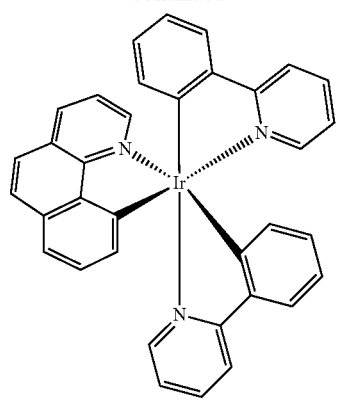
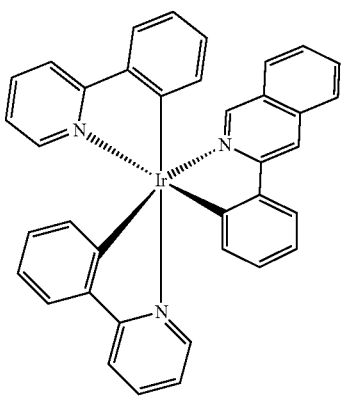
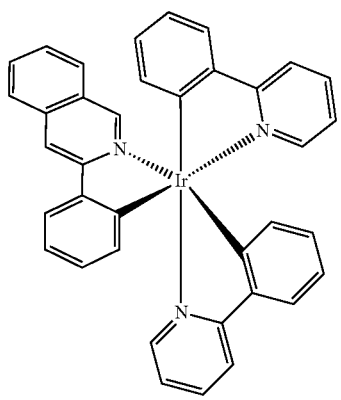
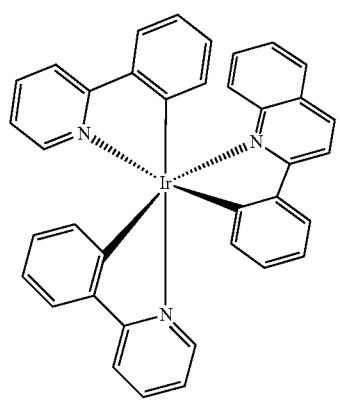

-continued
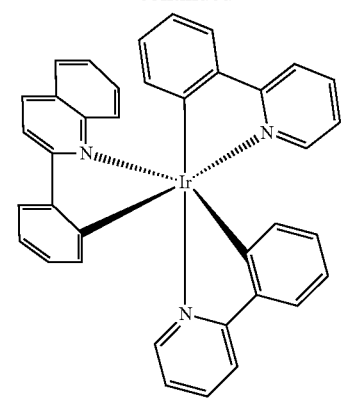
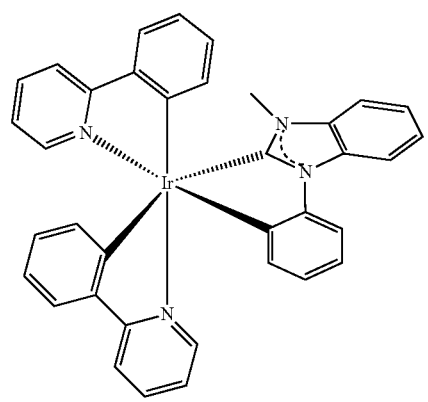
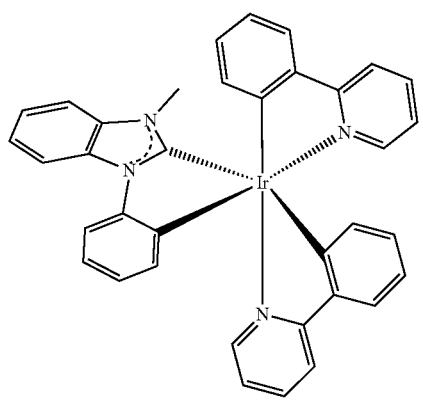
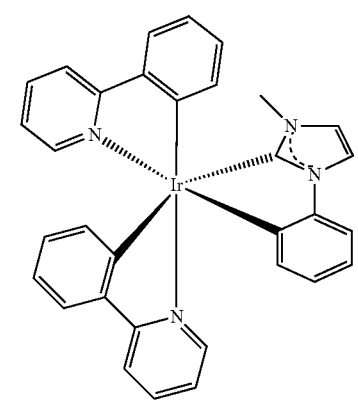
-continued
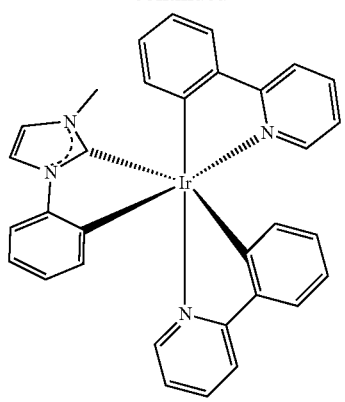
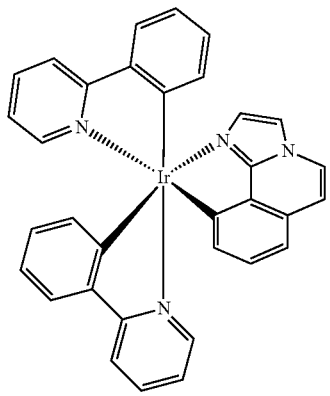
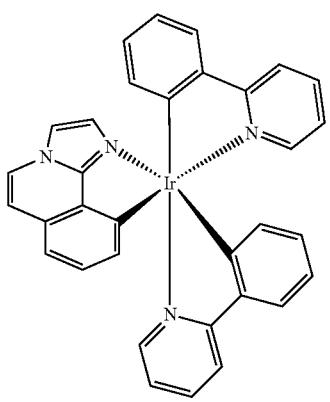
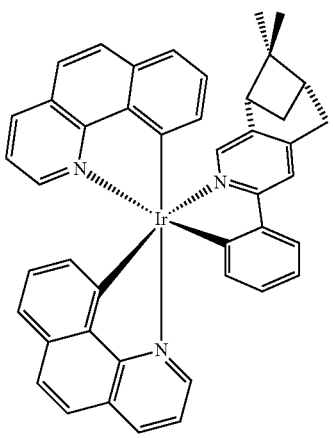

27
-continued
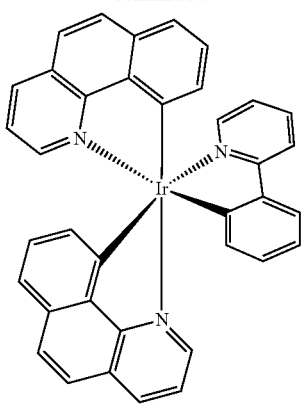
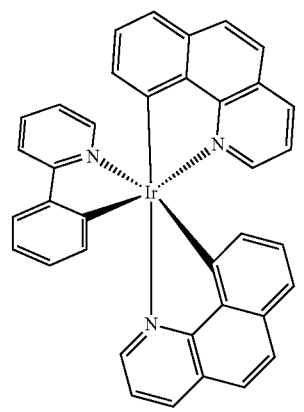
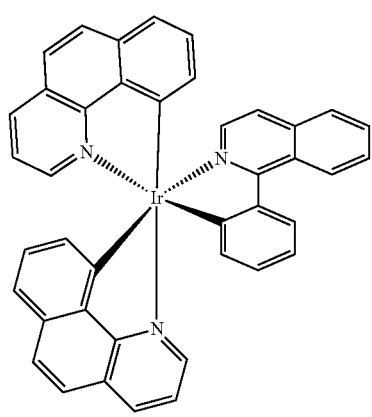
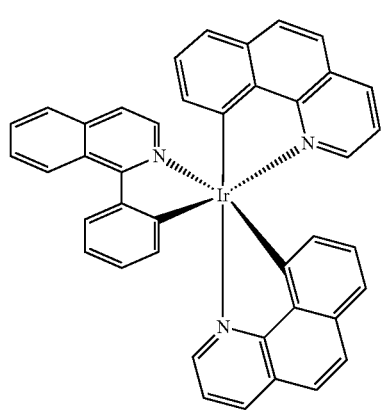
28
-continued
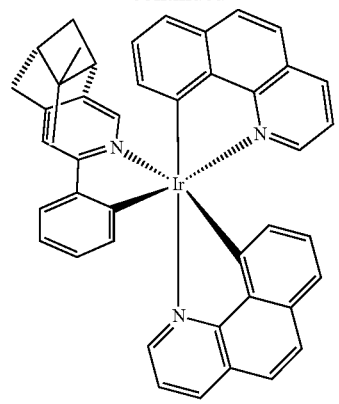
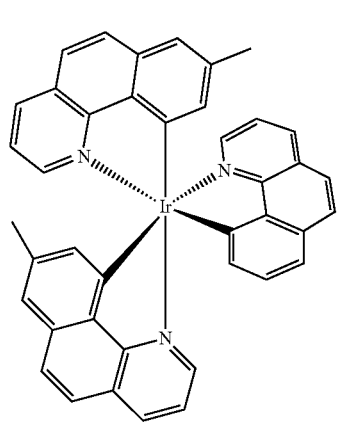
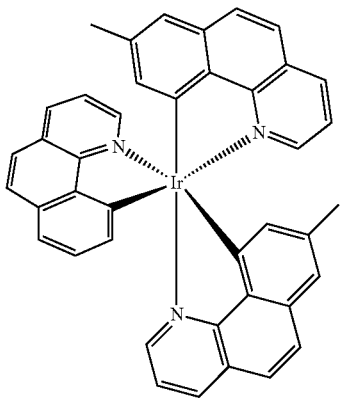
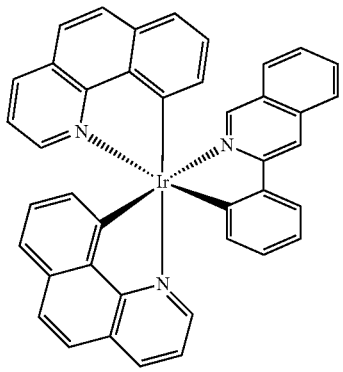

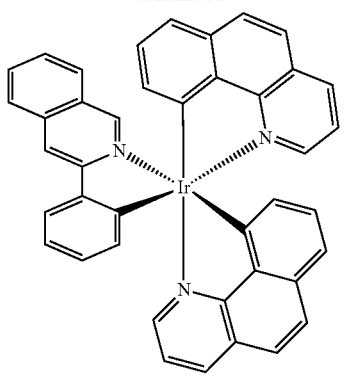
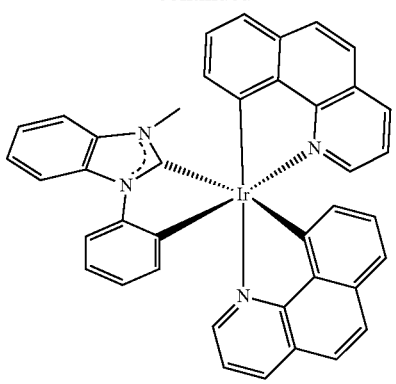
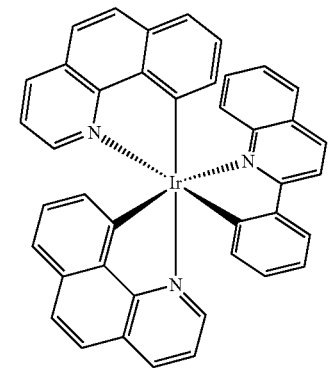
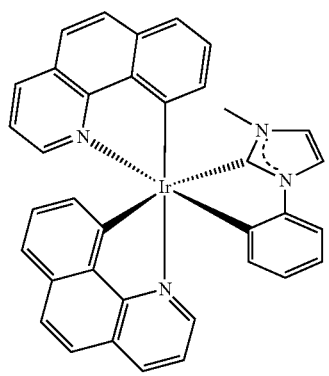
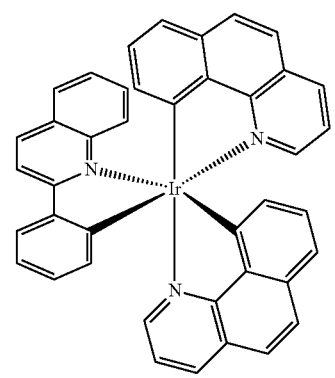
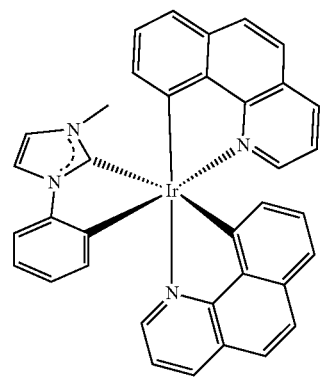
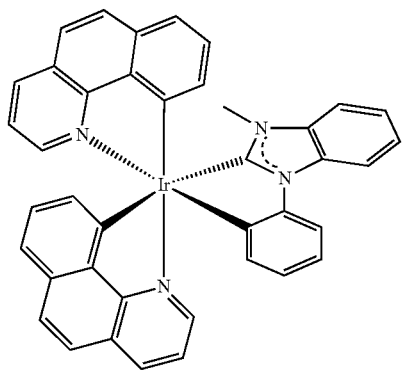
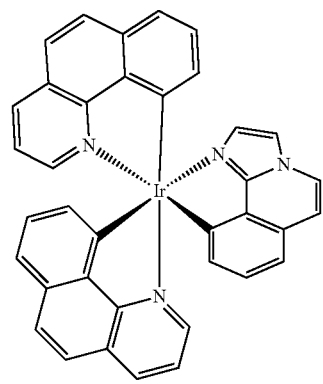

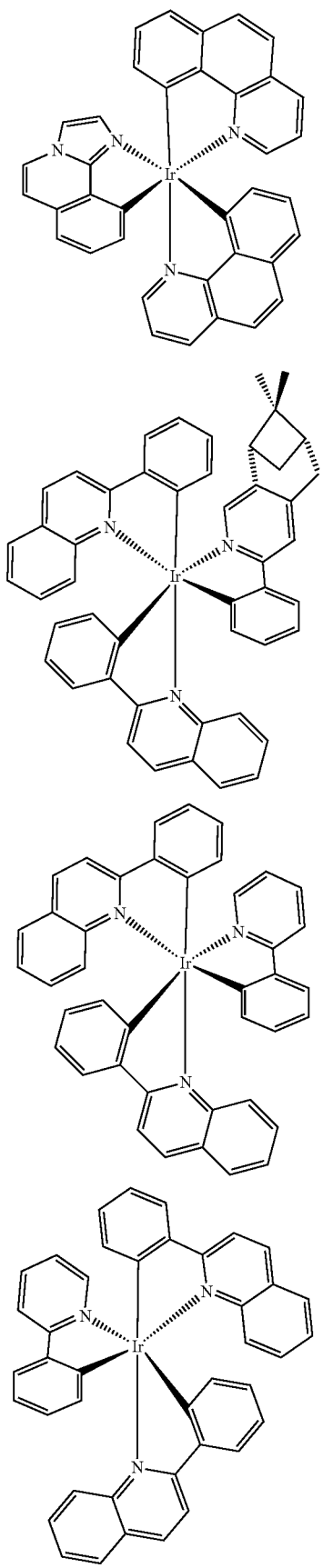
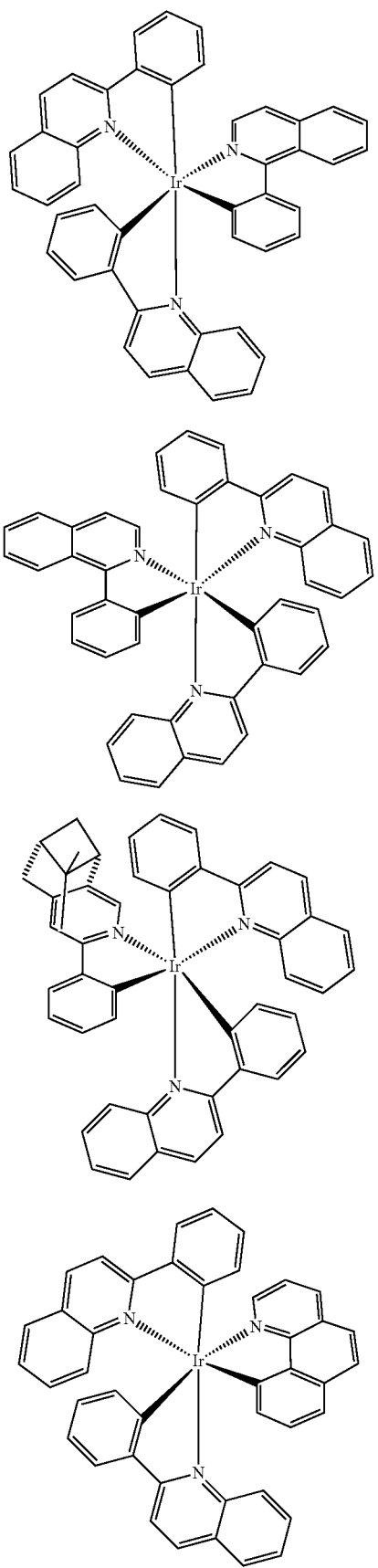

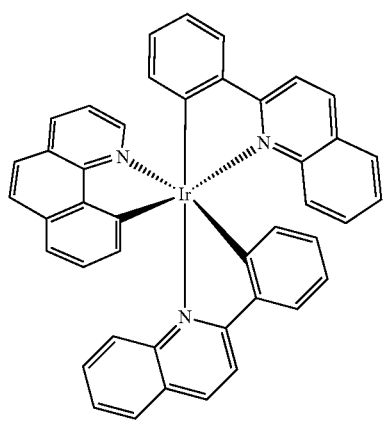
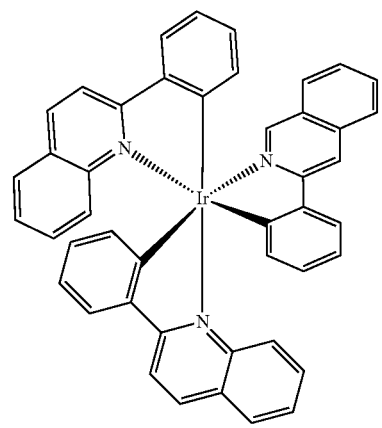
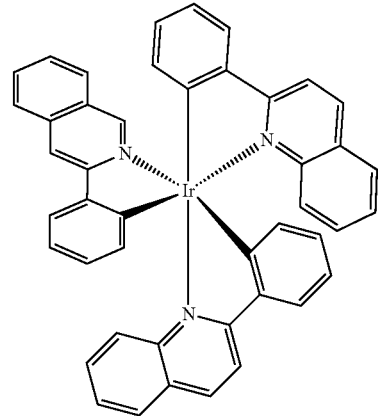
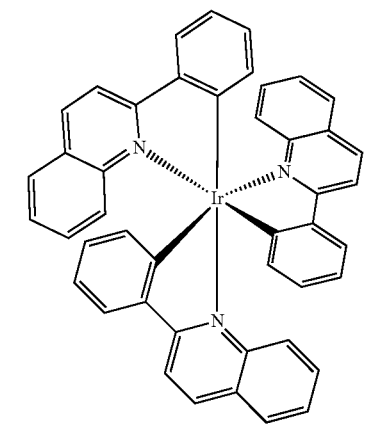
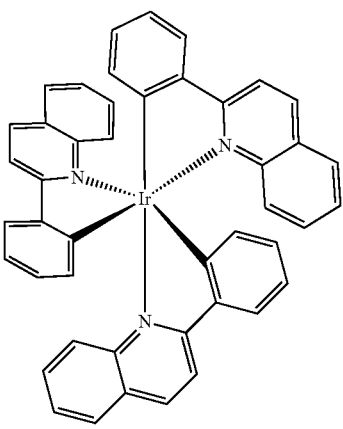
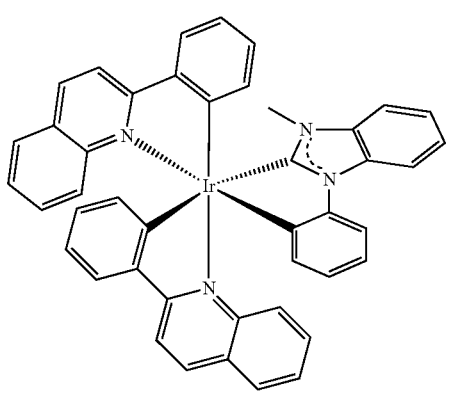
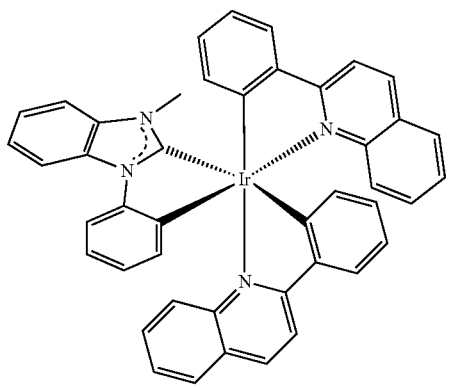
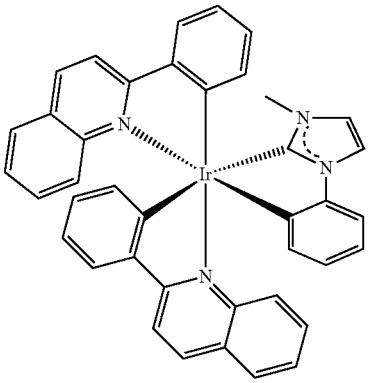

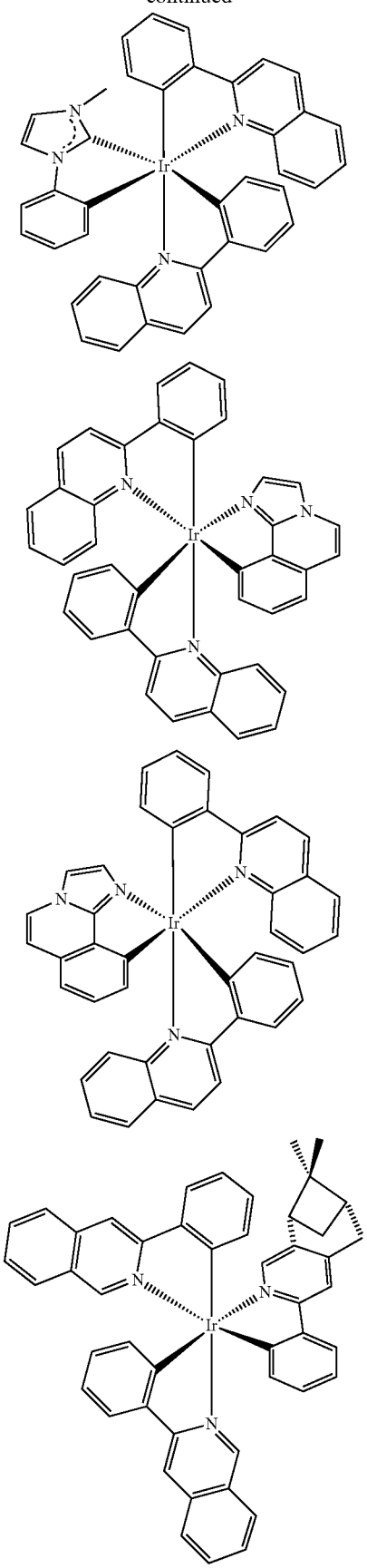
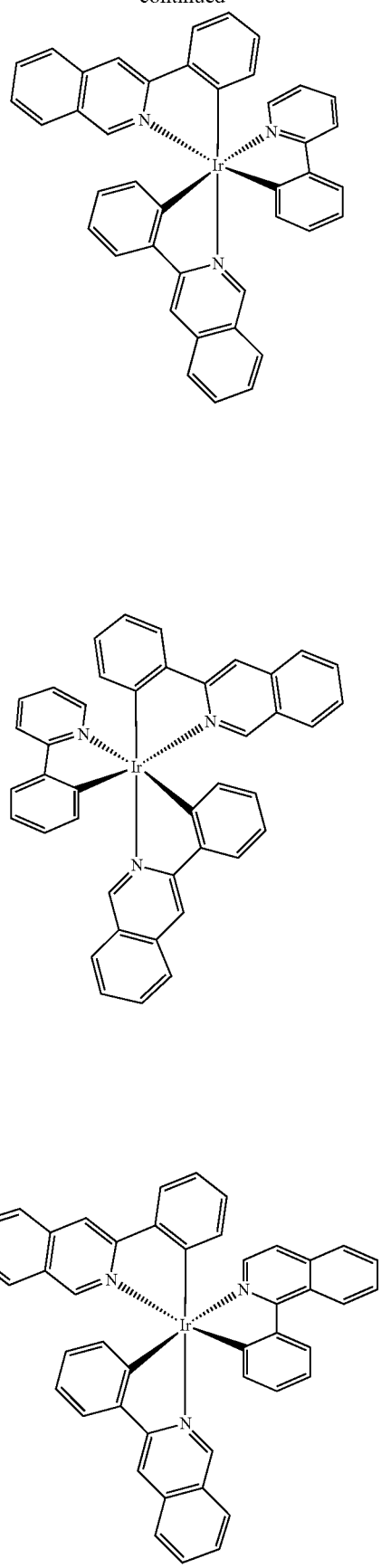

37
-continued
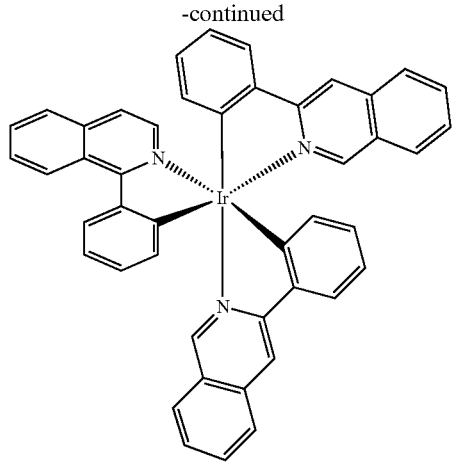
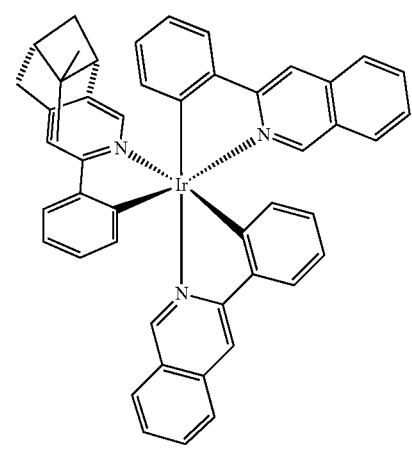
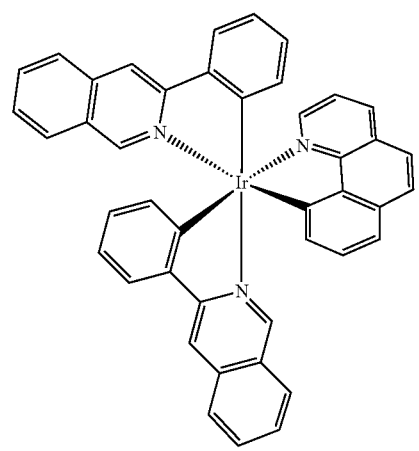
38
-continued
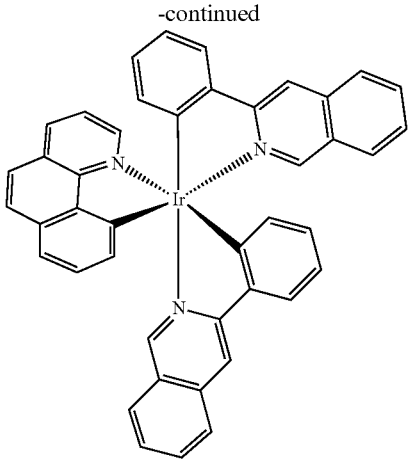
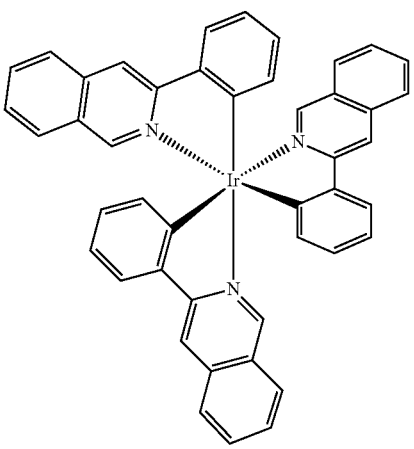
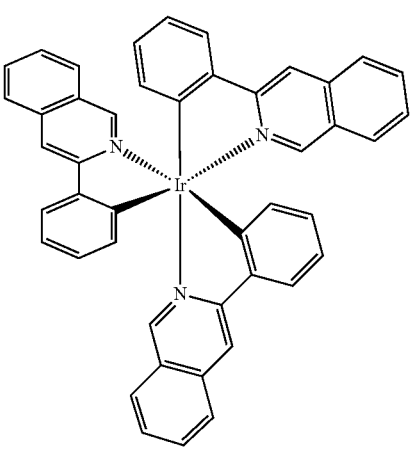

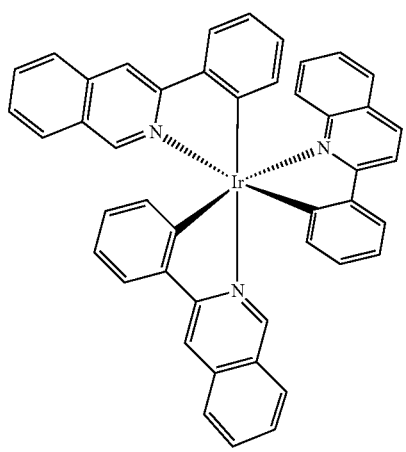
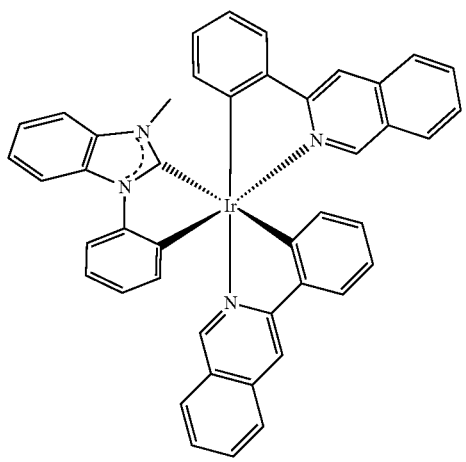
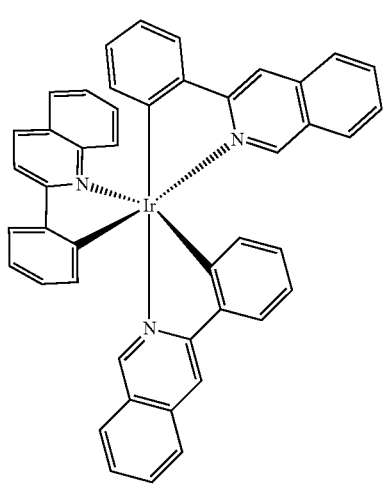
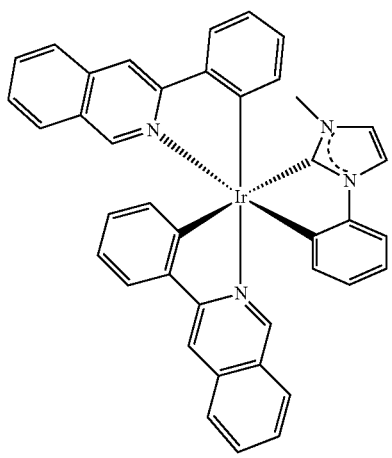
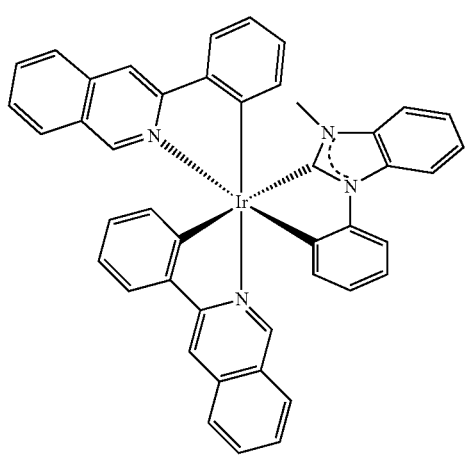
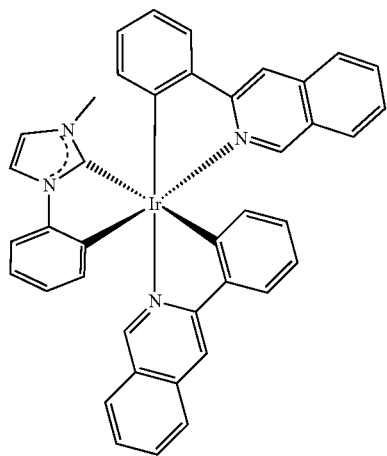

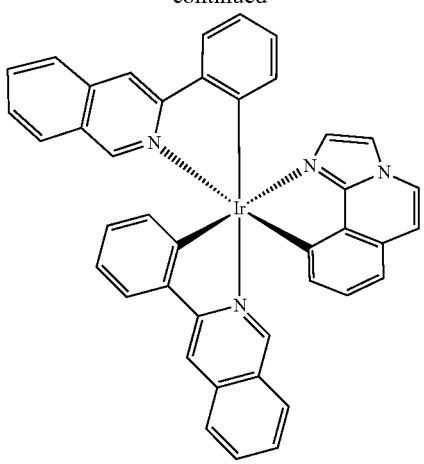
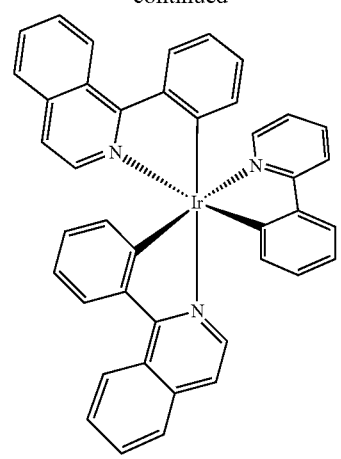
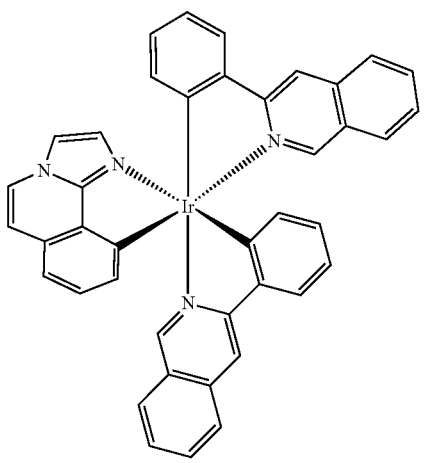
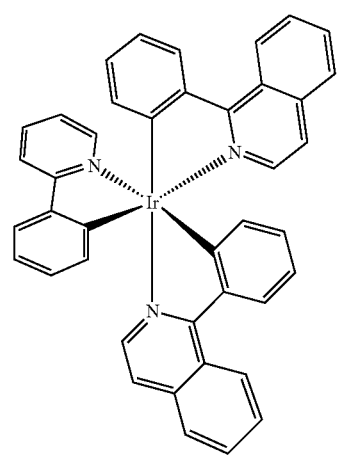
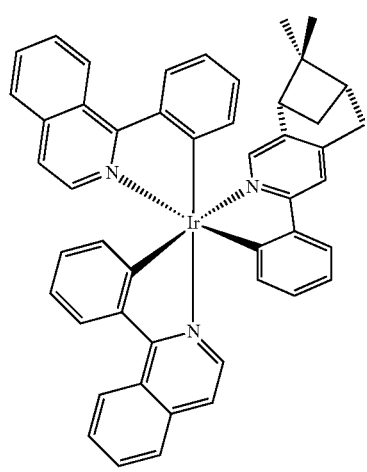
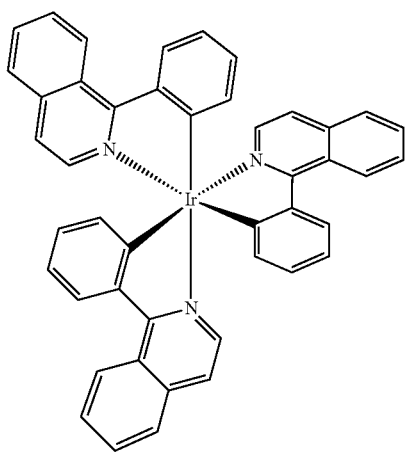

-continued
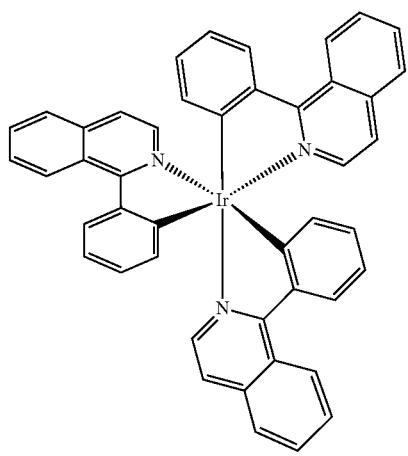
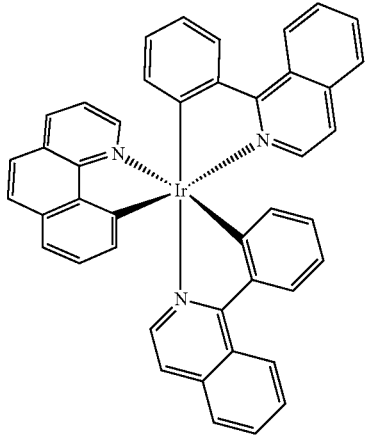
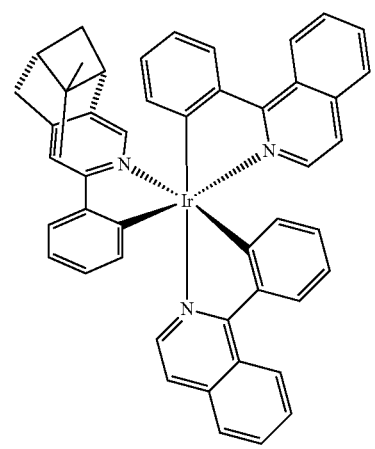
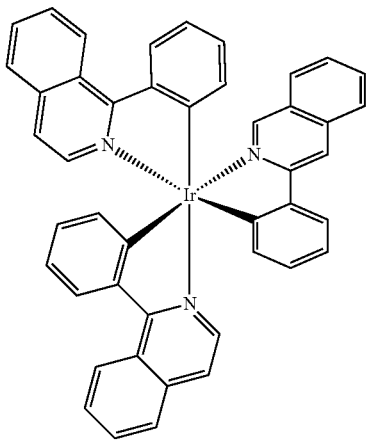
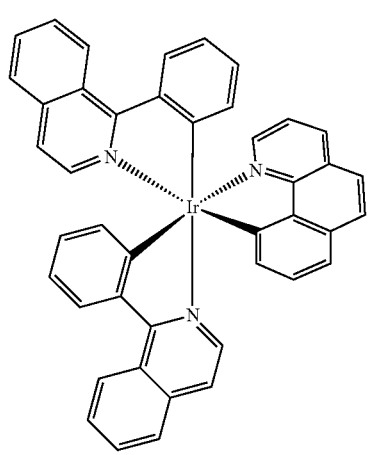
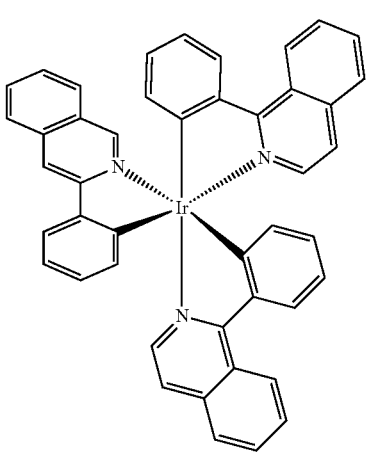

45
-continued
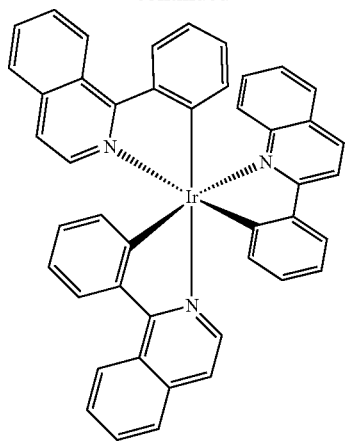
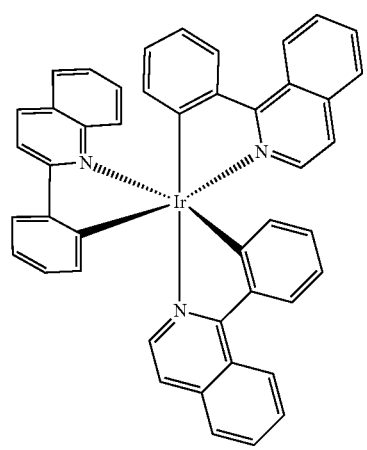
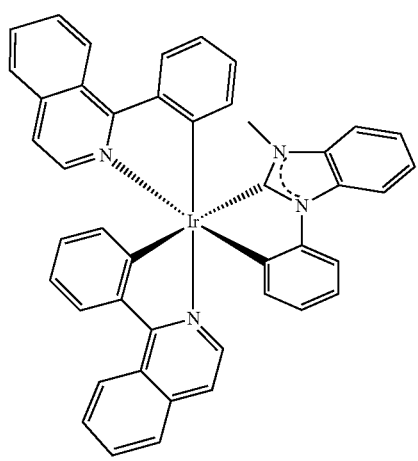
46
-continued
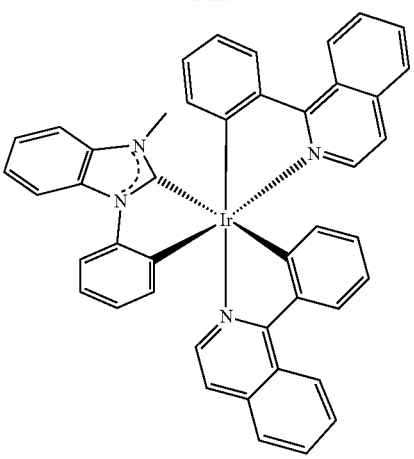
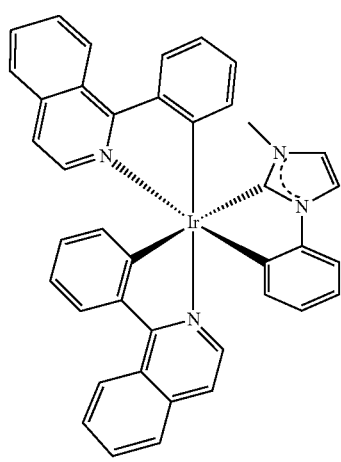
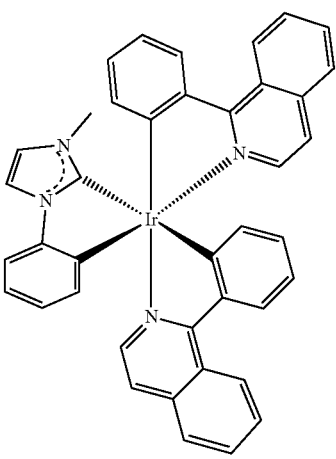

-continued
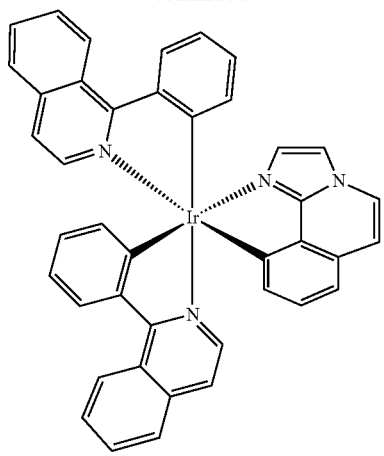
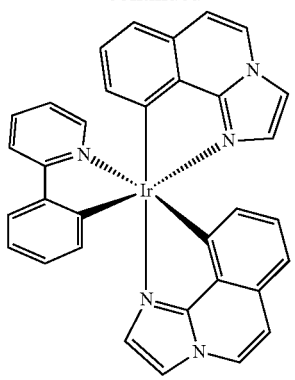
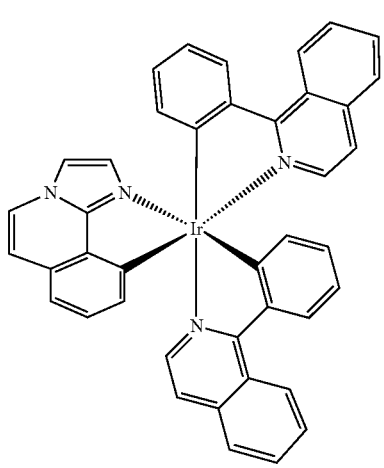
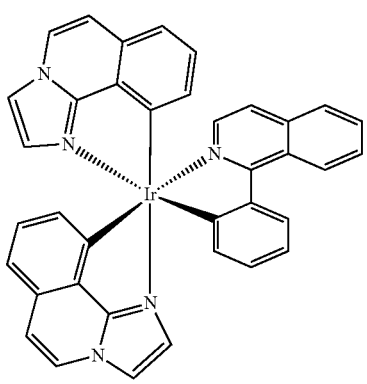
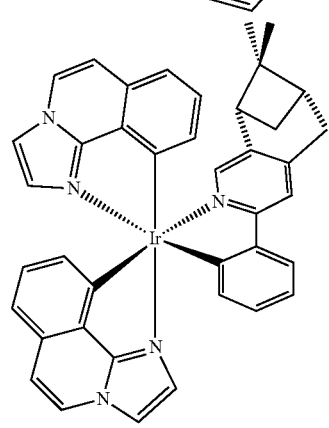
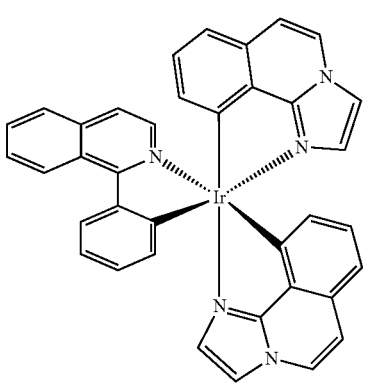
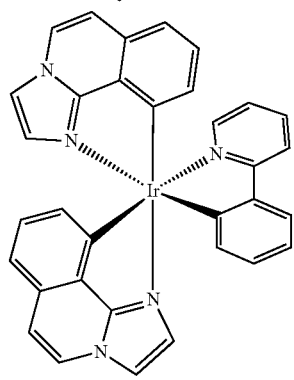
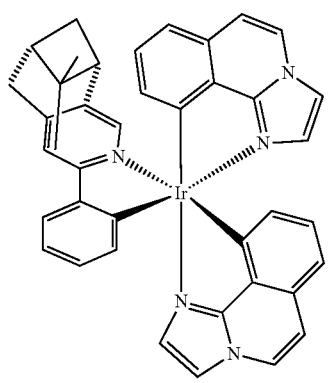

49
-continued
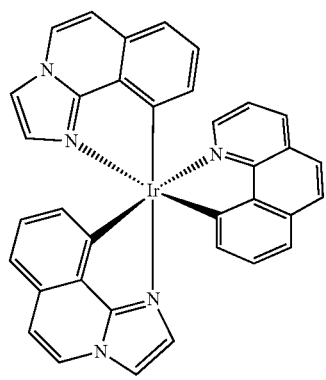
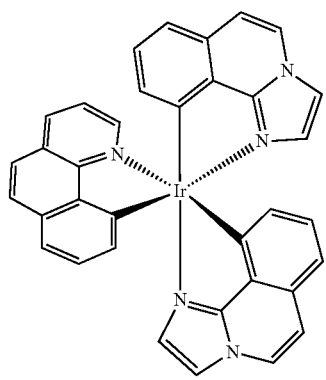
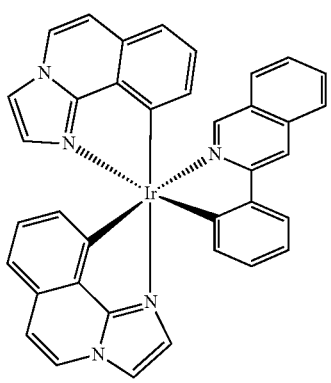
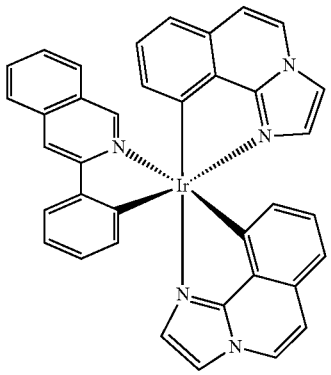
50
-continued
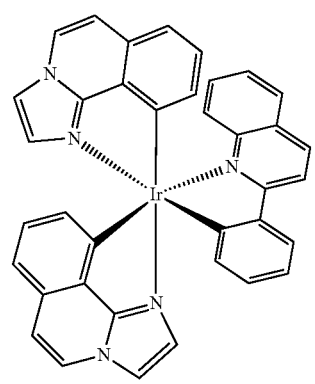
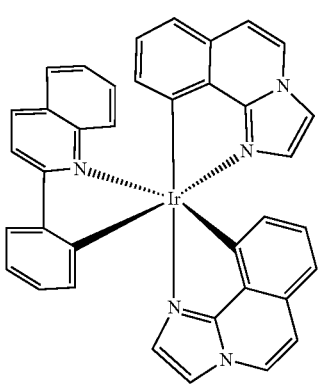
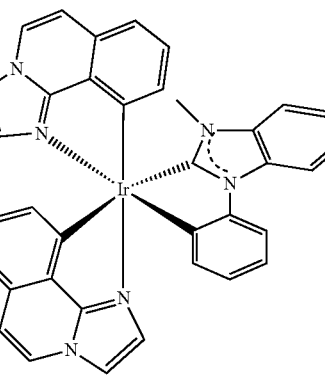
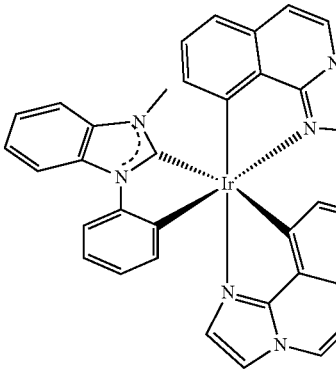

51
-continued
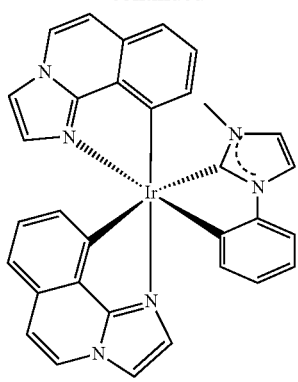
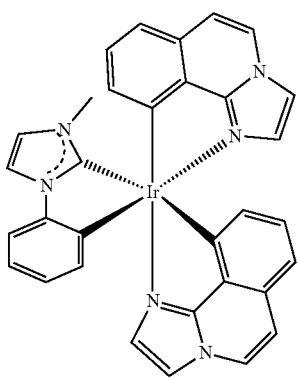
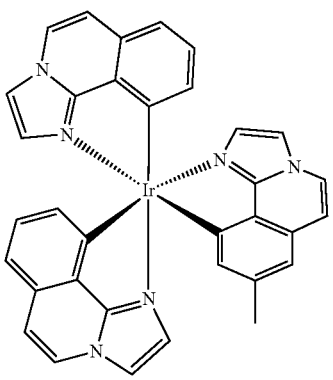
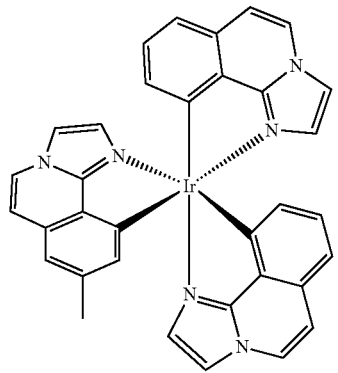
52
-continued
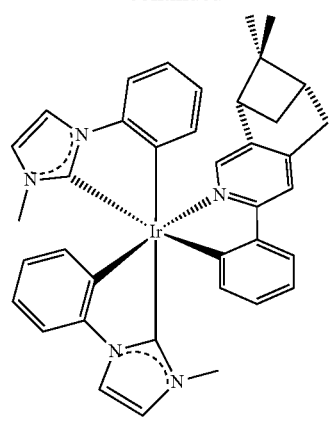
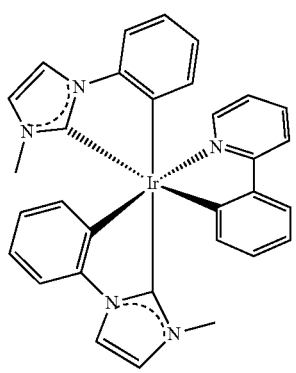
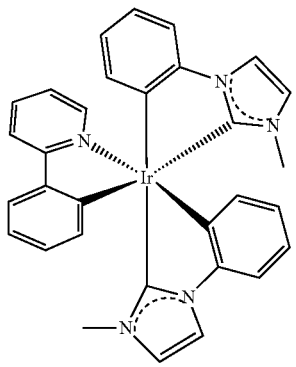
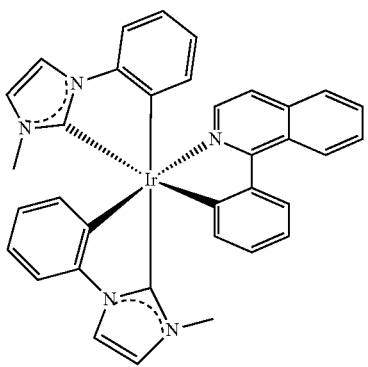

53
-continued
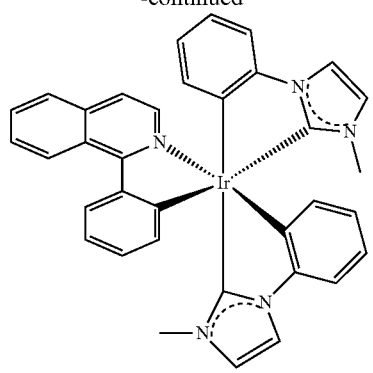
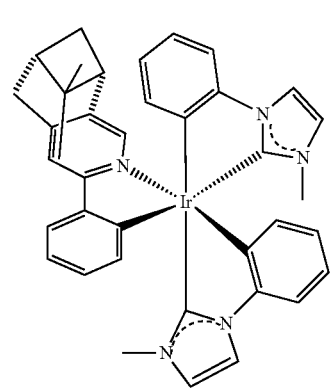
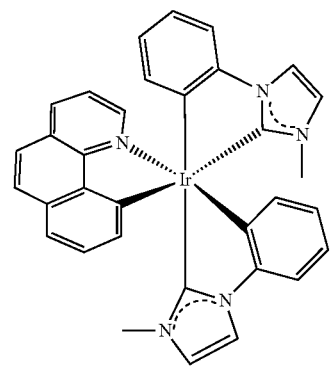
54
-continued
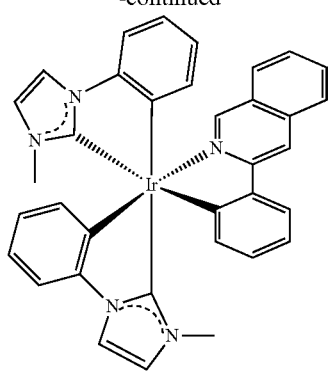
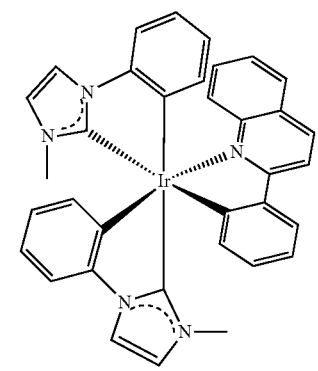
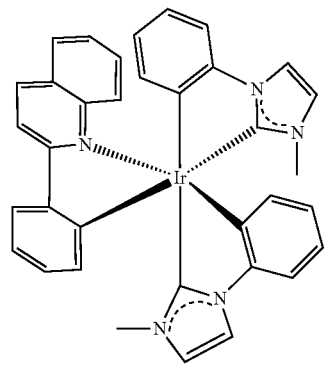

-continued
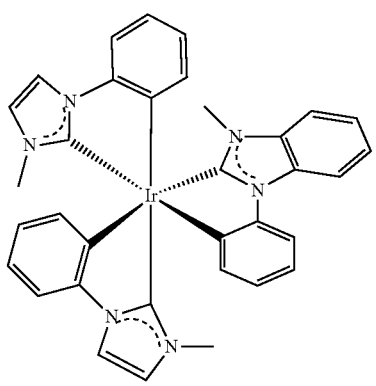
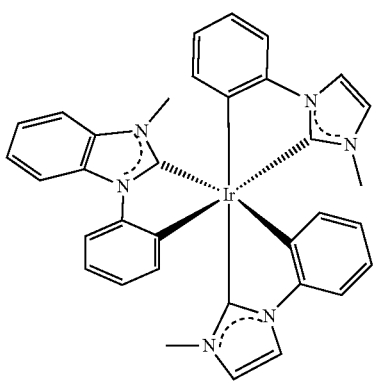
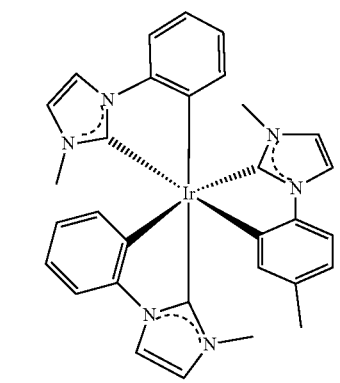
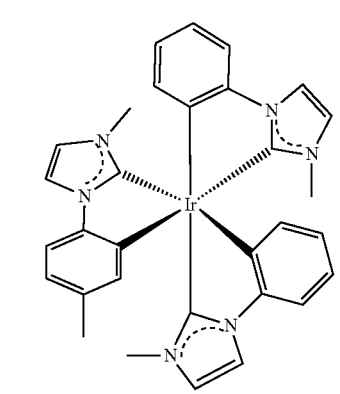
-continued
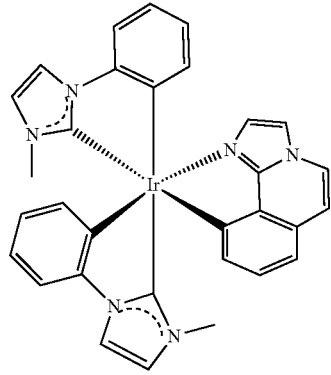
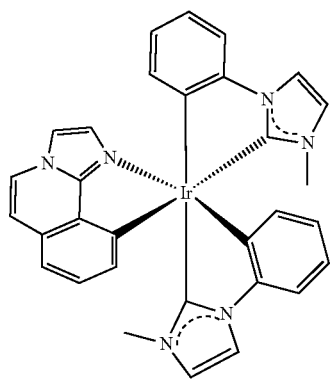
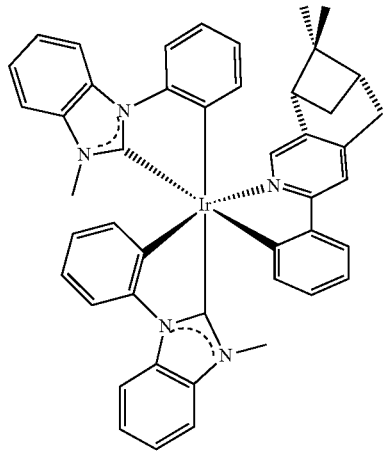
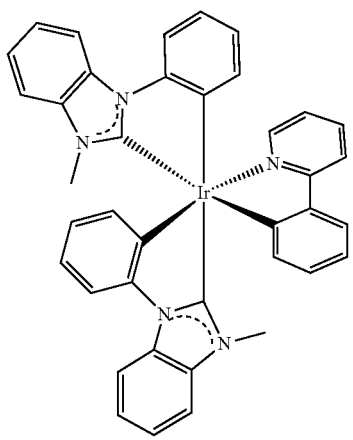

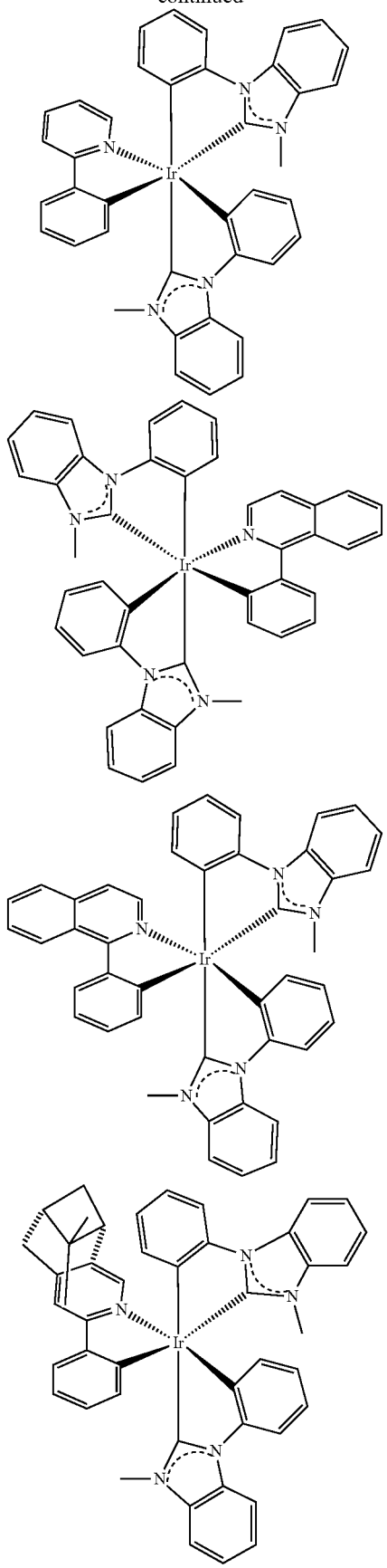
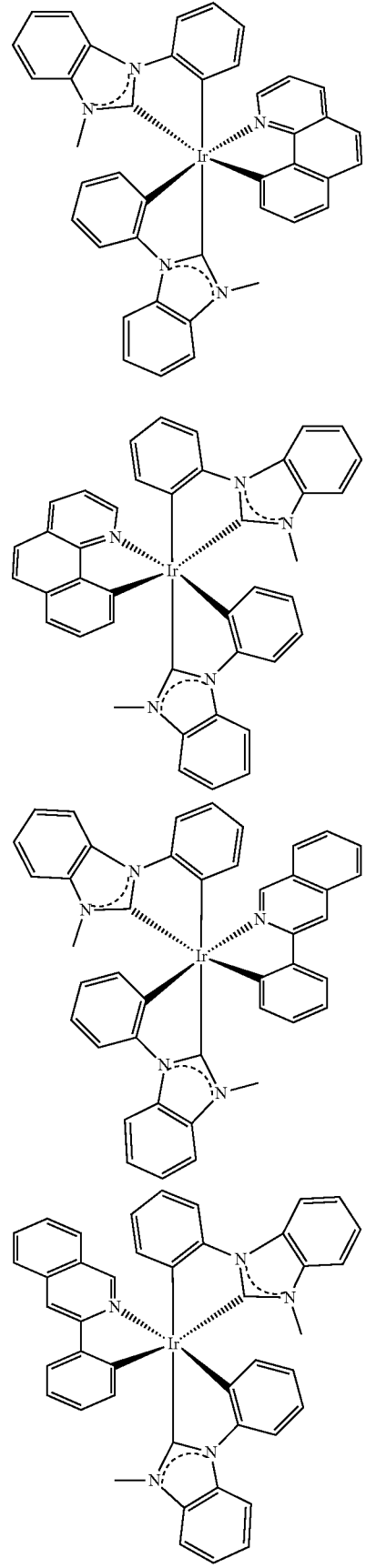

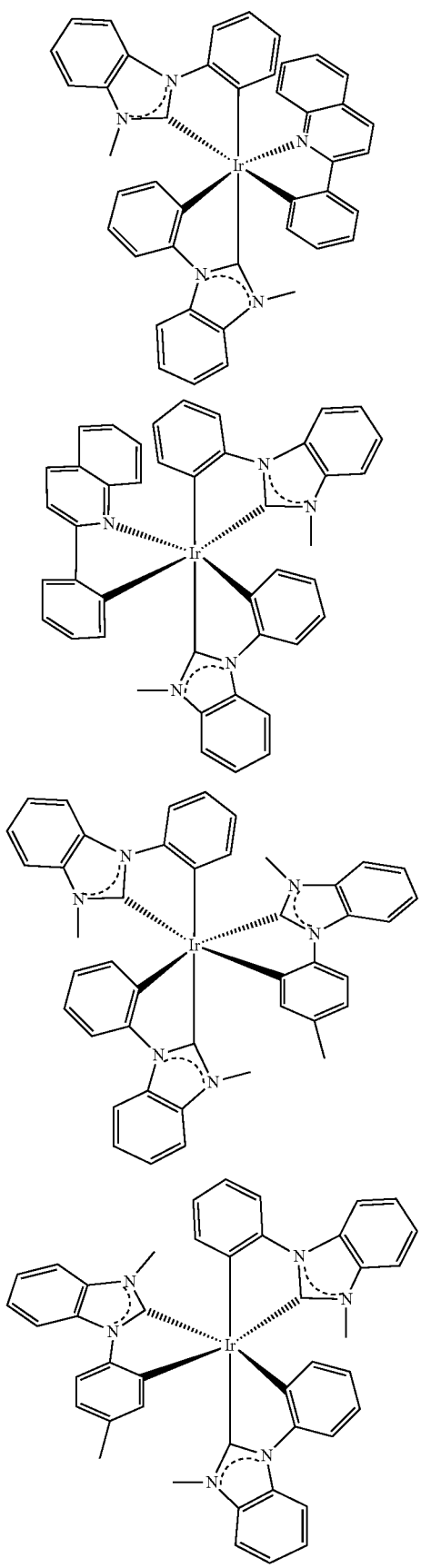
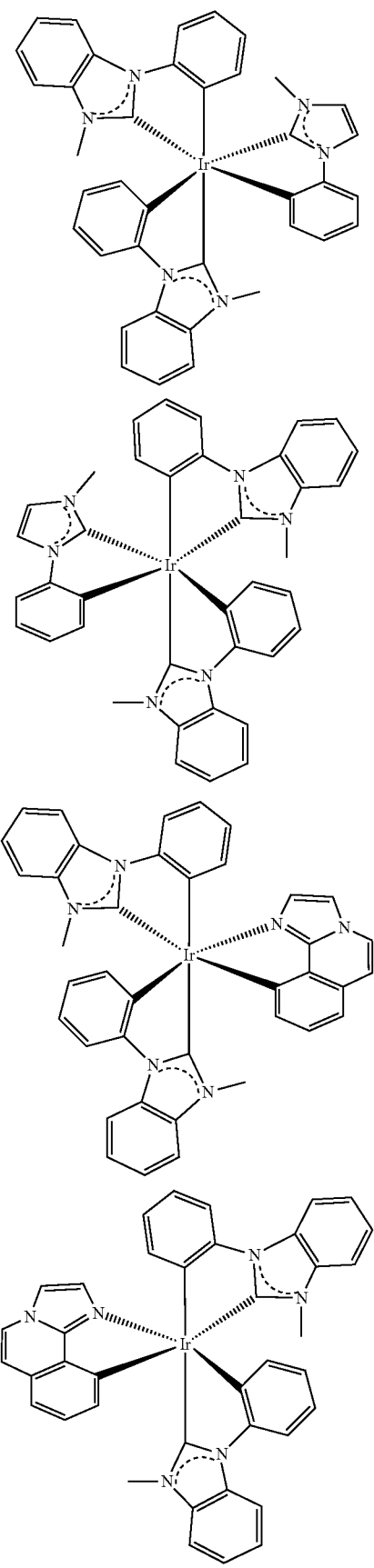

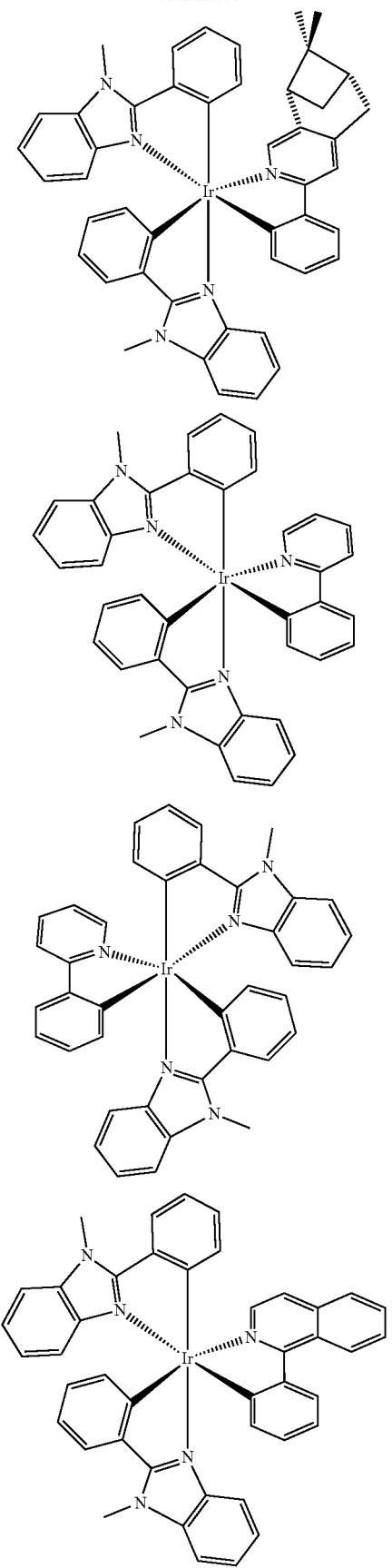
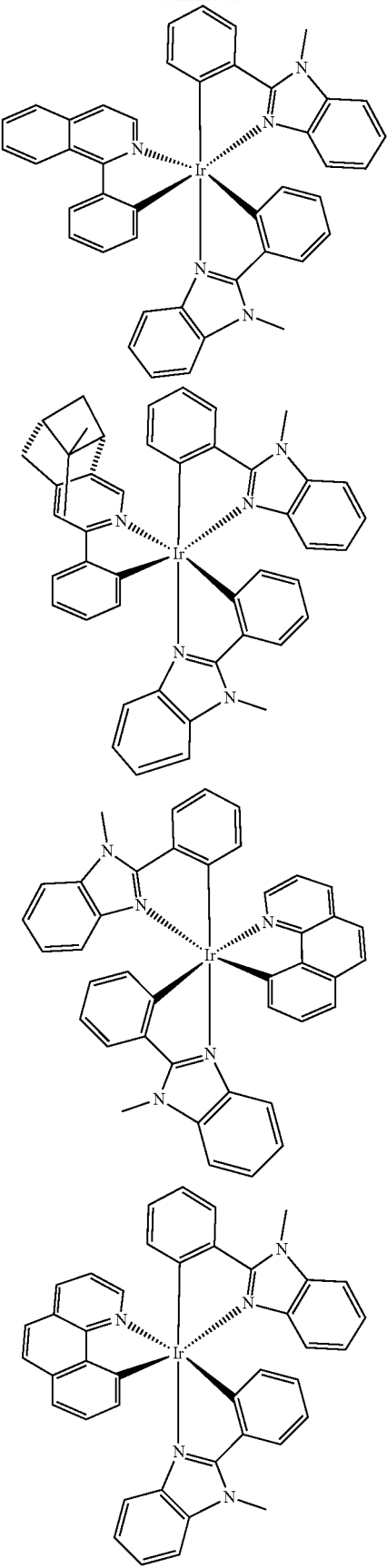

-continued
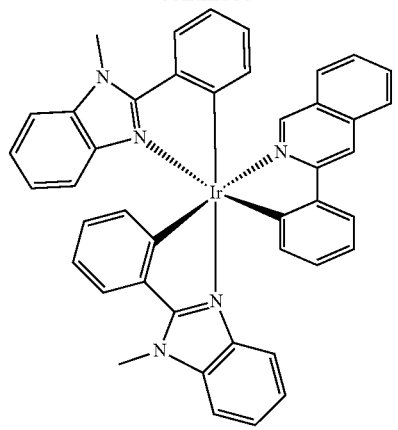
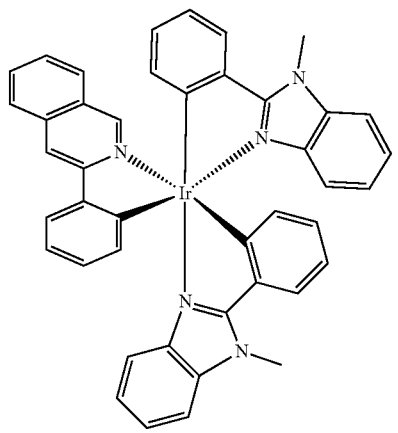
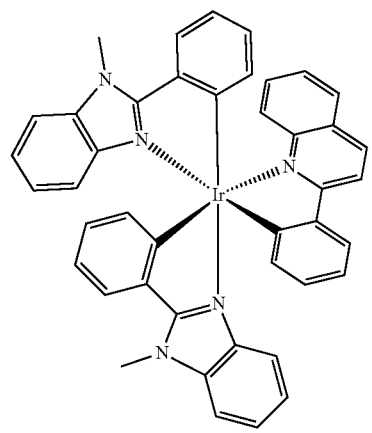
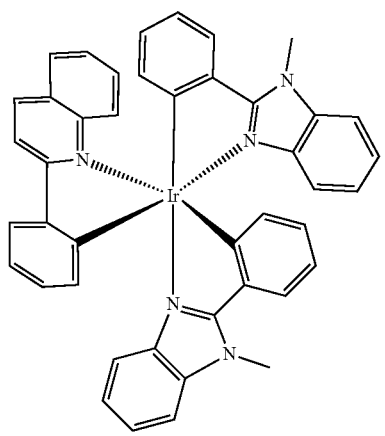
-continued
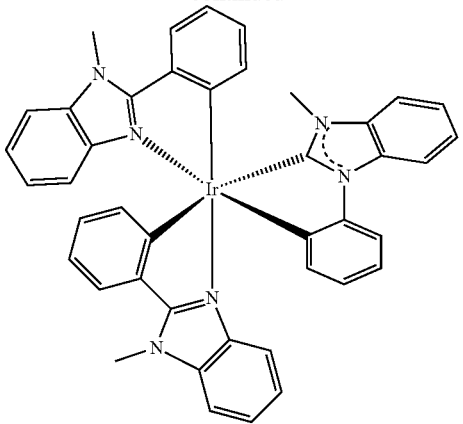
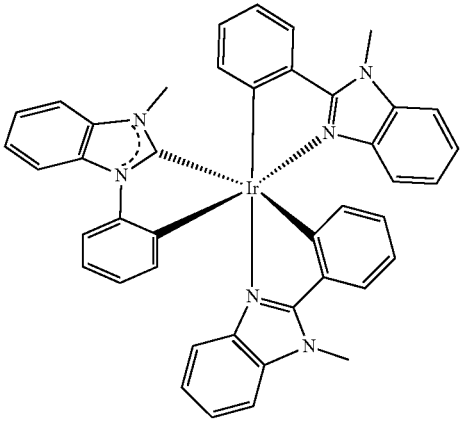
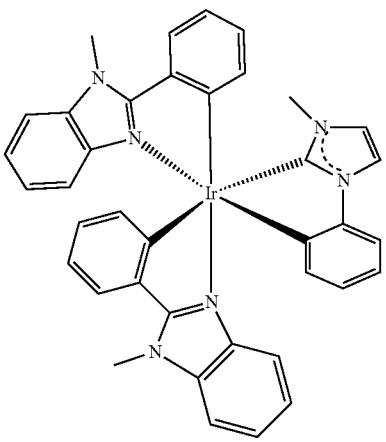
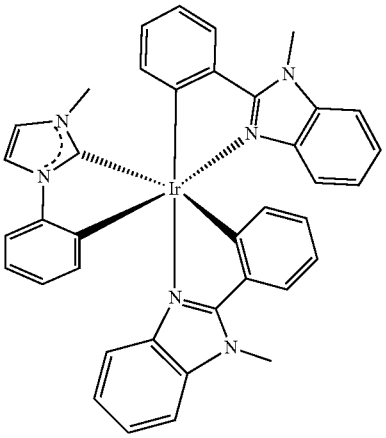

-continued
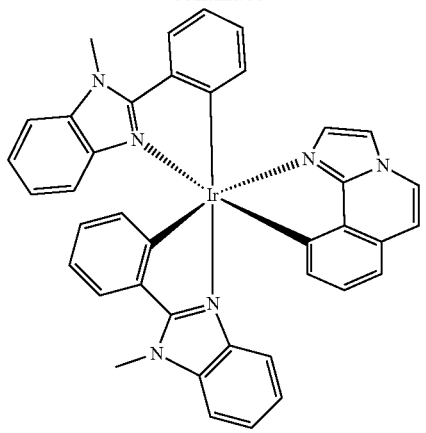
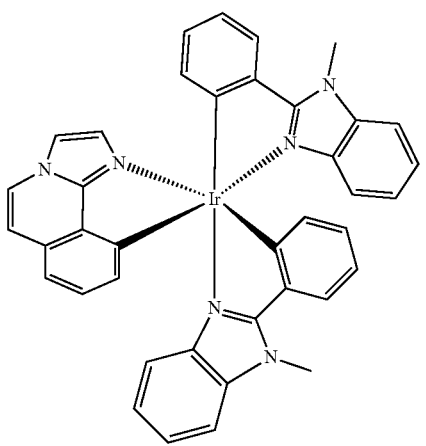
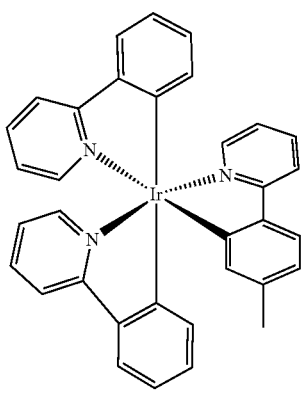
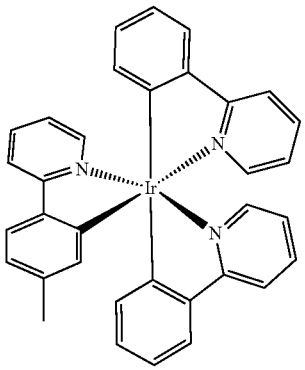
-continued
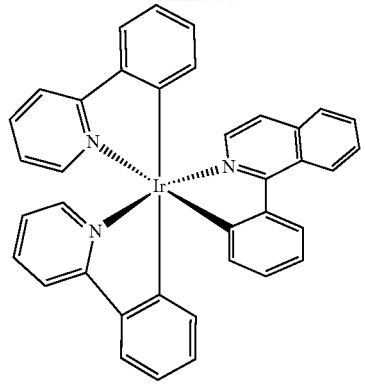
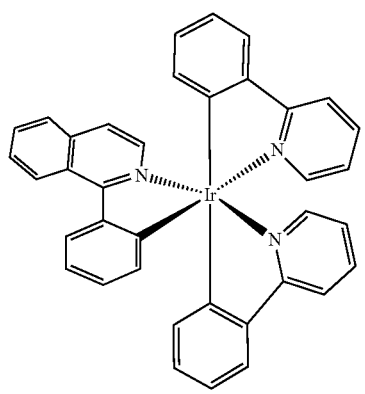
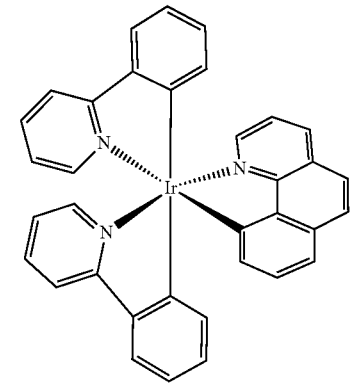
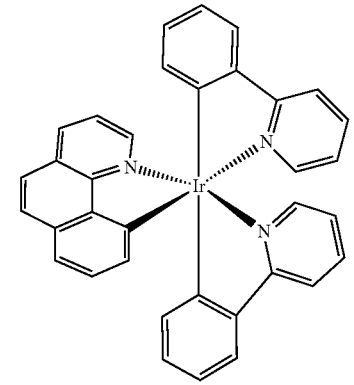

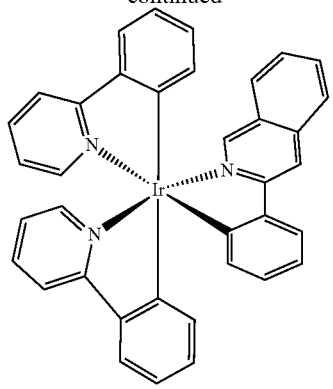
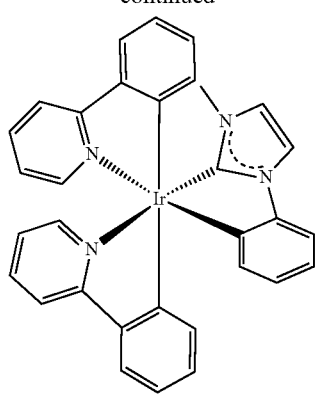
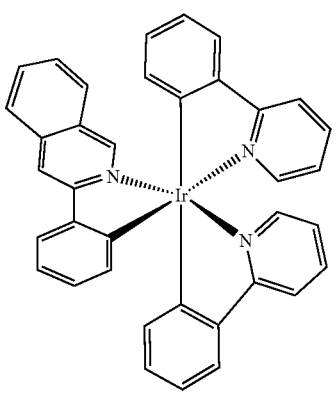
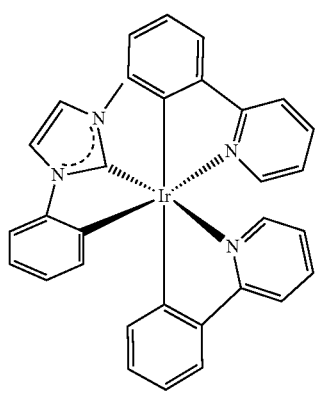
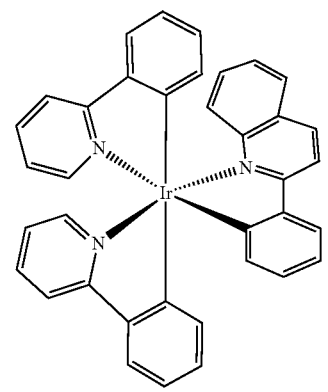
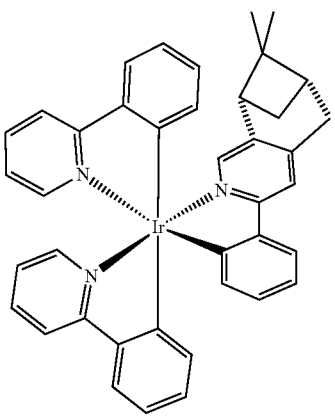
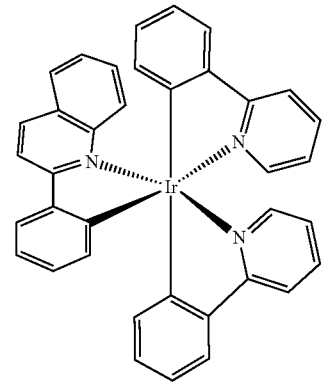
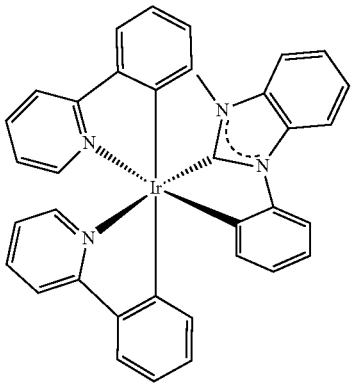

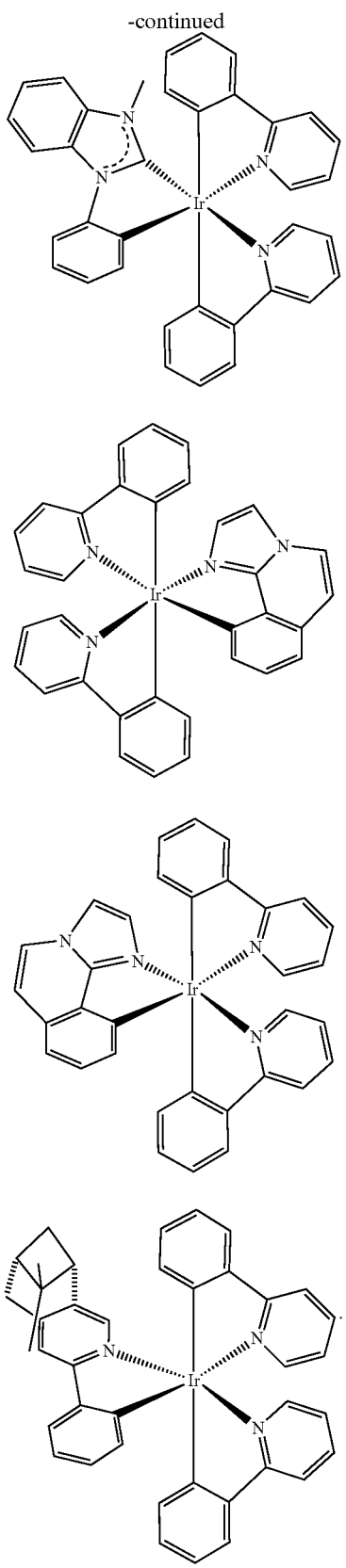

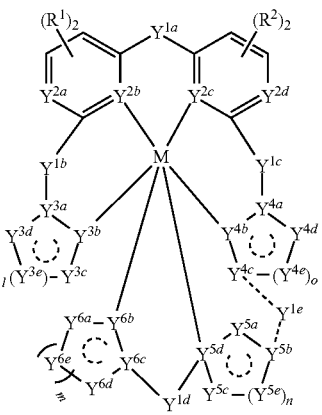

General Formula IIB wherein:
M represents $Ir^{3+}$ or $Rh^{3+}$;
each $R^1$ and $R^2$ in $(R^1)_2$ and $(R^2)_2$ independently represents hydrogen, halogen, hydroxyl, nitro, thiol, or substituted or unsubstituted: $C_1$-$C_4$ alkyl or amino;
each of $Y^{1a}$, $Y^{1c}$, and $Y^{1d}$ independently represents O; S; $NR^{4a}$, wherein $R^{4a}$ represents substituted or unsubstituted $C_1$-$C_4$ alkyl; $Si(R^{4b})_2$, wherein each of $R^{4b}$ in $(R^{4b})_2$ independently represents substituted or unsubstituted $C_1$-$C_4$ alkyl; or $C(R^{4c})_2$, wherein each $R^{4c}$ in $(R^{4c})_2$ independently represents hydrogen or substituted or unsubstituted $C_1$-$C_4$ alkyl;
$Y^{1b}$ is present or absent, and if present, represents a covalent bond or O; S; $NR^{4a}$, wherein $R^{5a}$ represents substituted or unsubstituted $C_1$-$C_4$ alkyl; $Si(R^{5b})_2$, wherein each $R^{5b}$ in $(R^{5b})_2$ independently represents substituted or unsubstituted $C_1$-$C_4$ alkyl; or $C(R^{5c})_2$, wherein each $R^{5c}$ in $(R^{5c})_2$ independently represents hydrogen or substituted or unsubstituted $C_1$-$C_4$ alkyl;
$Y^{1e}$ is present or absent, and if present, represents a covalent bond or O; S; $NR^{4a}$, wherein $R^{4a}$ represents substituted or unsubstituted $C_1$-$C_4$ alkyl; $Si(R^{4b})_2$, wherein each $R^{4b}$ in $(R^{4b})_2$ independently represents substituted or unsubstituted $C_1$-$C_4$ alkyl; or $C(R^{4c})_2$, wherein each $R^{4c}$ in $(R^{4c})_2$ independently represents hydrogen or substituted or unsubstituted $C_1$-$C_4$ alkyl;
each of $Y^{2a}$, $Y^{2b}$, $Y^{2c}$, and $Y^{2d}$, valency permitting, independently represents C or N or $NR^{6a}$ or $CR^{6b}$, as permitted by valency, wherein each of $R^{6a}$ and $R^{6b}$ independently represents hydrogen, halogen, hydroxyl, nitro, thiol, or substituted or unsubstituted: $C_1$-$C_4$ alkyl or amino;
each of $Y^{3a}$, $Y^{3b}$, $Y^{3c}$, $Y^{3d}$, $Y^{3e}$, $Y^{4a}$, $Y^{4b}$, $Y^{4c}$, $Y^{4d}$, and $Y^{4e}$, valency permitting, independently represents N; O; S; $NR^{6a}$ or $CR^{6b}$, as permitted by valency, wherein each of $R^{6a}$ and $R^{6b}$ independently represents hydrogen or substituted or unsubstituted $C_1$-$C_4$ alkyl; or $Z(R^{6c})_2$, wherein Z is C or Si, and each $R^{6c}$ in $(R^{6c})_2$ independently represents hydrogen or substituted or unsubstituted $C_1$-$C_4$ alkyl;
each of $Y^{5a}$, $Y^{5b}$, $Y^{5c}$, $Y^{5d}$, $Y^{5e}$, $Y^{6a}$, $Y^{6b}$, $Y^{6c}$, $Y^{6d}$, and $Y^{6e}$, valency permitting, independently represents N, O, S, $NR^{6a}$, or $CR^{6b}$ as permitted by valency;
wherein each m is independently 1 or 2;

7. The light emitting device of claim 1, wherein the chiral complex emitter has a structure represented by General Formula IIB:

the open dotted circle indicates partial or full unsaturation of the ring with which it is associated; and at least one of M, $R^1$, $R^2$, $Y^{1a}$, $Y^{1b}$, $Y^{1c}$, $Y^{1d}$, $Y^{1e}$, $Y^{2a}$, $Y^{2b}$, $Y^{2c}$, $Y^{2d}$, $Y^{3a}$, $Y^{3b}$, $Y^{3c}$, $Y^{3d}$, $Y^{3e}$, $Y^{4a}$, $Y^{4b}$, $Y^{4c}$, $Y^{4d}$, $Y^{4e}$, $Y^{5a}$, $Y^{5b}$, $Y^{5c}$, $Y^{5d}$, $Y^{5e}$, $Y^{6a}$, $Y^{6b}$, $Y^{6c}$, $Y^{6d}$, $Y^{6e}$ is a chiral center.

8. The light emitting device of claim 7, wherein:
two adjacent $R^1$ form a substituted or unsubstituted: carbocyclyl, aryl, heterocyclyl, or heteroaryl;
two adjacent $R^2$ form a substituted or unsubstituted: carbocyclyl, aryl, heterocyclyl, or heteroaryl;
$R^1$ or $R^2$ together with an adjacent $R^{4a}$ or $R^{4b}$ form a substituted or unsubstituted: carbocyclyl, aryl, heterocyclyl, or heteroaryl;
two adjacent $Y^{3c}$, $Y^{3d}$, $Y^{3e}$ form a substituted or unsubstituted: carbocyclyl, aryl, heterocyclyl, or heteroaryl;
two adjacent $Y^{6a}$, $Y^{6d}$, and $Y^{6e}$ form a substituted or unsubstituted: carbocyclyl, aryl, heterocyclyl, or heteroaryl;
two adjacent $Y^{5b}$, $Y^{5c}$, and $Y^{5e}$ form a substituted or unsubstituted: carbocyclyl, aryl, heterocyclyl, or heteroaryl;
$Y^{4d}$ and $Y^{4e}$ form a substituted or unsubstituted: carbocyclyl, aryl, heterocyclyl, or heteroaryl;
$Y^{2a}$ and $Y^{3d}$ form a substituted or unsubstituted: carbocyclyl, aryl, heterocyclyl, or heteroaryl;
$Y^{2d}$ and $Y^{4d}$ form a substituted or unsubstituted: carbocyclyl, aryl, heterocyclyl;
$Y^{4e}$ and $Y^{5e}$ form a substituted or unsubstituted: carbocyclyl, aryl, heterocyclyl; or
$Y^{5c}$ and $Y^{6d}$ form a substituted or unsubstituted: carbocyclyl, aryl, heterocyclyl.

9. A method of generating linearly polarized light, the method comprising:
generating circularly polarized light via a transparent organic light emitting device comprising a chiral complex emitter;
passing the circularly polarized light through a single optically active light-blocking element comprising a quarter-wave plate and a linear polarizer,
wherein a difference between a refractive index of the quarter-wave plate in a first direction and a refractive index of the quarter-wave plate in a second direction perpendicular to the first direction is in a range of 0.1 to 0.2,
wherein the chiral complex emitter, the quarter-wave plate, and the linear polarizer are configured to allow transmission of light, generated by the transparent organic light emitting device and within the transparent organic light emitting device, through a single side of the light emitting device.

10. The method of claim 9, wherein the chiral complex emitter has a structure represented by General Formula IA:

General Formula IA

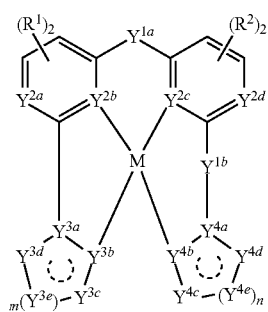

wherein:
M represents $Pt^{2+}$, $Pd^{2+}$, $Ir^+$, $Rh^+$, or $Au^{3+}$;
each $R^1$ and $R^2$ in $(R^1)_2$ and $(R^2)_2$ independently represents hydrogen, halogen, hydroxyl, nitro, thiol, or substituted or unsubstituted: $C_1$-$C_4$ alkyl or amino;
$Y^{1a}$ represents O; S; $NR^{3a}$, wherein $R^{3a}$ represents substituted or unsubstituted $C_1$-$C_4$ alkyl; $Si(R^{3b})_2$, wherein each $R^{3b}$ in $(R^{3b})_2$ independently represents substituted or unsubstituted $C_1$-$C_4$ alkyl; or $C(R^{3c})_2$, wherein each $R^{3c}$ in $(R^{3c})_2$ independently represents hydrogen or substituted or unsubstituted $C_1$-$C_4$ alkyl;
$Y^{1b}$ is present or absent, and if present, represents a covalent bond or O; S; $NR^{4a}$, wherein $R^{4a}$ represents substituted or unsubstituted $C_1$-$C_4$ alkyl; $Si(R^{4b})_2$, wherein each $R^{4b}$ in $(R^{4b})_2$ independently represents substituted or unsubstituted $C_1$-$C_4$ alkyl; or $C(R^{4c})_2$, wherein each $R^{4c}$ in $(R^{4c})_2$ independently represents hydrogen or substituted or unsubstituted $C_1$-$C_4$ alkyl;
each of $Y^{2a}$, $Y^{2b}$, $Y^{2c}$, and $Y^{2d}$, valency permitting, independently represents C or N or $NR^{5a}$ or $CR^{5b}$, as permitted by valency, wherein each of $R^{5a}$ and $R^{5b}$ independently represents hydrogen, halogen, hydroxyl, nitro, thiol, or substituted or unsubstituted: $C_1$-$C_4$ alkyl or amino;
each of $Y^{3a}$, $Y^{3b}$, $Y^{3c}$, $Y^{3d}$, $Y^{3e}$, $Y^{4a}$, $Y^{4b}$, $Y^{4c}$, $Y^{4d}$, and $Y^{4e}$, valency permitting, independently represents C; N; O; S; $NR^{6a}$ or $CR^{6b}$, as permitted by valency, wherein each of $R^{6a}$ and $R^{6b}$ independently represents hydrogen or substituted or unsubstituted $C_1$-$C_4$ alkyl; or $Z(R^{6c})_2$, wherein Z is C or Si, and each $R^{6c}$ in $(R^{6c})_2$ independently represents hydrogen or substituted or unsubstituted $C_1$-$C_4$ alkyl;
m is 1 or 2;
n is 1 or 2;
the open dotted circle indicates partial or full unsaturation of the ring with which it is associated; and
at least one of M, $R^1$, $R^2$, $Y^{1a}$, $Y^{1b}$, $Y^{1c}$, $Y^{2a}$, $Y^{2b}$, $Y^{2c}$, $Y^{2d}$, $Y^{3a}$, $Y^{3b}$, $Y^{3c}$, $Y^{3d}$, $Y^{3e}$, $Y^{4a}$, $Y^{4b}$, $Y^{4c}$, $Y^{4d}$, and $Y^{4e}$ is a chiral center.

11. The method of claim 9, wherein the chiral complex emitter has a structure represented by General Formula IB:

General Formula IB

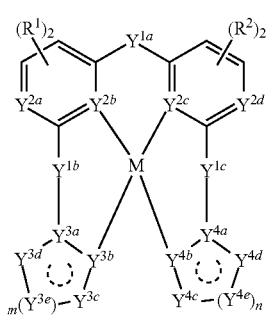

wherein:
M represents $Pt^{2+}$, $Pd^{2+}$, $Ir^+$, $Rh^+$, or $Au^{3+}$;
each $R^1$ and $R^2$ in $(R^1)_2$ and $(R^2)_2$ independently represents hydrogen, halogen, hydroxyl, nitro, thiol, or substituted or unsubstituted: $C_1$-$C_4$ alkyl or amino;
$Y^{1a}$ represents O; S; $NR^{3a}$, wherein $R^{3a}$ represents substituted or unsubstituted $C_1$-$C_4$ alkyl; $Si(R^{3b})_2$, wherein each $R^{3b}$ in $(R^{3b})_2$ independently represents substituted or unsubstituted $C_1$-$C_4$ alkyl; or $C(R^{3c})_2$, wherein each $R^{3c}$ in $(R^{3c})_2$ independently represents hydrogen or substituted or unsubstituted $C_1$-$C_4$ alkyl;

$Y^{1b}$ is present or absent, and if present, represents a covalent bond or O; S; $NR^{4a}$, wherein $R^{4a}$ represents substituted or unsubstituted $C_1$-$C_4$ alkyl; $Si(R^{4b})_2$, wherein each $R^{4b}$ in $(R^{4b})_2$ independently represents substituted or unsubstituted $C_1$-$C_4$ alkyl; or $C(R^{4c})_2$, wherein each $R^{4c}$ in $(R^{4c})_2$ independently represents hydrogen or substituted or unsubstituted $C_1$-$C_4$ alkyl;

$Y^{1c}$ represents O; S; $NR^{5a}$, wherein $R^{5a}$ represents substituted or unsubstituted $C_1$-$C_4$ alkyl; $Si(R^{5b})_2$, wherein each $R^{5b}$ in $(R^{5b})_2$ independently represents substituted or unsubstituted $C_1$-$C_4$ alkyl; or $C(R^{5c})_2$, wherein each $R^{5c}$ in $(R^{5c})_2$ independently represents hydrogen or substituted or unsubstituted $C_1$-$C_4$ alkyl;

each of $Y^{2a}$, $Y^{2b}$, $Y^{2c}$, and $Y^{2d}$, valency permitting, independently represents C or N or $NR^{6a}$ or $CR^{6b}$, as permitted by valency, wherein each of $R^{6a}$ and $R^{6b}$ independently represents hydrogen, halogen, hydroxyl, nitro, thiol, or substituted or unsubstituted: $C_1$-$C_4$ alkyl or amino;

each of $Y^{3a}$, $Y^{3b}$, $Y^{3c}$, $Y^{3d}$, $Y^{3e}$, $Y^{4a}$, $Y^{4b}$, $Y^{4c}$, $Y^{4d}$, and $Y^{4e}$, valency permitting, independently represents N; O; S; $NR^{7a}$ or $CR^{7b}$, as permitted by valency, wherein each of $R^{7a}$ and $R^{7b}$ independently represents hydrogen or substituted or unsubstituted $C_1$-$C_4$ alkyl; or $Z(R^{7c})_2$, wherein Z is C or Si, and each $R^{7c}$ in $(R^{7c})_2$ independently represents hydrogen or substituted or unsubstituted $C_1$-$C_4$ alkyl;

m is 1 or 2;

n is 1 or 2;

the open dotted circle ⌒ indicates partial or full unsaturation of the ring with which it is associated; and at least one of M, $R^1$, $R^2$, $Y^{1a}$, $Y^{1b}$, $Y^{1c}$, $Y^{2a}$, $Y^{2b}$, $Y^{2c}$, $Y^{2d}$, $Y^{3a}$, $Y^{3b}$, $Y^{3c}$, $Y^{3d}$, $Y^{3e}$, $Y^{4a}$, $Y^{4b}$, $Y^{4c}$, $Y^{4d}$, and $Y^{4e}$ is a chiral center.

12. The method of claim 9, wherein the chiral complex emitter has a structure represented by General Formula IIA:

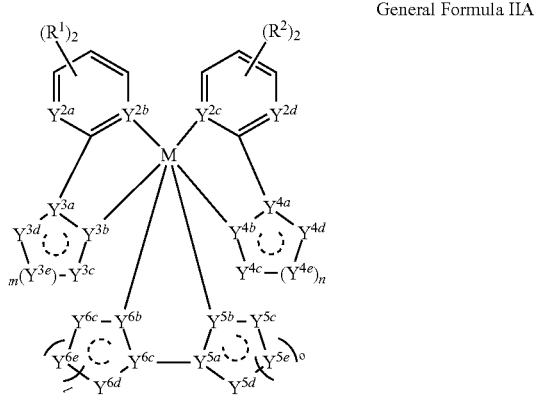

General Formula IIA wherein:

M represents $Ir^{3+}$ or $Rh^{3+}$;

each $R^1$ and $R^2$ in $(R^1)_2$ and $(R^2)_2$ independently represents hydrogen, halogen, hydroxyl, nitro, thiol, or substituted or unsubstituted: $C_1$-$C_4$ alkyl or amino;

each of $Y^{2a}$, $Y^{2b}$, $Y^{2c}$, and $Y^{2d}$, valency permitting, independently represents C or N or $NR^{3a}$ or $CR^{3b}$, as permitted by valency, wherein each of $R^{3a}$ and $R^{3b}$ independently represents hydrogen, halogen, hydroxyl, nitro, thiol, or substituted or unsubstituted: $C_1$-$C_4$ alkyl or amino;

each of $Y^{3a}$, $Y^{3b}$, $Y^{3c}$, $Y^{3d}$, $Y^{3e}$, $Y^{4a}$, $Y^{4b}$, $Y^{4c}$, $Y^{4d}$, and $Y^{4e}$, valency permitting, independently represents C; N; O; S; $NR^{4a}$ or $CR^{4b}$, as permitted by valency, wherein each of $R^{4a}$ and $R^{4b}$ independently represents hydrogen or substituted or unsubstituted $C_1$-$C_4$ alkyl; or $Z(R^{4c})_2$, wherein Z is C or Si, and each $R^{4c}$ in $(R^{4c})_2$ independently represents hydrogen or substituted or unsubstituted $C_1$-$C_4$ alkyl;

each of $Y^{5a}$, $Y^{5b}$, $Y^{5c}$, $Y^{5d}$, $Y^{5e}$, $Y^{6a}$, $Y^{6b}$, $Y^{6c}$, $Y^{6d}$, and $Y^{6e}$, valency permitting, independently represents C; N, O, S, $NR^{6a}$ or $CR^{6b}$, as permitted by valency, wherein each of $R^{6a}$ and $R^{6b}$ independently represents hydrogen or substituted or unsubstituted $C_1$-$C_4$ alkyl;

m is 1 or 2;

n is 1 or 2;

l is 1 or 2;

o is 1 or 2;

the open dotted circle ⌒ indicates partial or full unsaturation of the ring with which it is associated;

at least one of M, $R^1$, $R^2$, $Y^{2a}$, $Y^{2b}$, $Y^{2c}$, $Y^{2d}$, $Y^{3a}$, $Y^{3b}$, $Y^{3c}$, $Y^{3d}$, $Y^{3e}$, $Y^{4a}$, $Y^{4b}$, $Y^{4c}$, $Y^{4d}$, $Y^{4e}$, $Y^{5a}$, $Y^{5b}$, $Y^{5c}$, $Y^{5d}$, $Y^{5e}$, $Y^{6a}$, $Y^{6b}$, $Y^{6c}$, $Y^{6d}$, and $Y^{6e}$ is a chiral center.

13. The method of claim 12, wherein:

two adjacent $R^1$ form a substituted or unsubstituted: carbocyclyl, aryl, heterocyclyl, or heteroaryl;

two adjacent $R^2$ form a substituted or unsubstituted: carbocyclyl, aryl, heterocyclyl, or heteroaryl;

$R^1$ or $R^2$ together with an adjacent $R^{3a}$ or $R^{3b}$ form a substituted or unsubstituted: carbocyclyl, aryl, heterocyclyl, or heteroaryl;

two adjacent $Y^{3c}$, $Y^{3d}$, $Y^{3e}$ form a substituted or unsubstituted: carbocyclyl, aryl, heterocyclyl, or heteroaryl;

two adjacent $Y^{4c}$, $Y^{4d}$, and $Y^{4e}$ form a substituted or unsubstituted: carbocyclyl, aryl, heterocyclyl, or heteroaryl;

two adjacent $Y^{5c}$, $Y^{5d}$, and $Y^{5e}$ form a substituted or unsubstituted: carbocyclyl, aryl, heterocyclyl, or heteroaryl;

$Y^{2a}$ and $Y^{3d}$ form a substituted or unsubstituted: carbocyclyl, aryl, heterocyclyl, or heteroaryl;

$Y^{2d}$ and $Y^{4d}$ form a substituted or unsubstituted: carbocyclyl, aryl, heterocyclyl;

$Y^{6d}$ and $Y^{5d}$ form a substituted or unsubstituted: carbocyclyl, aryl, heterocyclyl.

14. The method of claim 12, wherein the chiral complex emitter has a structure selected from one of the following structures:

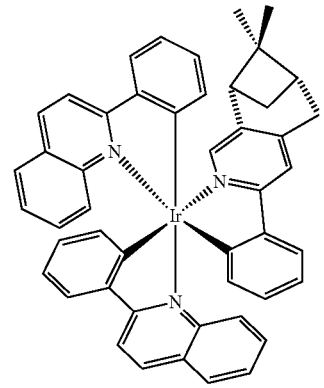

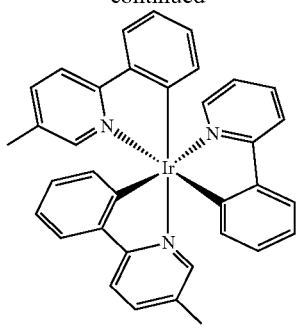
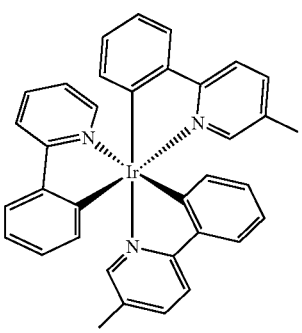
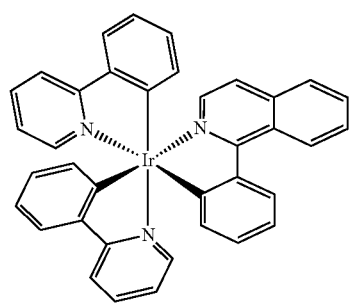
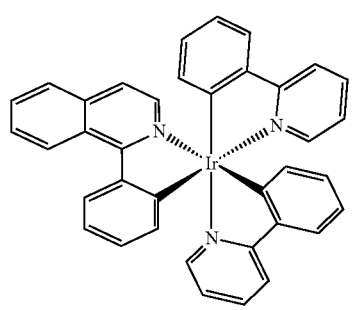
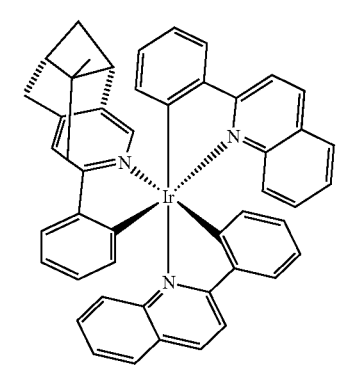
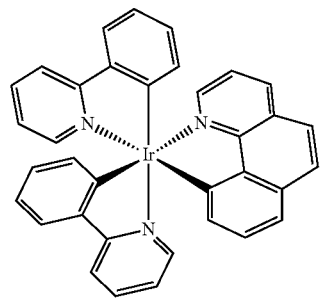
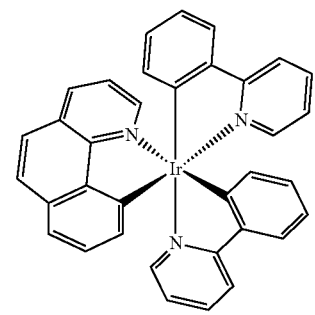
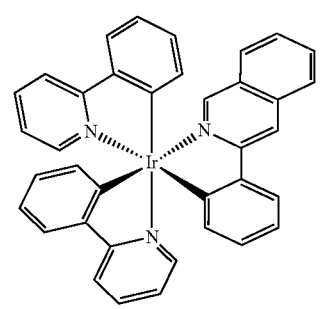
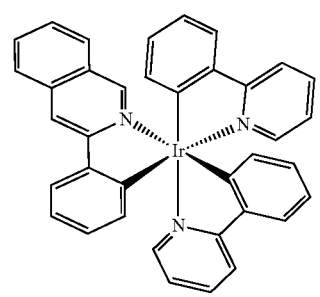
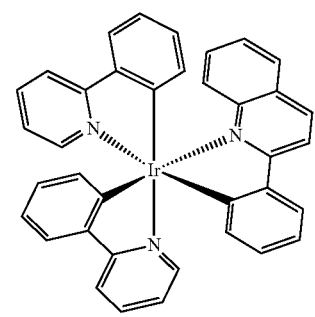

-continued
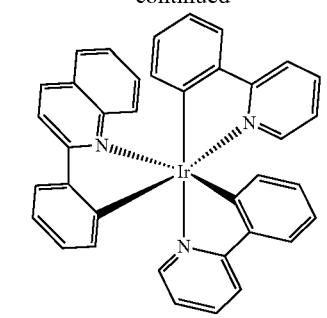
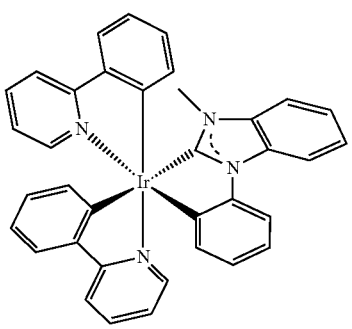
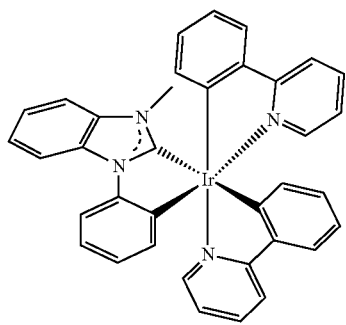
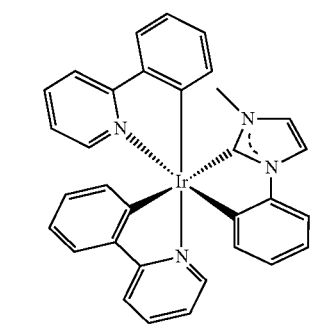
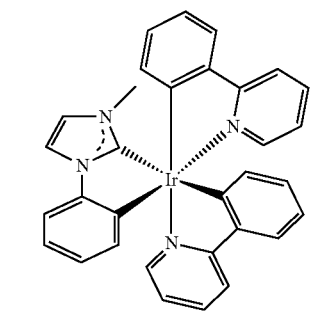
-continued
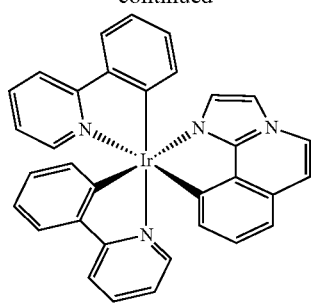
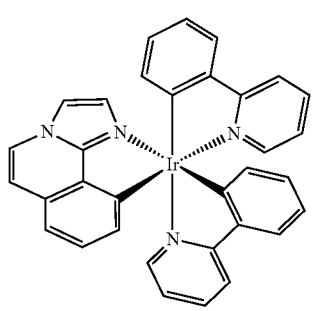
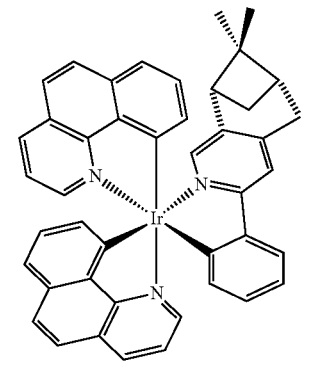
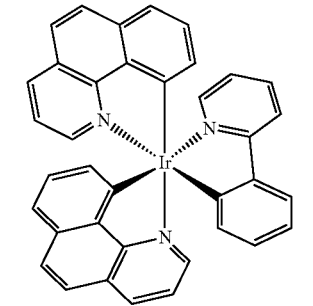
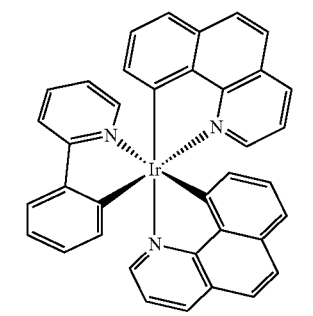

79
-continued
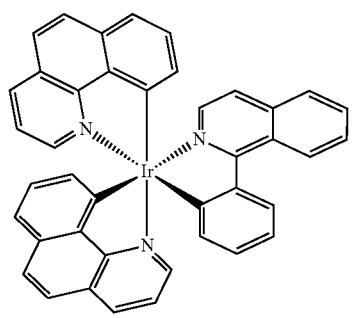
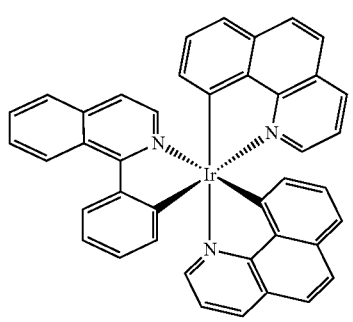
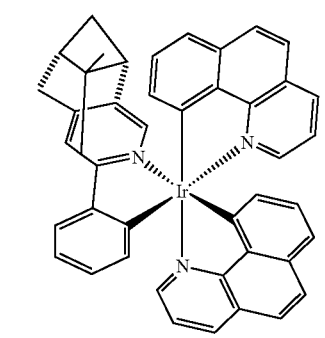
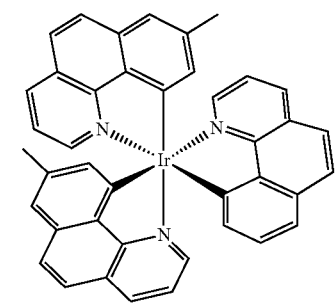
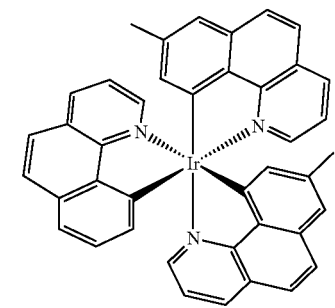
80
-continued
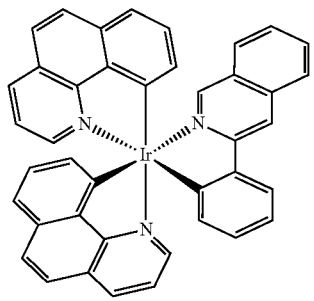
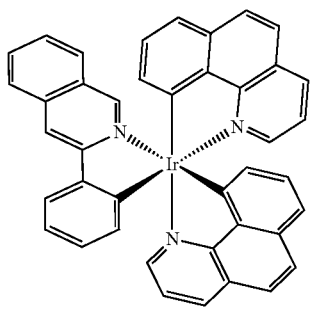
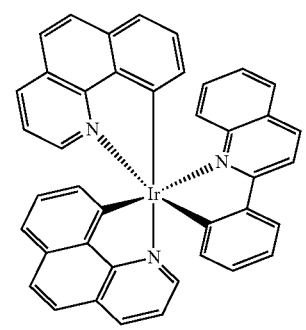
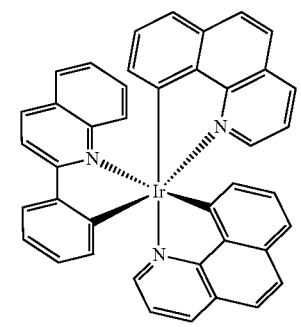
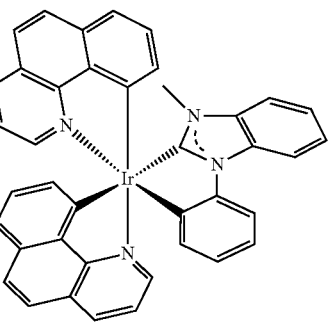

-continued
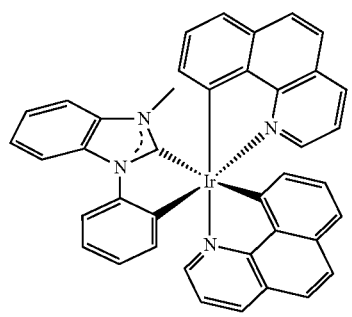
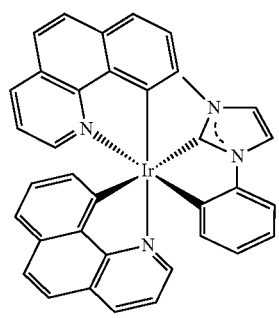
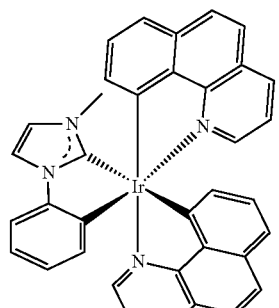
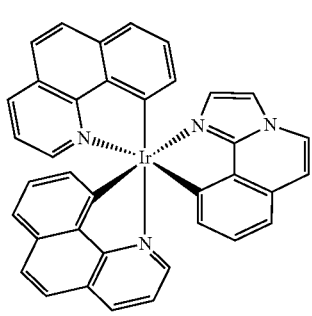
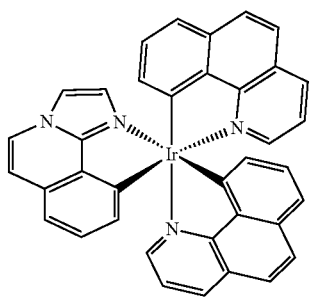
-continued
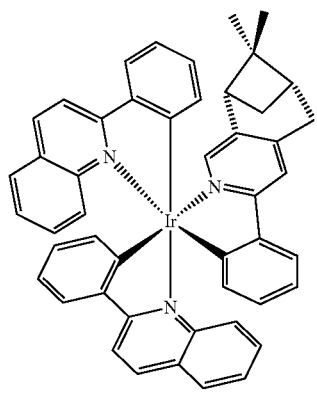
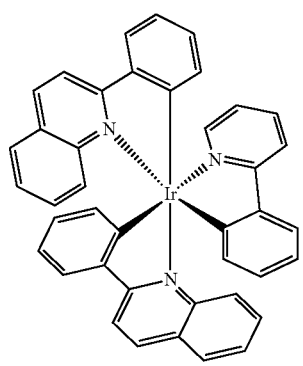
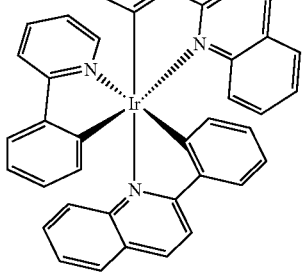
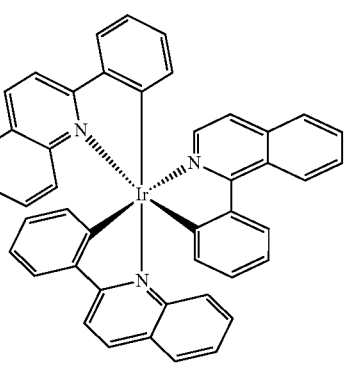

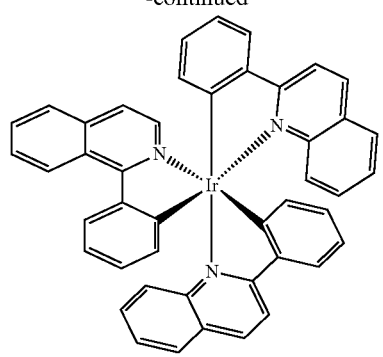
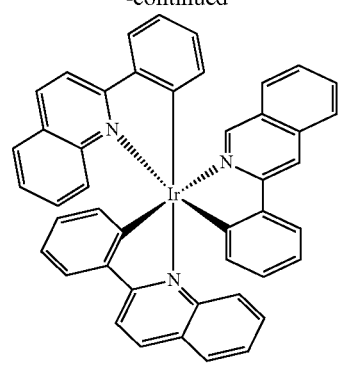
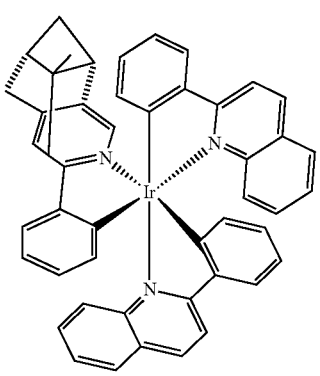
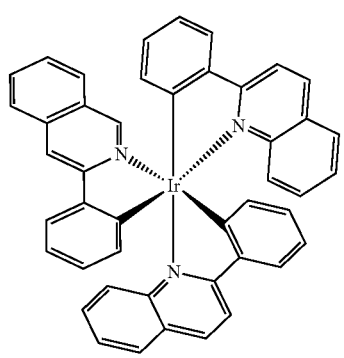
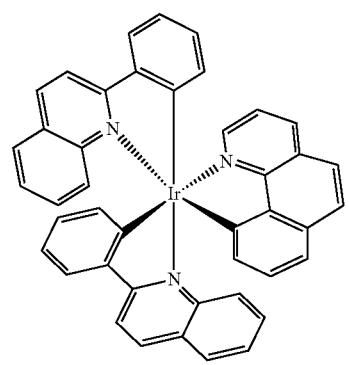
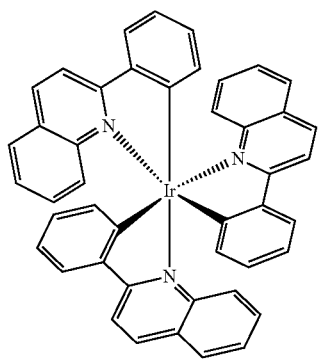
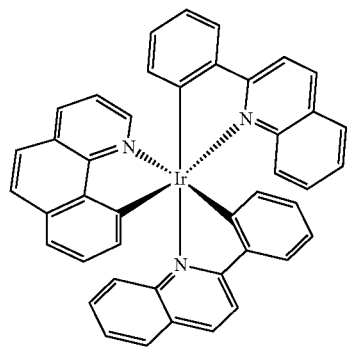
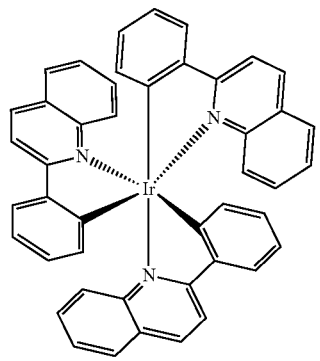

-continued
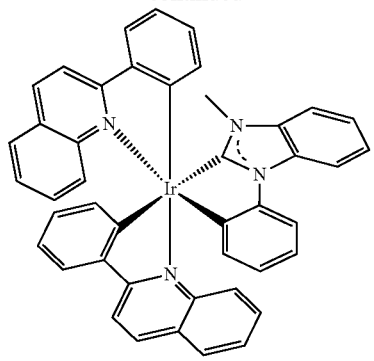
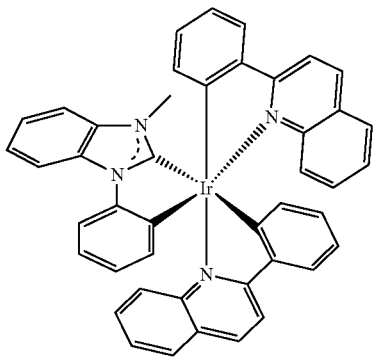
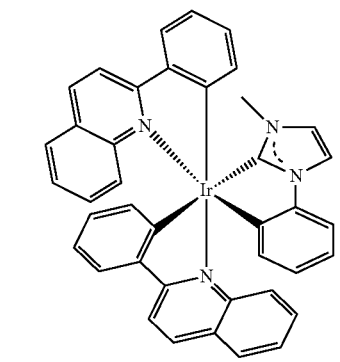
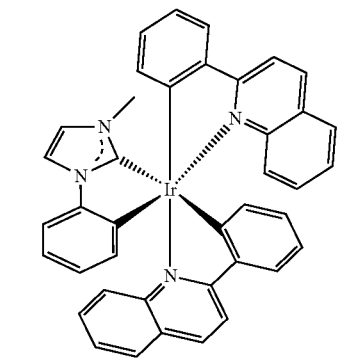
-continued
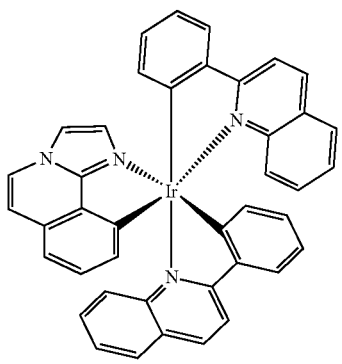
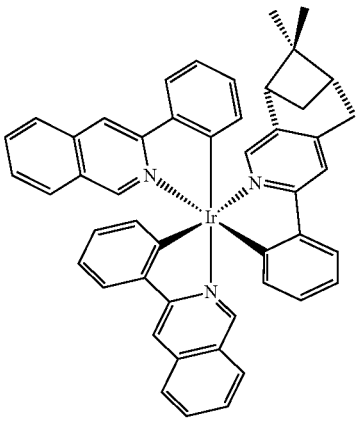
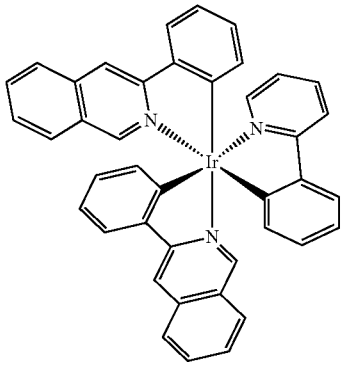

| 87 -continued | 88 -continued |
|---|---|
| 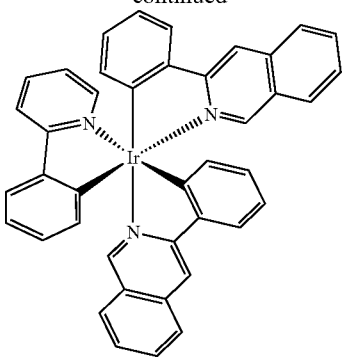 | 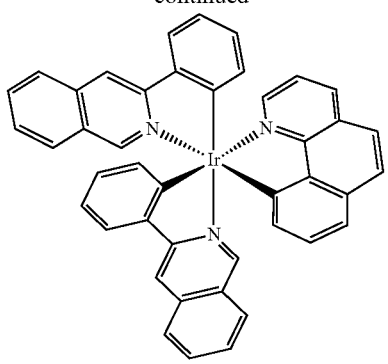 |
| 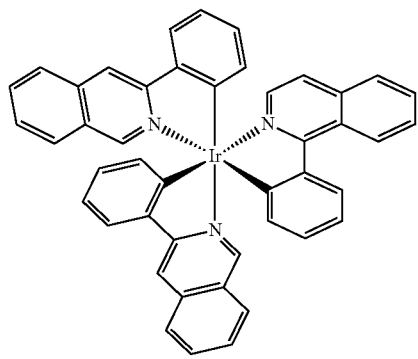 | 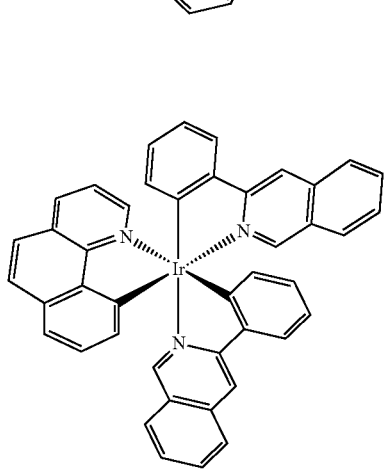 |
| 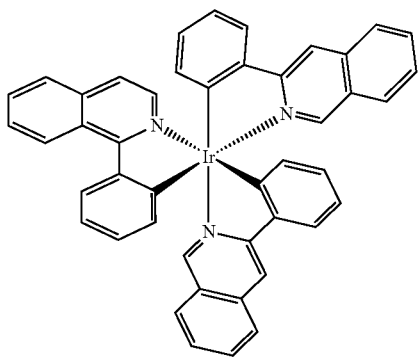 | 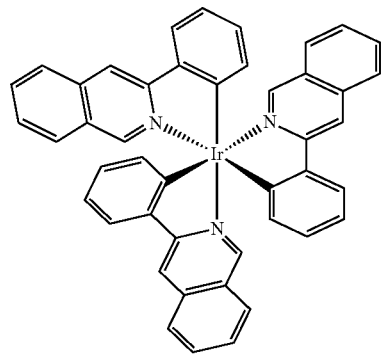 |
| 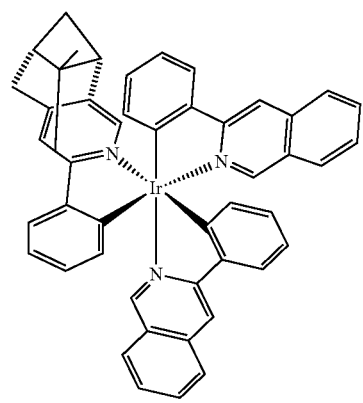 | 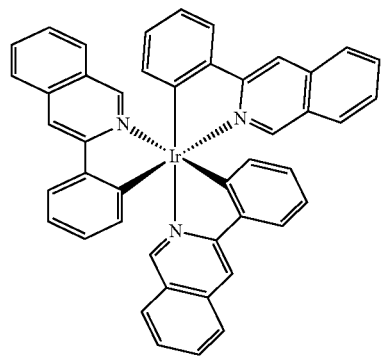 |

89
-continued
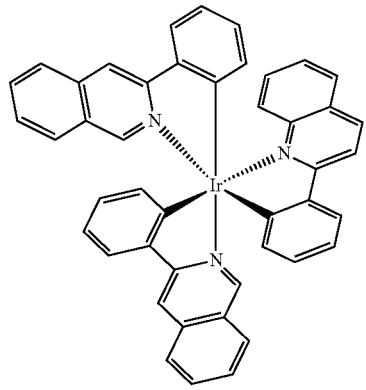
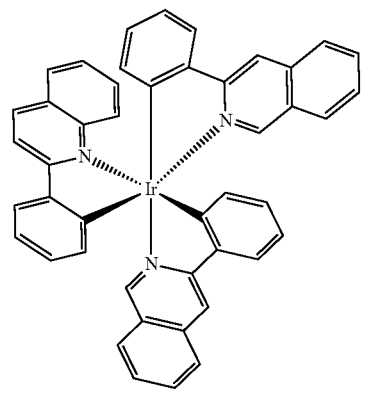
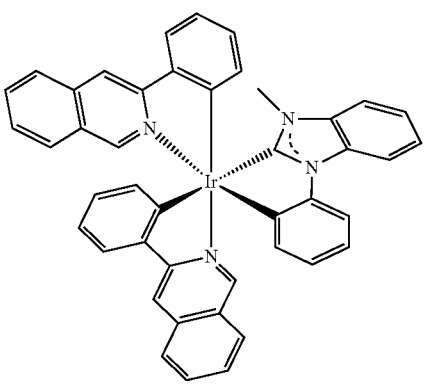
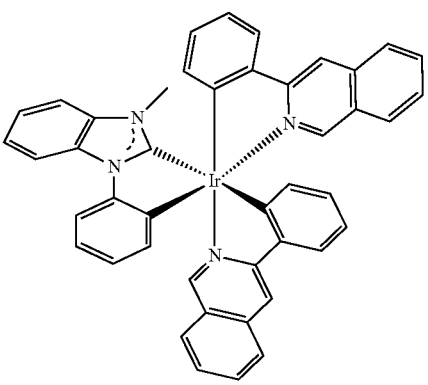
90
-continued
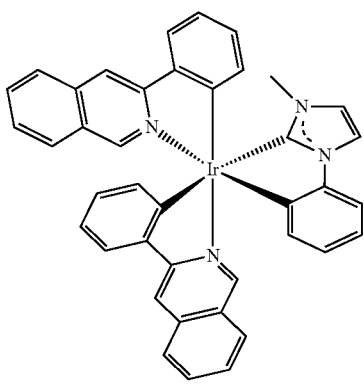
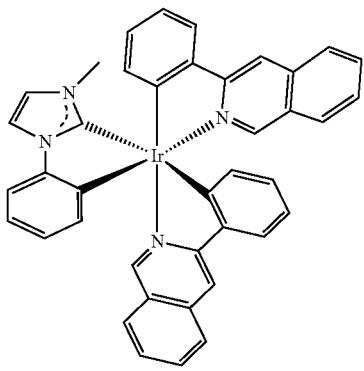
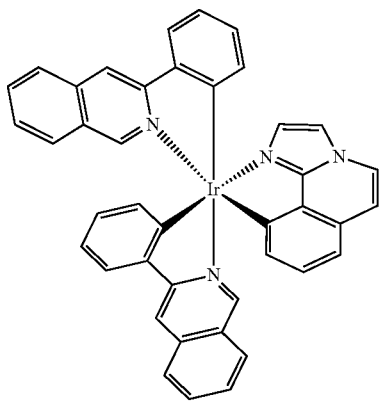
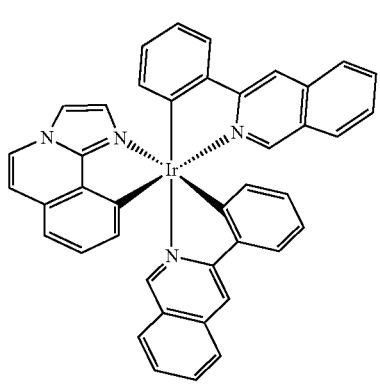

-continued
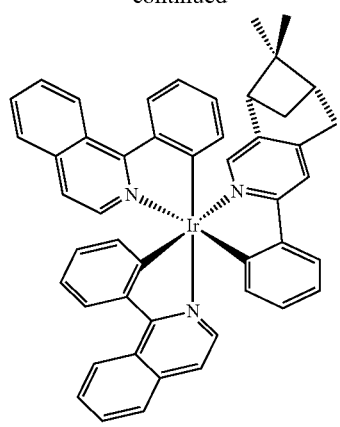
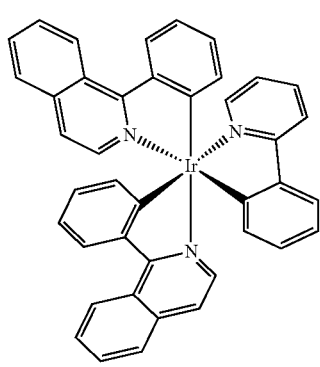
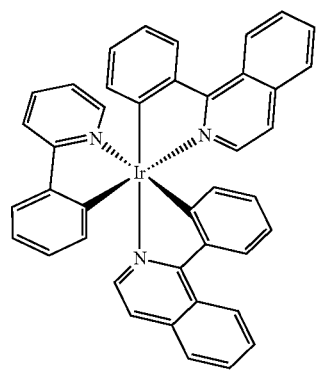
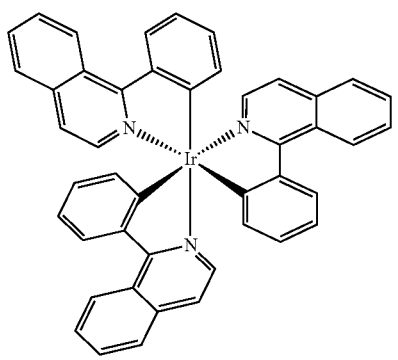
-continued
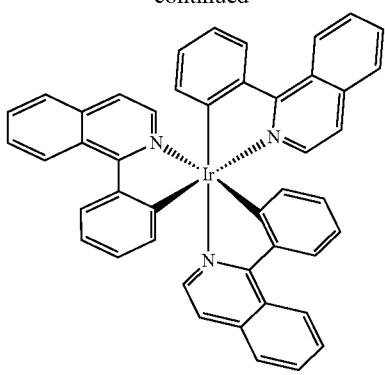
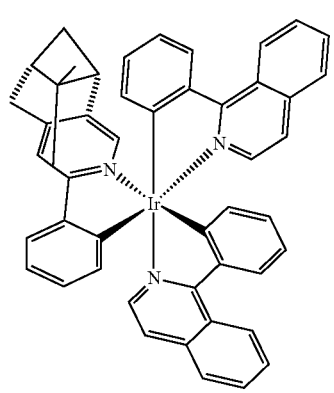
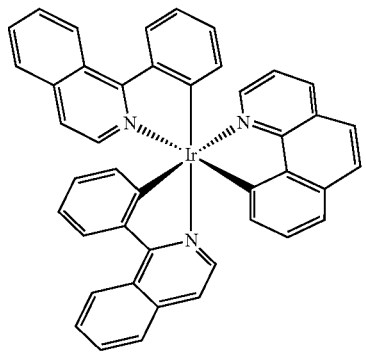
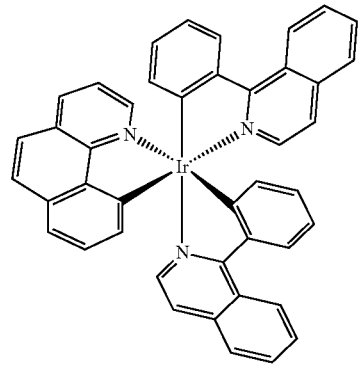

93
-continued
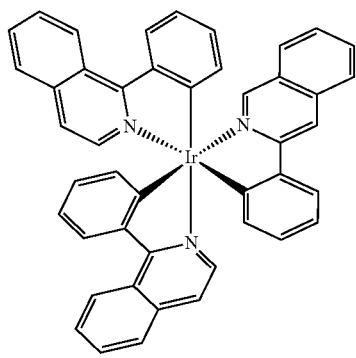
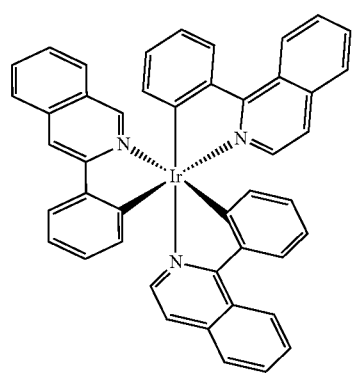
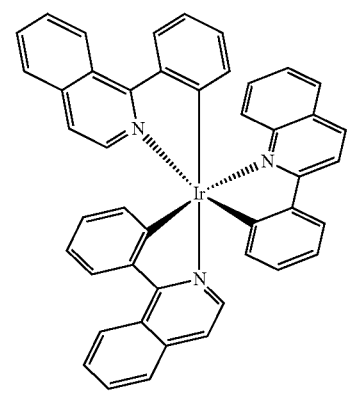
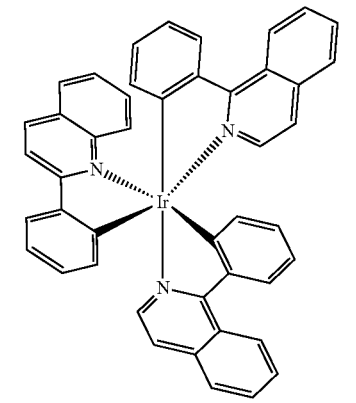
94
-continued
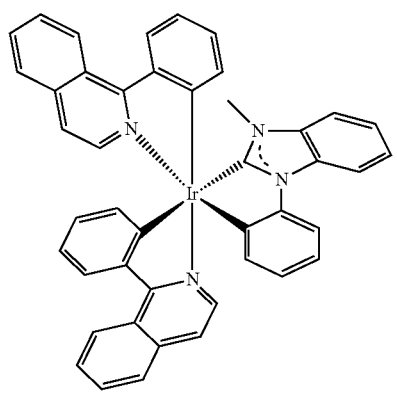
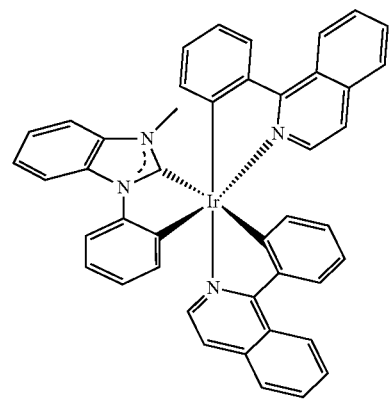
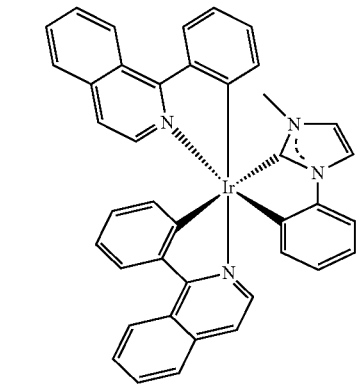
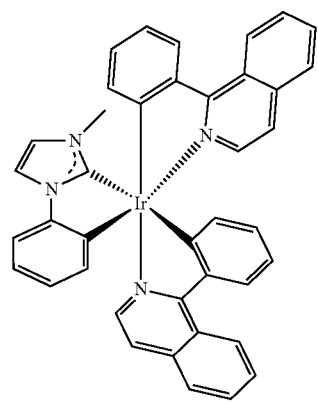

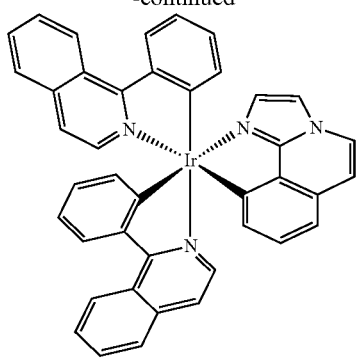
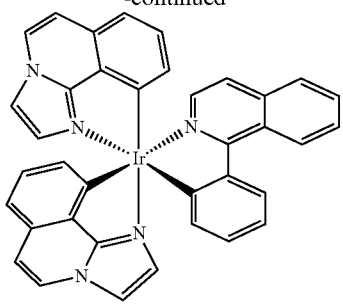
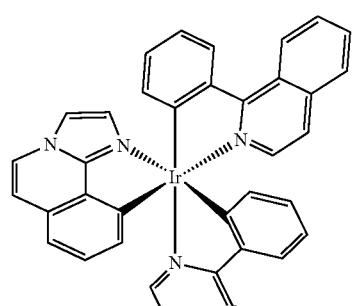
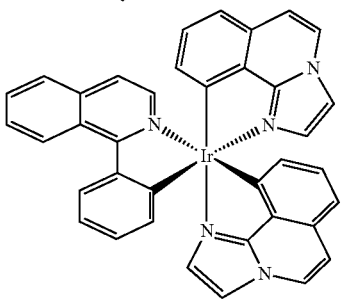
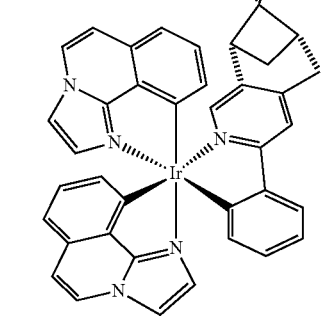
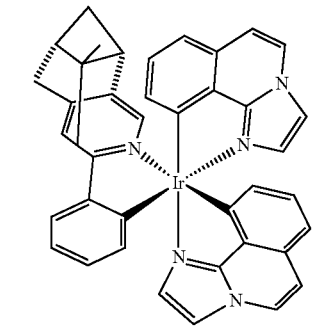
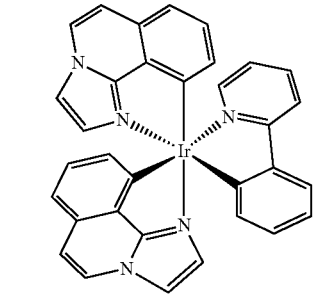
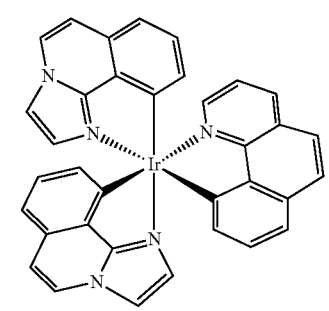
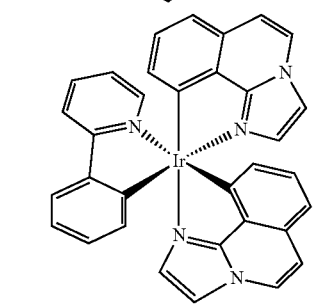
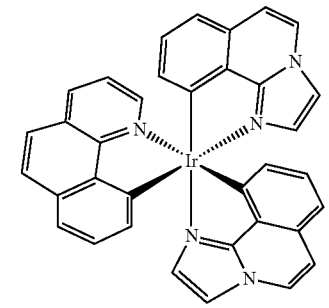

| 97 | 98 |
|---|---|
| -continued | -continued |
| 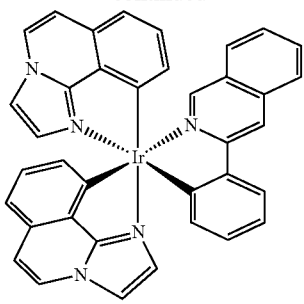 | 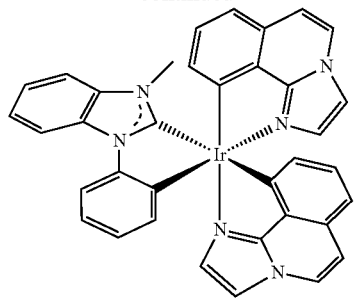 |
| 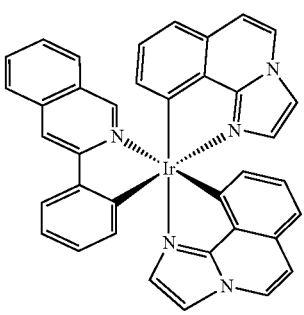 | 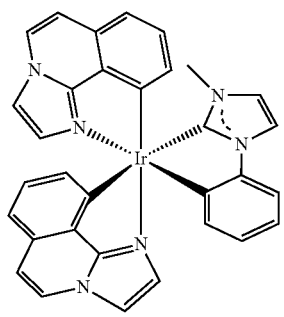 |
| 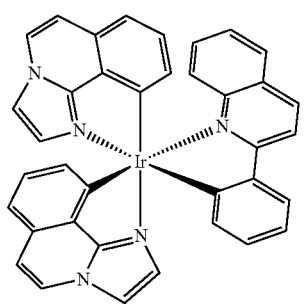 | 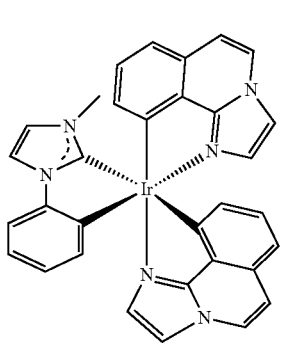 |
| 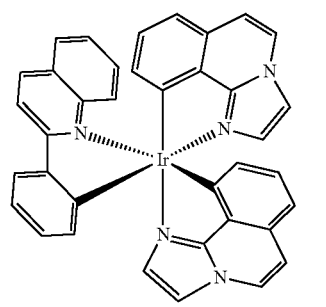 | 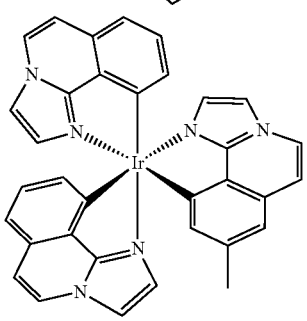 |
| 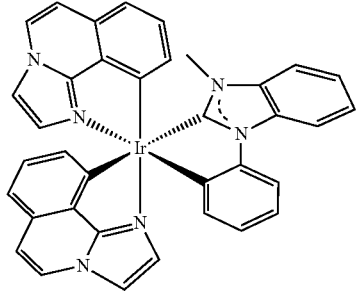 | 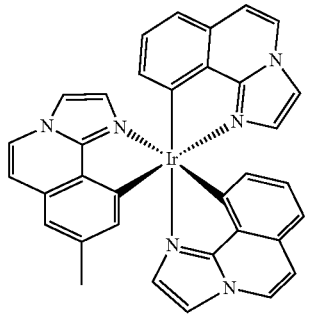 |

99
-continued
100
-continued
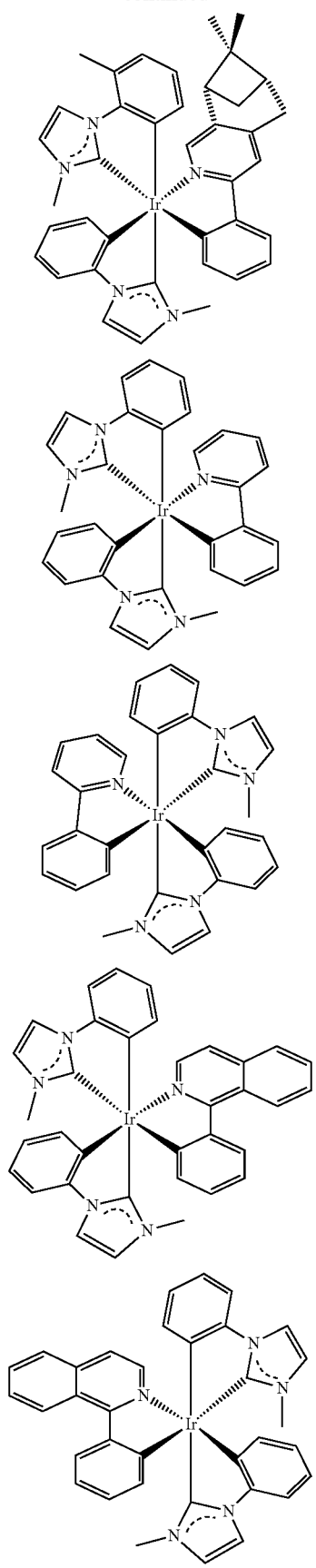
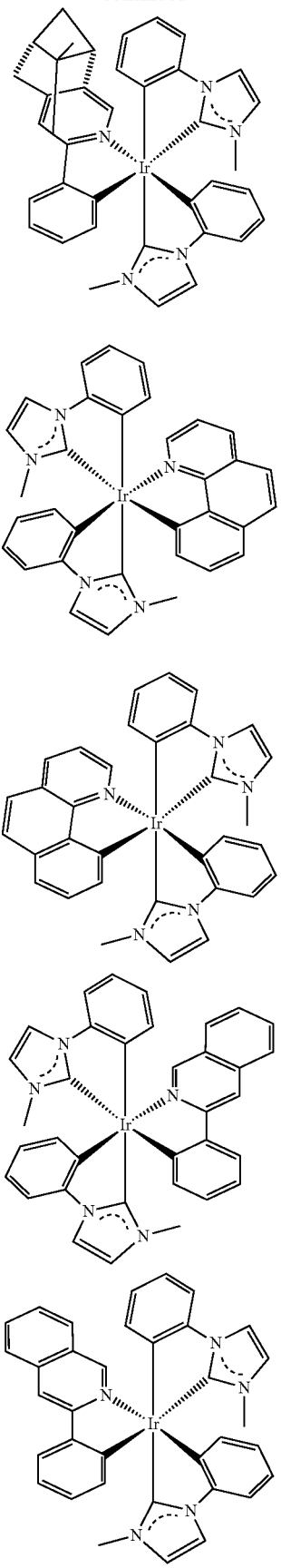

101
-continued
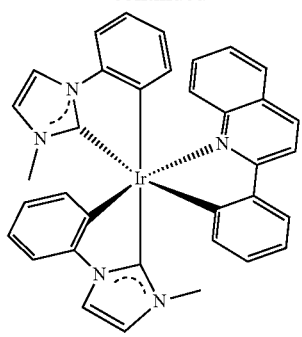
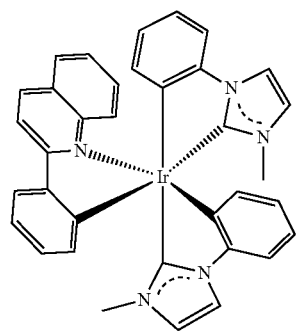
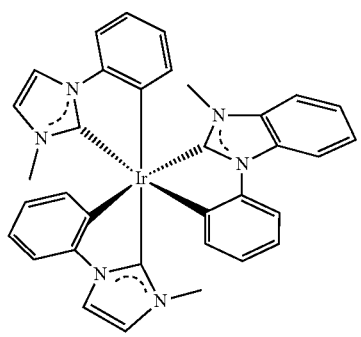
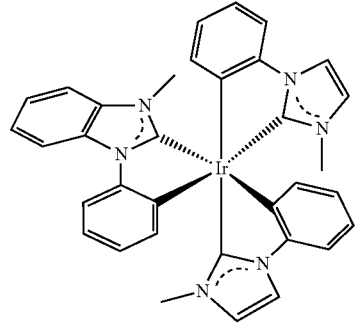
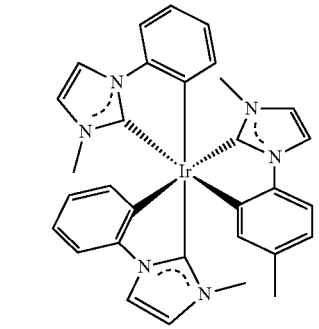
102
-continued
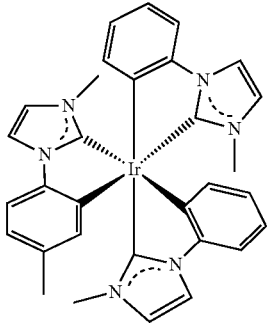
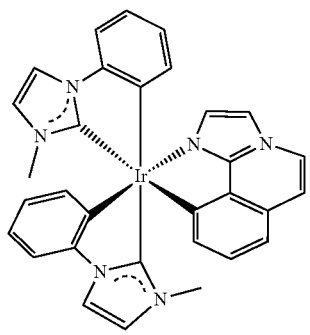
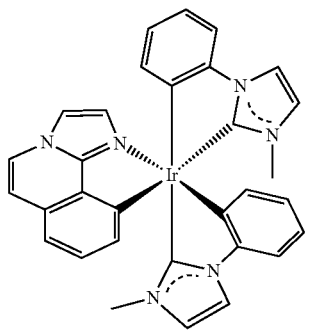
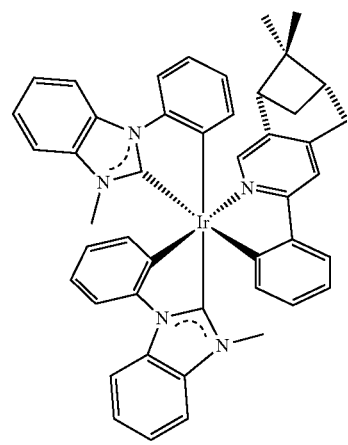

103
-continued
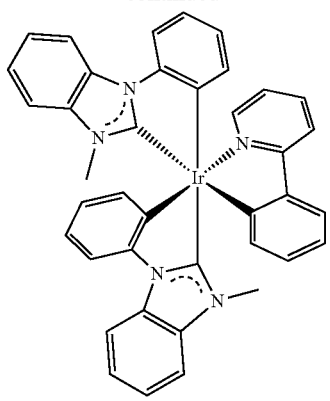
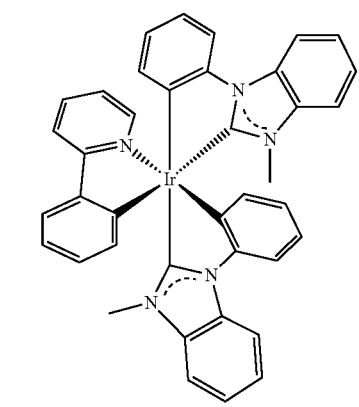
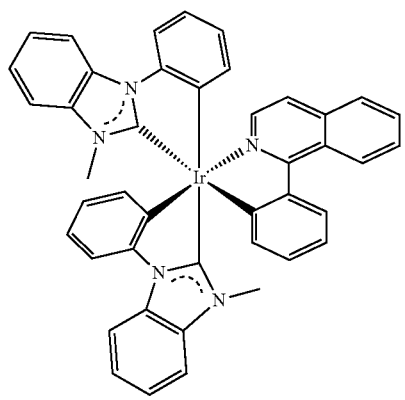
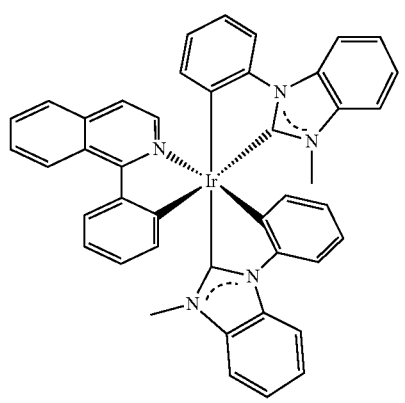
104
-continued
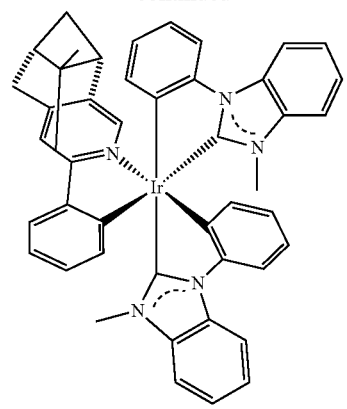
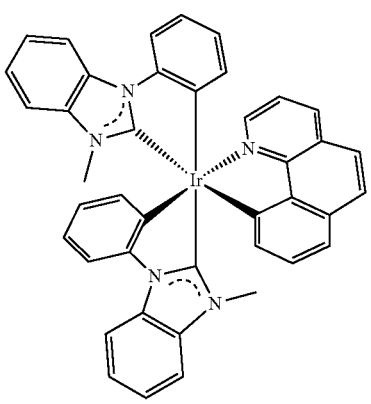
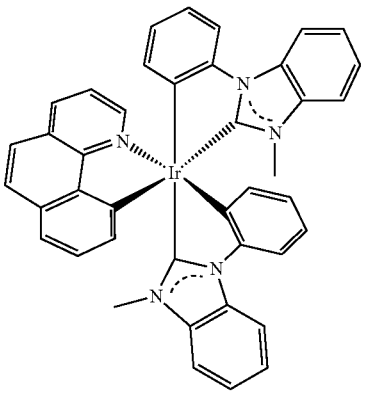
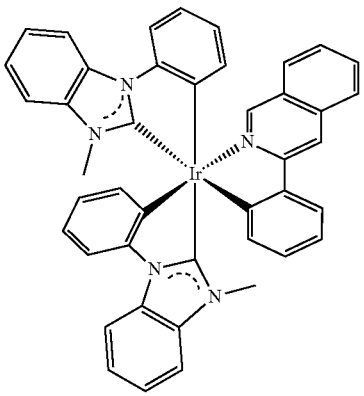

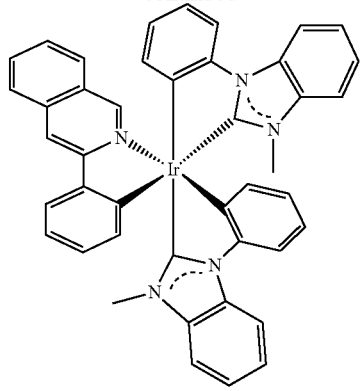
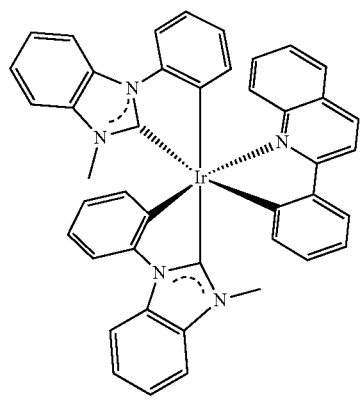
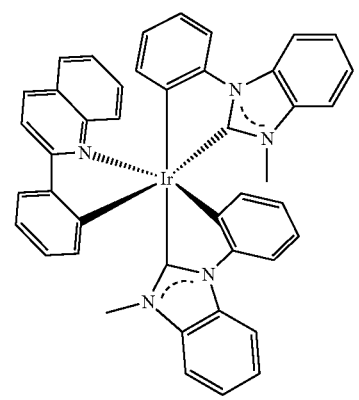
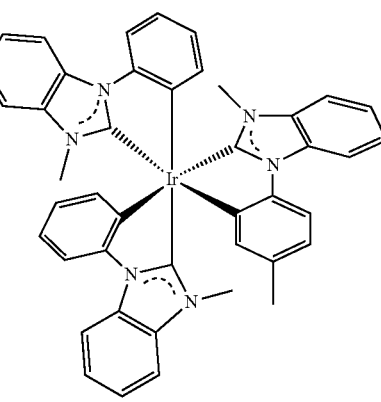
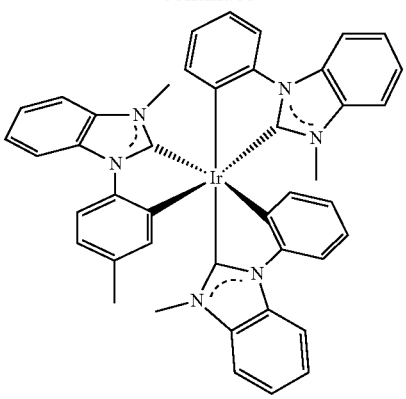
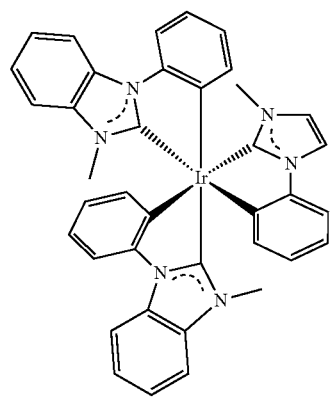
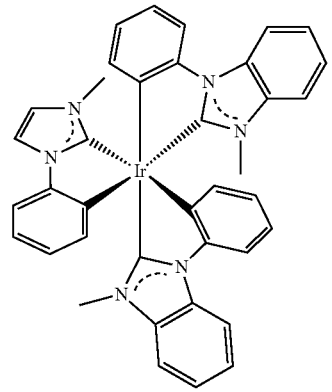
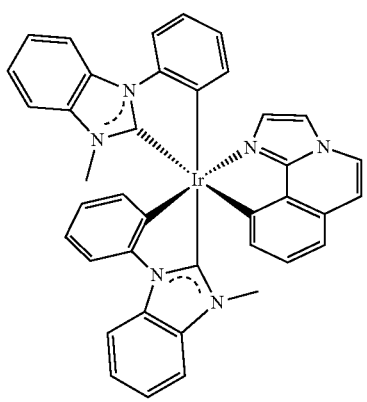

107
-continued
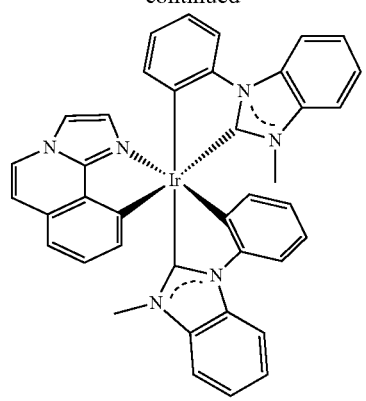
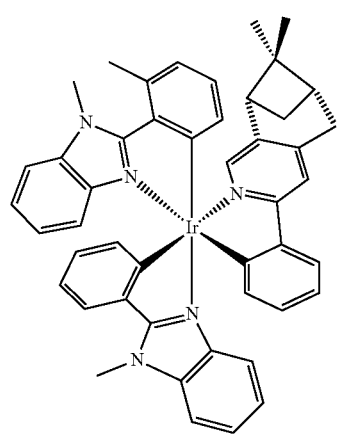
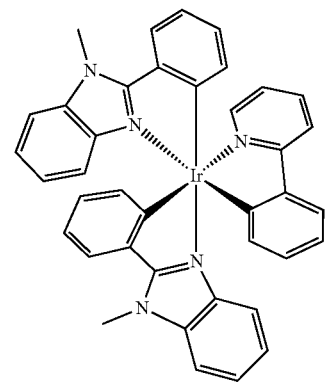
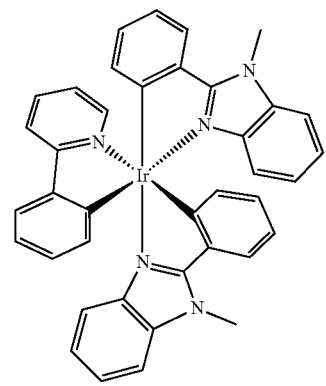
108
-continued
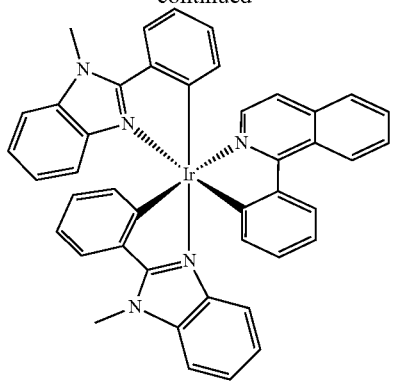
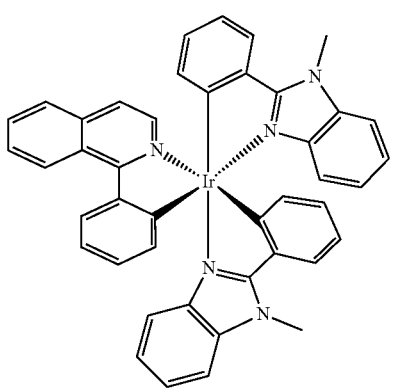
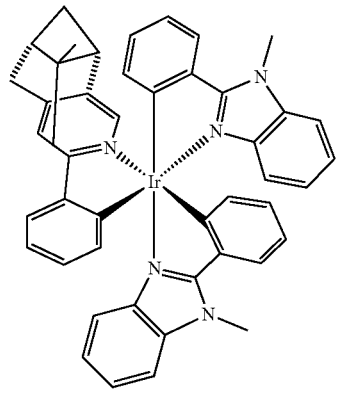
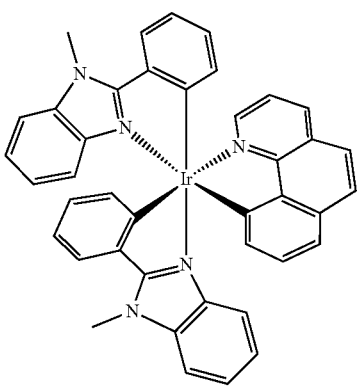

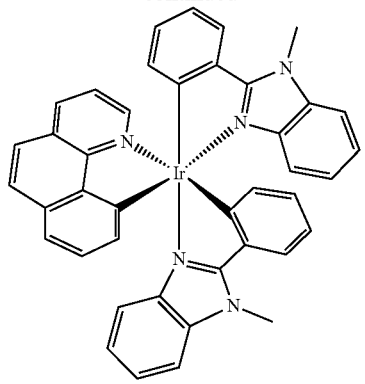
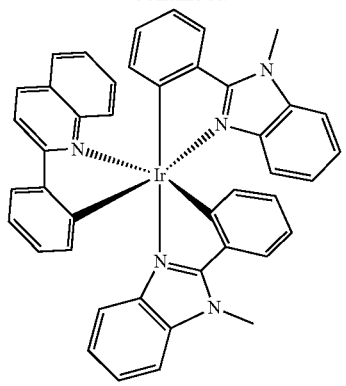
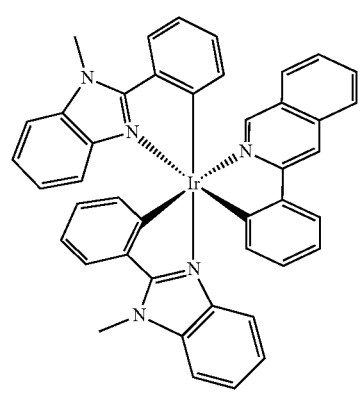
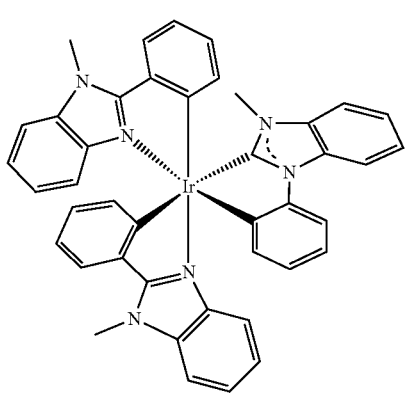
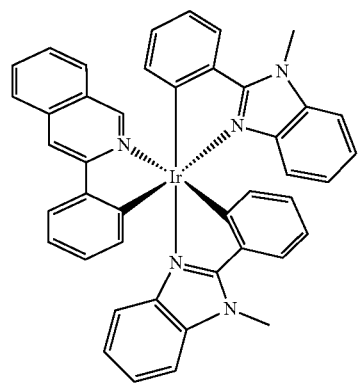
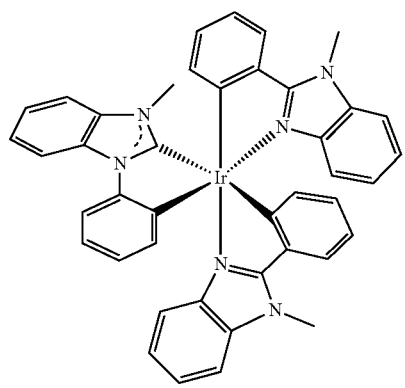
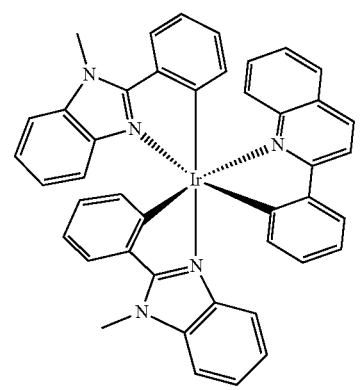
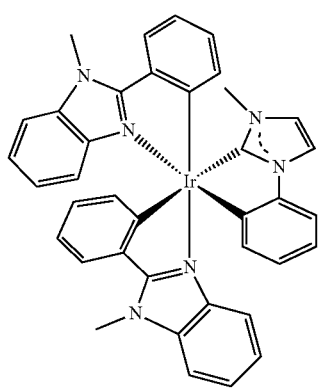

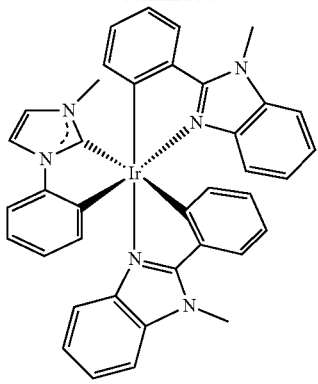
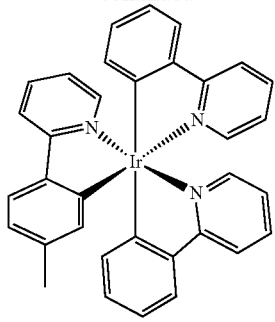
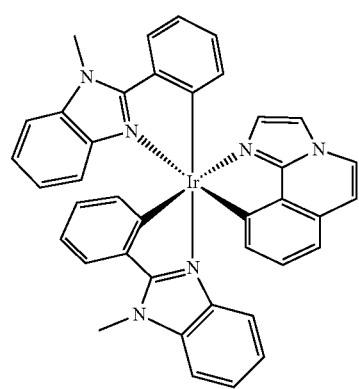
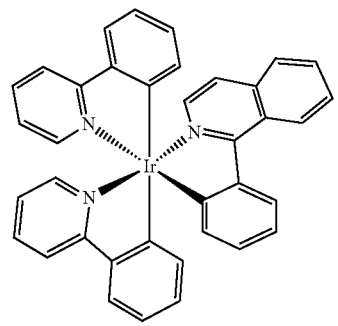
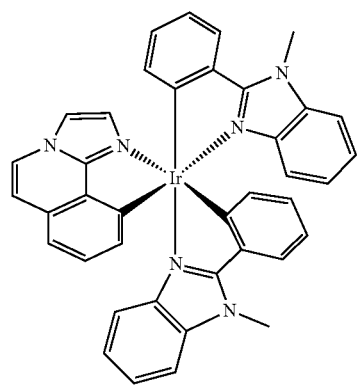
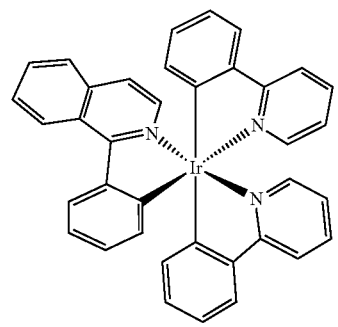
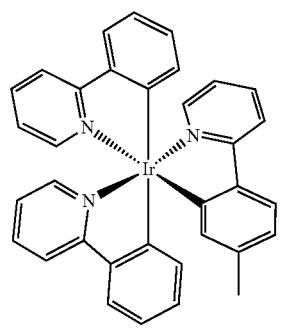
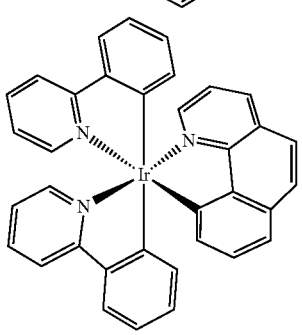
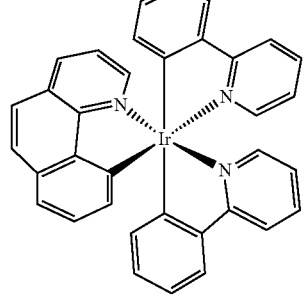

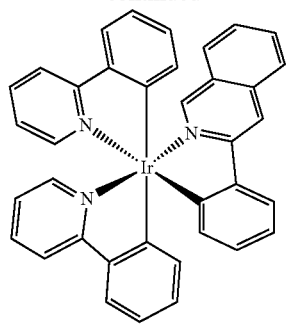
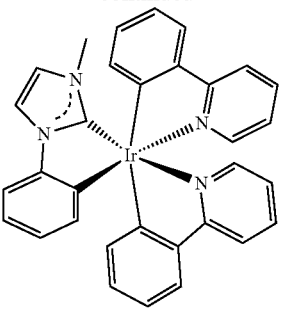
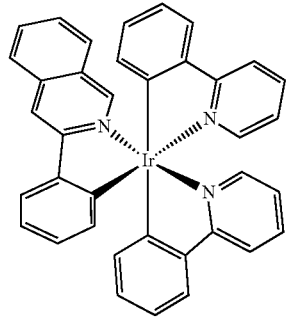
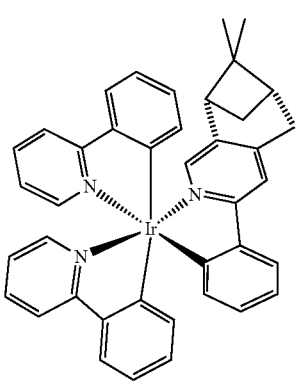
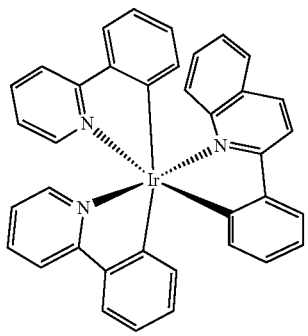
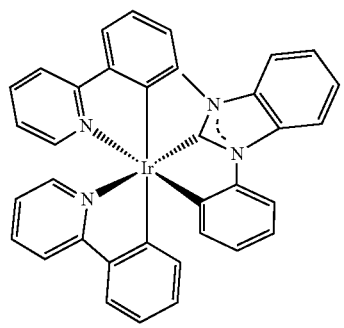
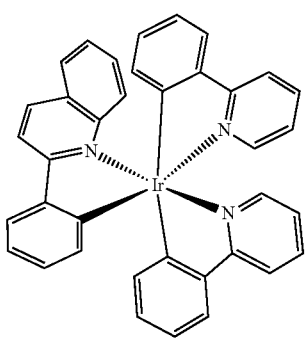
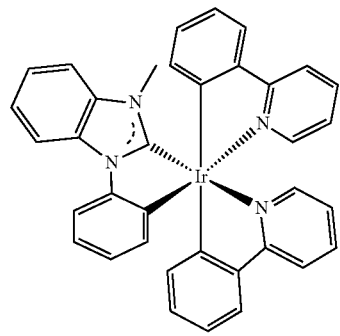
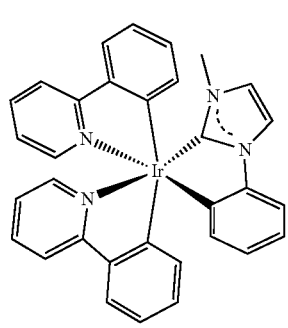
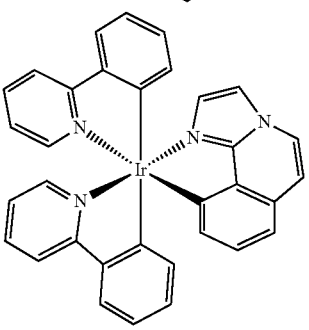

-continued

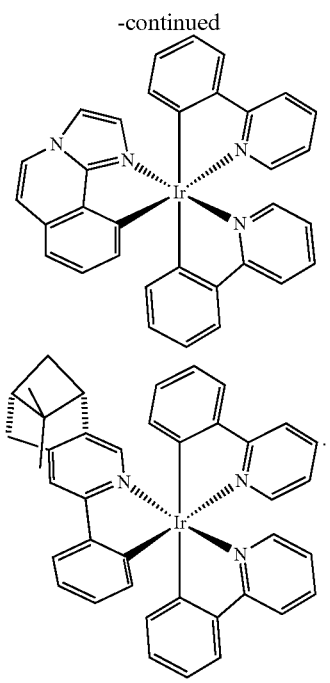

15. The method of claim 9, wherein the chiral complex emitter has a structure represented by General Formula IIB:

General Formula IIB

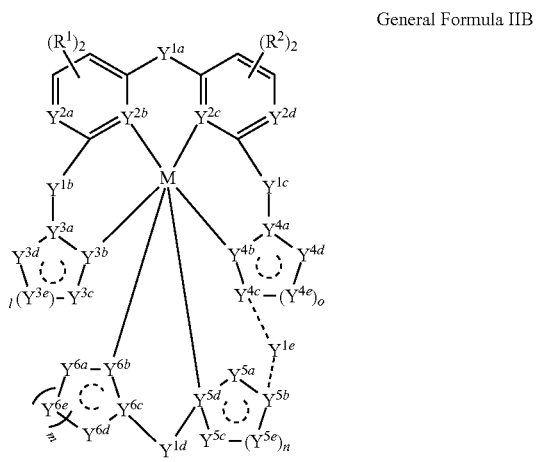

wherein:
M represents $Ir^{3+}$ or $Rh^{3+}$;
each $R^1$ and $R^2$ in $(R^1)_2$ and $(R^2)_2$ independently represents hydrogen, halogen, hydroxyl, nitro, thiol, or substituted or unsubstituted: $C_1$-$C_4$ alkyl or amino;
each of $Y^{1a}$, $Y^{1c}$, and $Y^{1d}$ independently represents O; S; $NR^{4a}$, wherein $R^{4a}$ represents substituted or unsubstituted $C_1$-$C_4$ alkyl; $Si(R^{4b})_2$, wherein each of $R^{4b}$ in $(R^{4b})_2$ independently represents substituted or unsubstituted $C_1$-$C_4$ alkyl; or $C(R^{4c})_2$, wherein each $R^{4c}$ in $(R^{4c})_2$ independently represents hydrogen or substituted or unsubstituted $C_1$-$C_4$ alkyl;
$Y^{1b}$ is present or absent, and if present, represents a covalent bond or O; S; $NR^{4a}$, wherein $R^{5a}$ represents substituted or unsubstituted $C_1$-$C_4$ alkyl; $Si(R^{5b})_2$, wherein each $R^{5b}$ in $(R^{5b})_2$ independently represents substituted or unsubstituted $C_1$-$C_4$ alkyl; or $C(R^{5c})_2$, wherein each $R^{5c}$ in $(R^{5c})_2$ independently represents hydrogen or substituted or unsubstituted $C_1$-$C_4$ alkyl;
$Y^{1e}$ is present or absent, and if present, represents a covalent bond or O; S; $NR^{4a}$, wherein $R^{4a}$ represents substituted or unsubstituted $C_1$-$C_4$ alkyl; $Si(R^{4b})_2$, wherein each $R^{4b}$ in $(R^{4b})_2$ independently represents substituted or unsubstituted $C_1$-$C_4$ alkyl; or $C(R^{4c})_2$, wherein each $R^{4c}$ in $(R^{4c})_2$ independently represents hydrogen or substituted or unsubstituted $C_1$-$C_4$ alkyl;
each of $Y^{2a}$, $Y^{2b}$, $Y^{2c}$, and $Y^{2d}$, valency permitting, independently represents C or N or $NR^{6a}$ or $CR^{6b}$, as permitted by valency, wherein each of $R^{6a}$ and $R^{6b}$ independently represents hydrogen, halogen, hydroxyl, nitro, thiol, or substituted or unsubstituted: $C_1$-$C_4$ alkyl;
each of $Y^{3a}$, $Y^{3b}$, $Y^{3c}$, $Y^{3d}$, $Y^{3e}$, $Y^{4a}$, $Y^{4b}$, $Y^{4c}$, $Y^{4d}$, and $Y^{4e}$, valency permitting, independently represents N; O; S; $NR^{6a}$ or $CR^{6b}$, as permitted by valency, wherein each of $R^{6a}$ and $R^{6b}$ independently represents hydrogen or substituted or unsubstituted $C_1$-$C_4$ alkyl; or $Z(R^{6c})_2$, wherein Z is C or Si, and each $R^{6c}$ in $(R^{6c})_2$ independently represents hydrogen or substituted or unsubstituted $C_1$-$C_4$ alkyl;
each of $Y^{5a}$, $Y^{5b}$, $Y^{5c}$, $Y^{5d}$, $Y^{5e}$, $Y^{6a}$, $Y^{6b}$, $Y^{6c}$, $Y^{6d}$, and $Y^{6e}$, valency permitting, independently represents N, O, S, $NR^{6a}$, or $CR^{6b}$ as permitted by valency;
wherein each m is independently 1 or 2;
the open dotted circle indicates partial or full unsaturation of the ring with which it is associated; and
at least one of M, $R^1$, $R^2$, $Y^{1a}$, $Y^{1b}$, $Y^{1c}$, $Y^{1d}$, $Y^{1e}$, $Y^{2a}$, $Y^{2b}$, $Y^{2c}$, $Y^{2d}$, $Y^{3a}$, $Y^{3b}$, $Y^{3c}$, $Y^{3d}$, $Y^{3e}$, $Y^{4a}$, $Y^{4b}$, $Y^{4c}$, $Y^{4d}$, $Y^{4e}$, $Y^{5a}$, $Y^{5b}$, $Y^{5c}$, $Y^{5d}$, $Y^{5e}$, $Y^{6a}$, $Y^{6b}$, $Y^{6c}$, $Y^{6d}$, $Y^{6e}$ is a chiral center.

16. The method of claim 15, wherein:
two adjacent $R^1$ form a substituted or unsubstituted: carbocyclyl, aryl, heterocyclyl, or heteroaryl;
two adjacent $R^2$ form a substituted or unsubstituted: carbocyclyl, aryl, heterocyclyl, or heteroaryl;
$R^1$ or $R^2$ together with an adjacent $R^{4a}$ or $R^{4b}$ form a substituted or unsubstituted: carbocyclyl, aryl, heterocyclyl, or heteroaryl;
two adjacent $Y^{3c}$, $Y^{3d}$, $Y^{3e}$ form a substituted or unsubstituted: carbocyclyl, aryl, heterocyclyl, or heteroaryl;
two adjacent $Y^{6a}$, $Y^{6d}$, and $Y^{6e}$ form a substituted or unsubstituted: carbocyclyl, aryl, heterocyclyl, or heteroaryl;
two adjacent $Y^{5b}$, $Y^{5c}$, and $Y^{5e}$ form a substituted or unsubstituted: carbocyclyl, aryl, heterocyclyl, or heteroaryl;
$Y^{4d}$ and $Y^{4e}$ form a substituted or unsubstituted: carbocyclyl, aryl, heterocyclyl, or heteroaryl;
$Y^{2a}$ and $Y^{3d}$ form a substituted or unsubstituted: carbocyclyl, aryl, heterocyclyl, or heteroaryl;
$Y^{2d}$ and $Y^{4d}$ form a substituted or unsubstituted: carbocyclyl, aryl, heterocyclyl;
$Y^{4e}$ and $Y^{5e}$ form a substituted or unsubstituted: carbocyclyl, aryl, heterocyclyl; or
$Y^{5c}$ and $Y^{6d}$ form a substituted or unsubstituted: carbocyclyl, aryl, heterocyclyl.

17. The light emitting device of claim 1, wherein the absorptive linear polarizer has a polarization ratio greater than 100,000:1.

18. The light emitting device of claim 1, wherein the absorptive linear polarizer comprises elongated silver nanoparticles embedded in glass plates.

19. The light emitting device of claim 1, wherein the quarter-wave plate retards light having a wavelength of 560 nm light.

20. The light emitting device of claim 1, wherein the single side of the light emitting device is opposite the linear polarizer.

21. The light emitting device of claim 1, wherein the light emitting device is configured to allow transmission of ambient light from both sides of the light emitting device.

* * * * *